US011608217B1

(12) United States Patent
Lau et al.

(10) Patent No.: US 11,608,217 B1
(45) Date of Patent: Mar. 21, 2023

(54) AUTOMATED CLOSURE FOR HERMETICALLY SEALING AN IMMERSION COOLING TANK DURING A HOT SWAP OF EQUIPMENT THEREIN

(71) Applicant: Liquidstack Holding B.V., Amsterdam (NL)

(72) Inventors: Kar-Wing Lau, Hong Kong (HK); Wai Sing Cheng, Hong Kong (HK); Joseph Capes, Northborough, MA (US)

(73) Assignee: LIQUIDSTACK HOLDING B.V., Amsterdam (NL)

( * ) Notice: Subject to any disclaimer, the term of this patent is extended or adjusted under 35 U.S.C. 154(b) by 0 days.

(21) Appl. No.: 17/567,123

(22) Filed: Jan. 1, 2022

Related U.S. Application Data

(60) Provisional application No. 63/295,866, filed on Jan. 1, 2022.

(51) Int. Cl.
*B65D 51/18* (2006.01)
*H05K 7/20* (2006.01)
*B65D 43/16* (2006.01)
*B65D 43/20* (2006.01)
*B65D 51/24* (2006.01)

(52) U.S. Cl.
CPC .............. *B65D 51/18* (2013.01); *B65D 43/16* (2013.01); *B65D 43/20* (2013.01); *B65D 51/24* (2013.01); *H05K 7/203* (2013.01); *H05K 7/20318* (2013.01); *H05K 7/20327* (2013.01)

(58) Field of Classification Search
CPC ........ B65D 43/20; E04H 4/082; B23K 1/015; B62B 5/0013
See application file for complete search history.

(56) References Cited

U.S. PATENT DOCUMENTS

| | | |
|---|---|---|
| 2,340,898 A | 2/1944 | Race |
| 2,505,581 A | 4/1950 | Unger |
| 2,718,709 A | 9/1955 | Ford |
| 2,985,706 A | 5/1961 | Dobry |
| 3,009,124 A | 11/1961 | Narbut |
| 3,406,244 A | 10/1968 | Oktay |
| 3,591,946 A | 7/1971 | Loe |
| 3,675,395 A | 7/1972 | Baranowski |
| 3,774,677 A | 11/1973 | Antonetti et al. |
| 3,894,171 A | 7/1975 | Kusay |
| 3,934,453 A | 1/1976 | Hessen |

(Continued)

OTHER PUBLICATIONS

International Search Report and Written Opinion for International Patent Application No. PCT/IB2017/000711, dated Aug. 30, 2017 (15 pages).

(Continued)

*Primary Examiner* — Andrew T Kirsch

(57) ABSTRACT

A device for and method of hot swapping one or more electronic devices from an immersion cooling tank having a first opening, the device including a condensing unit removably locatable in first opening of the immersion cooling tank, the condensing device having a condensing coil forming a second opening through which the electronic device(s) is removable. A retractable cover sheet assembly, under computer control, is positioned to form a sized opening, which may include a containment structure, prior to opening the tank lid to minimize dielectric fluid loss.

20 Claims, 36 Drawing Sheets

(56) References Cited

U.S. PATENT DOCUMENTS

| | | | |
|---|---|---|---|
| 3,989,102 | A | 11/1976 | Jaster |
| 4,089,662 | A | 5/1978 | Williams |
| 4,124,834 | A | 11/1978 | Walsh |
| 4,236,484 | A | 12/1980 | Lapp |
| 4,336,414 | A | 6/1982 | Suzuki |
| 4,379,746 | A | 4/1983 | Norman |
| 4,394,635 | A | 7/1983 | Foss |
| 4,437,082 | A | 3/1984 | Walsh |
| 4,477,354 | A | 10/1984 | Fessler |
| 4,501,123 | A | 2/1985 | Ina |
| 4,514,294 | A | 4/1985 | Layman |
| 4,590,538 | A | 5/1986 | Cray, Jr. |
| 4,704,658 | A | 11/1987 | Yokouchi et al. |
| 4,867,879 | A | 9/1989 | Mueller |
| 5,088,616 | A * | 2/1992 | Susko ............ B65F 1/16 220/908 |
| 5,131,233 | A | 7/1992 | Cray et al. |
| 5,305,184 | A | 4/1994 | Andresen et al. |
| 5,463,872 | A | 11/1995 | Vader et al. |
| 5,688,398 | A | 11/1997 | Jacquelin et al. |
| 6,019,167 | A | 2/2000 | Bishop et al. |
| 8,418,280 | B2 * | 4/2013 | Schwerzmann ........ E04H 4/082 242/390.8 |
| 10,477,726 | B1 | 11/2019 | Enright et al. |
| 10,645,841 | B1 | 5/2020 | Mao et al. |
| 2003/0235036 | A1 | 12/2003 | Ostby |
| 2004/0007992 | A1 | 1/2004 | Ribarich |
| 2006/0006177 | A1 * | 1/2006 | Clark ............... B65D 88/125 220/200 |
| 2006/0219620 | A1 | 10/2006 | Suga |
| 2007/0034360 | A1 | 2/2007 | Hall |
| 2007/0263356 | A1 | 11/2007 | Weber et al. |
| 2008/0115528 | A1 | 5/2008 | Yamamoto et al. |
| 2010/0101759 | A1 | 4/2010 | Campbell et al. |
| 2010/0101765 | A1 | 4/2010 | Campbell et al. |
| 2010/0103614 | A1 | 4/2010 | Campbell |
| 2010/0103618 | A1 | 4/2010 | Campbell et al. |
| 2010/0103620 | A1 | 4/2010 | Campbell et al. |
| 2010/0118494 | A1 | 5/2010 | Campbell et al. |
| 2010/0328889 | A1 | 12/2010 | Campbell et al. |
| 2010/0328890 | A1 | 12/2010 | Campbell et al. |
| 2010/0328891 | A1 | 12/2010 | Campbell et al. |
| 2011/0267768 | A1 | 11/2011 | Attlesey |
| 2011/0286177 | A1 | 11/2011 | Attlesey |
| 2011/0315343 | A1 | 12/2011 | Campbell et al. |
| 2011/0315344 | A1 | 12/2011 | Campbell et al. |
| 2011/0315353 | A1 | 12/2011 | Campbell et al. |
| 2011/0315355 | A1 | 12/2011 | Campbell et al. |
| 2011/0317367 | A1 | 12/2011 | Campbell et al. |
| 2013/0019614 | A1 | 1/2013 | Campbell et al. |
| 2013/0021746 | A1 | 1/2013 | Campbell et al. |
| 2013/0021752 | A1 | 1/2013 | Campbell et al. |
| 2013/0091866 | A1 | 4/2013 | Campbell et al. |
| 2013/0105120 | A1 | 5/2013 | Campbell et al. |
| 2013/0105122 | A1 | 5/2013 | Campbell et al. |
| 2014/0068942 | A1 | 3/2014 | Campbell et al. |
| 2014/0071625 | A1 | 3/2014 | Luo et al. |
| 2014/0071627 | A1 | 3/2014 | Campbell et al. |
| 2014/0082942 | A1 | 3/2014 | Campbell et al. |
| 2014/0085817 | A1 | 3/2014 | Campbell et al. |
| 2014/0123492 | A1 | 5/2014 | Campbell et al. |
| 2014/0123493 | A1 | 5/2014 | Campbell et al. |
| 2014/0133096 | A1 | 5/2014 | Campbell et al. |
| 2014/0146467 | A1 | 5/2014 | Campbell et al. |
| 2014/0216686 | A1 | 8/2014 | Shelnutt et al. |
| 2014/0216711 | A1 | 8/2014 | Shelnutt et al. |
| 2014/0218859 | A1 | 8/2014 | Shelnutt et al. |
| 2014/0218861 | A1 | 8/2014 | Shelnutt et al. |
| 2014/0318167 | A1 | 10/2014 | Uchida |
| 2014/0355212 | A1 | 12/2014 | Campbell et al. |
| 2015/0022975 | A1 | 1/2015 | Browne et al. |
| 2015/0060009 | A1 | 3/2015 | Shelnutt et al. |
| 2015/0062806 | A1 | 3/2015 | Shelnutt et al. |
| 2015/0070846 | A1 | 3/2015 | Shelnutt et al. |
| 2015/0109728 | A1 | 4/2015 | Campbell et al. |
| 2015/0109729 | A1 | 4/2015 | Campbell et al. |
| 2015/0109730 | A1 | 4/2015 | Campbell et al. |
| 2015/0109735 | A1 | 4/2015 | Campbell et al. |
| 2015/0319887 | A1 | 11/2015 | Flory et al. |
| 2015/0319889 | A1 | 11/2015 | Flory et al. |
| 2017/0064862 | A1 | 3/2017 | Miyoshi |
| 2018/0279500 | A9 | 9/2018 | Wang et al. |
| 2018/0303008 | A1 | 10/2018 | Shen |
| 2019/0159360 | A1 | 5/2019 | Uchida |
| 2020/0093025 | A1 | 3/2020 | Enright et al. |
| 2021/0153386 | A1 | 5/2021 | Lau |

OTHER PUBLICATIONS

International Search Report and Written Opinion in PCT/IB2020/060701, dated Feb. 5, 2021 13 pages.

* cited by examiner

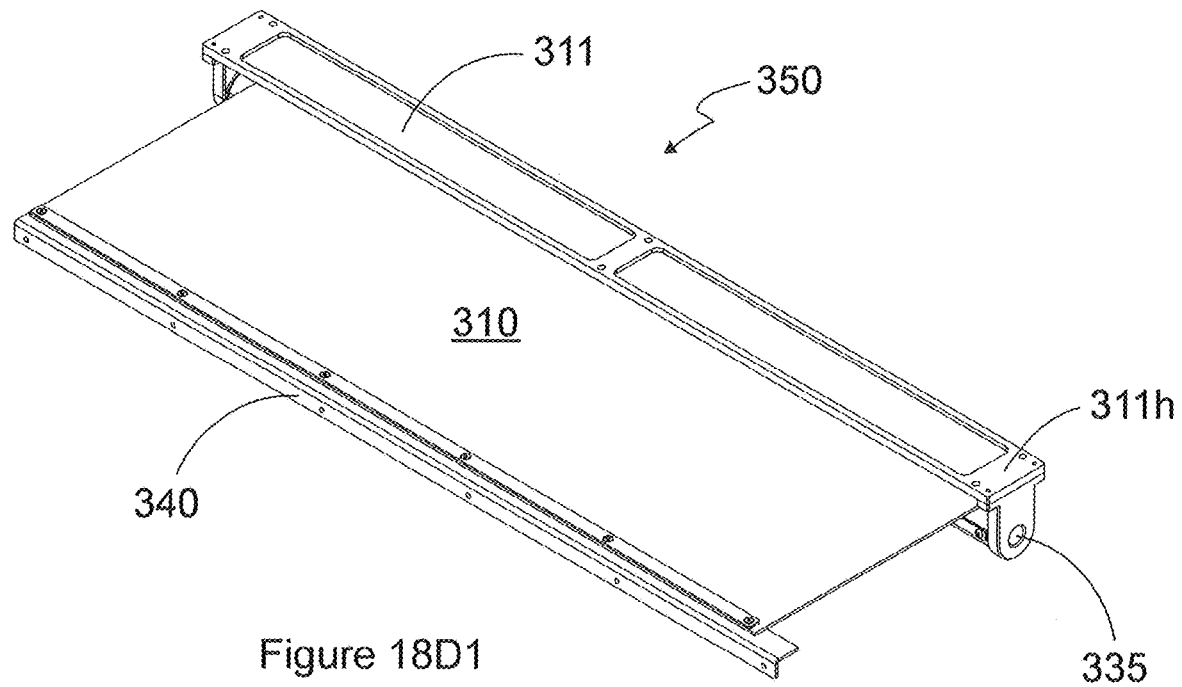
Figure 18D1
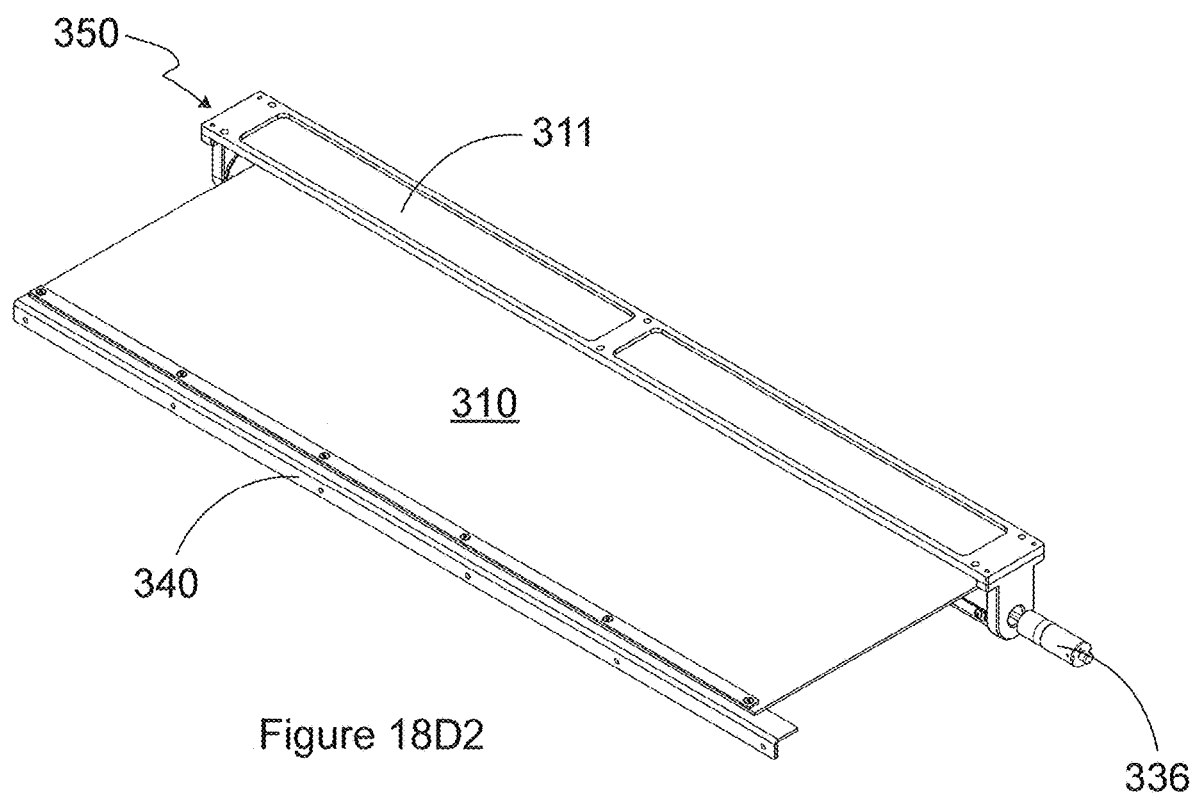
Figure 18D2

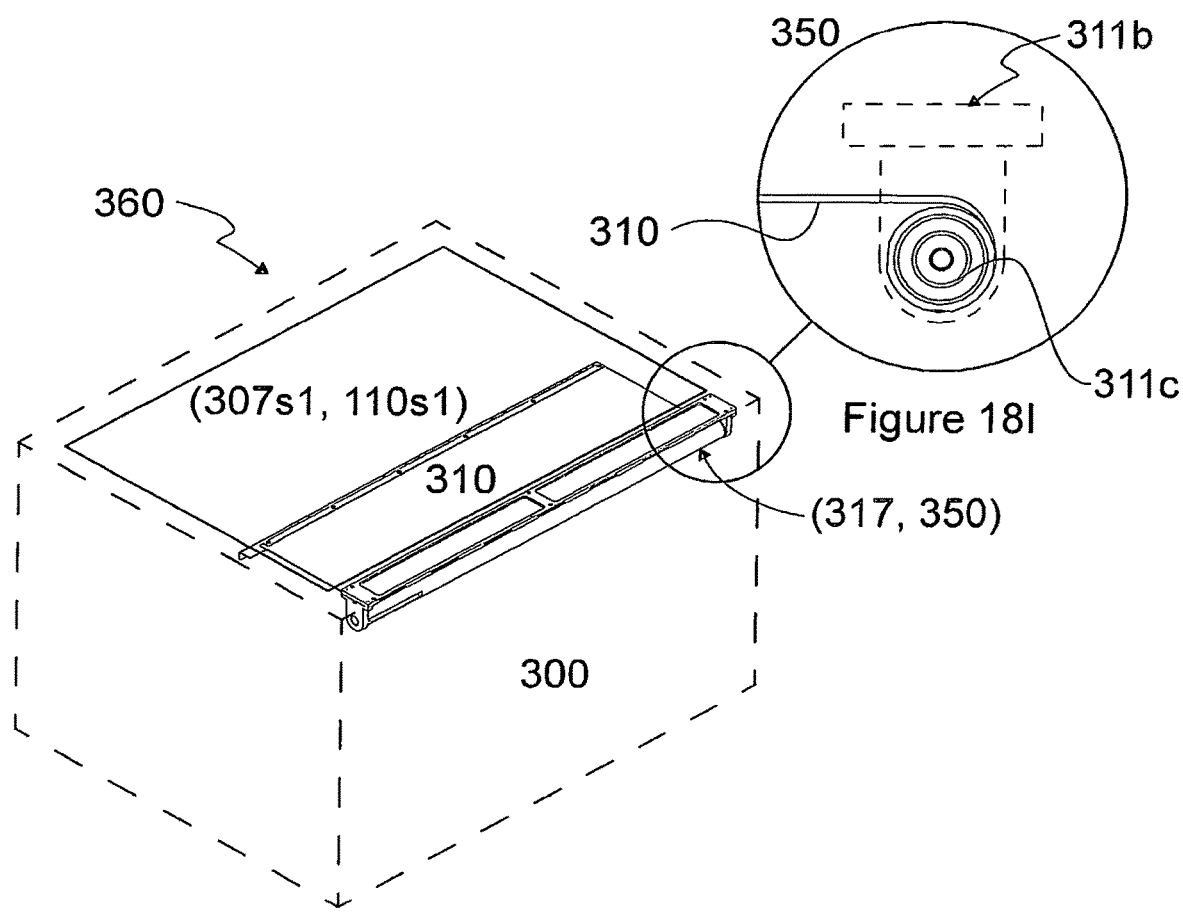
Figure 18H
Figure 18I
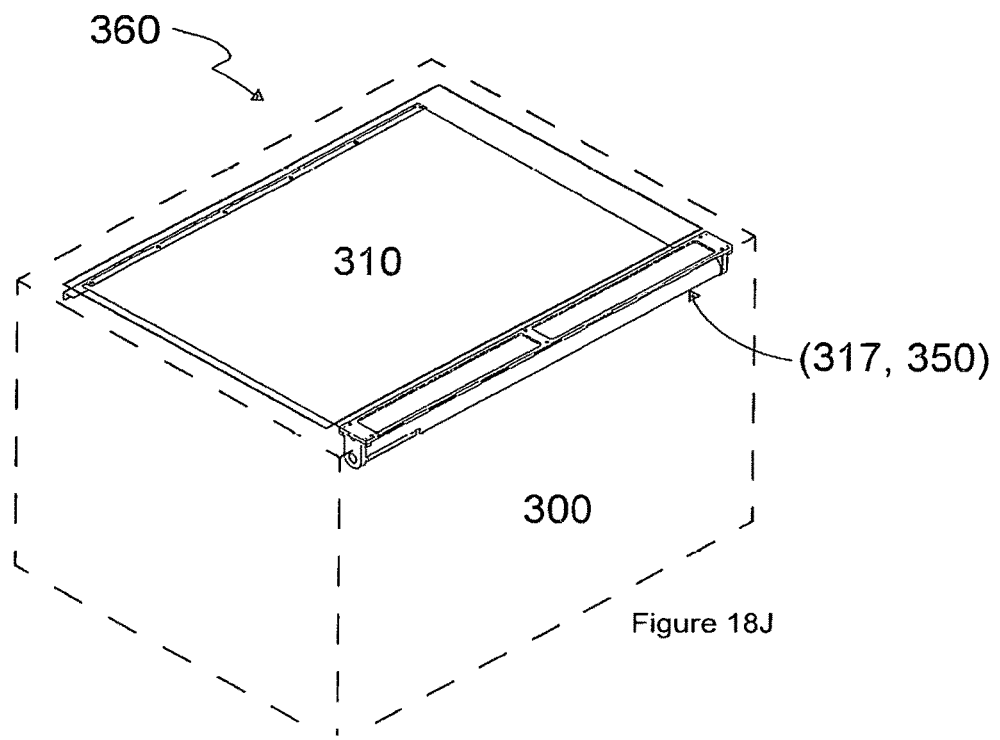
Figure 18J

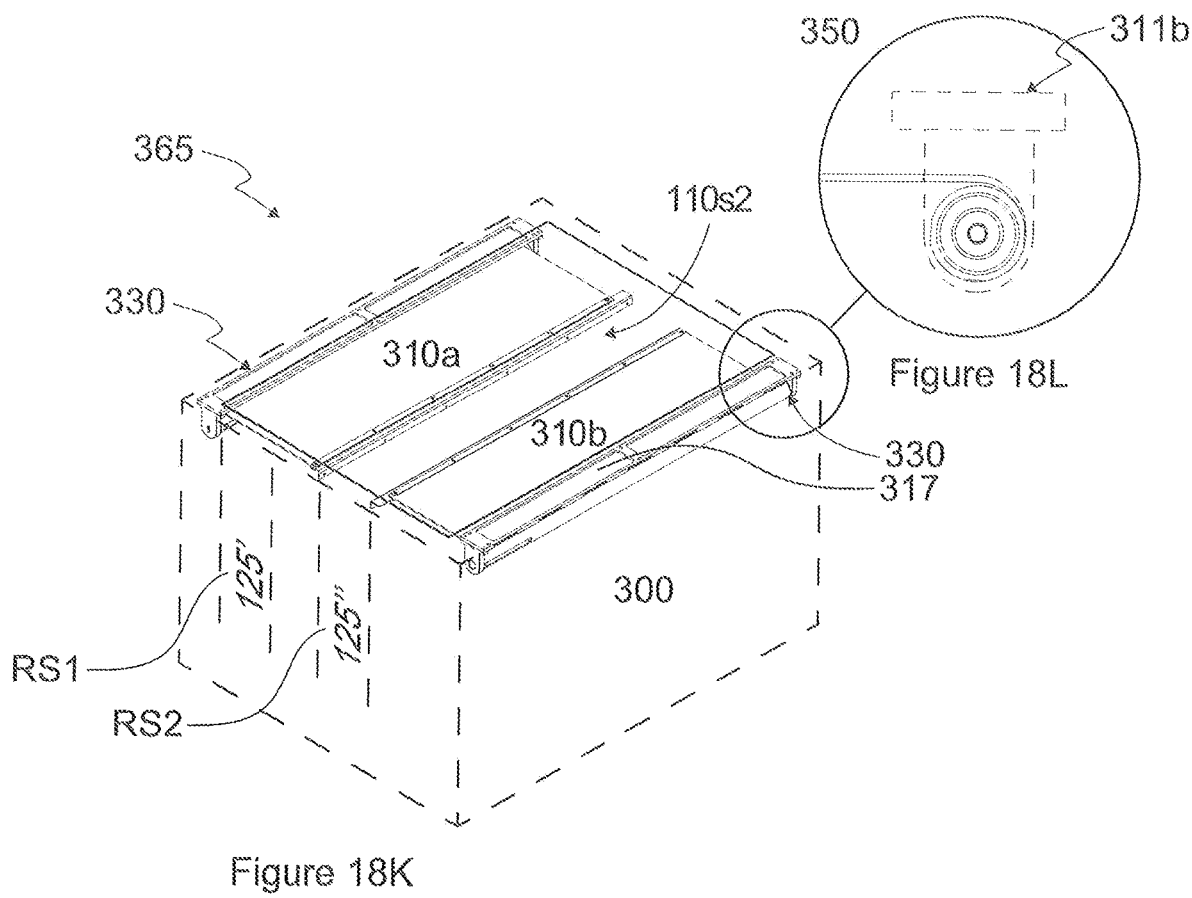
Figure 18K
Figure 18L
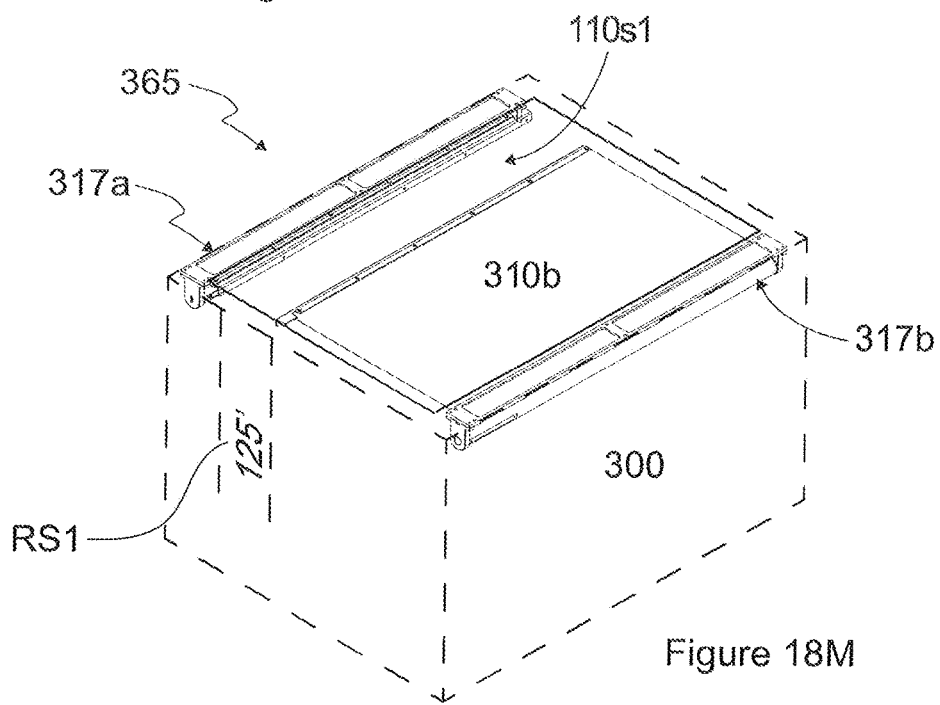
Figure 18M

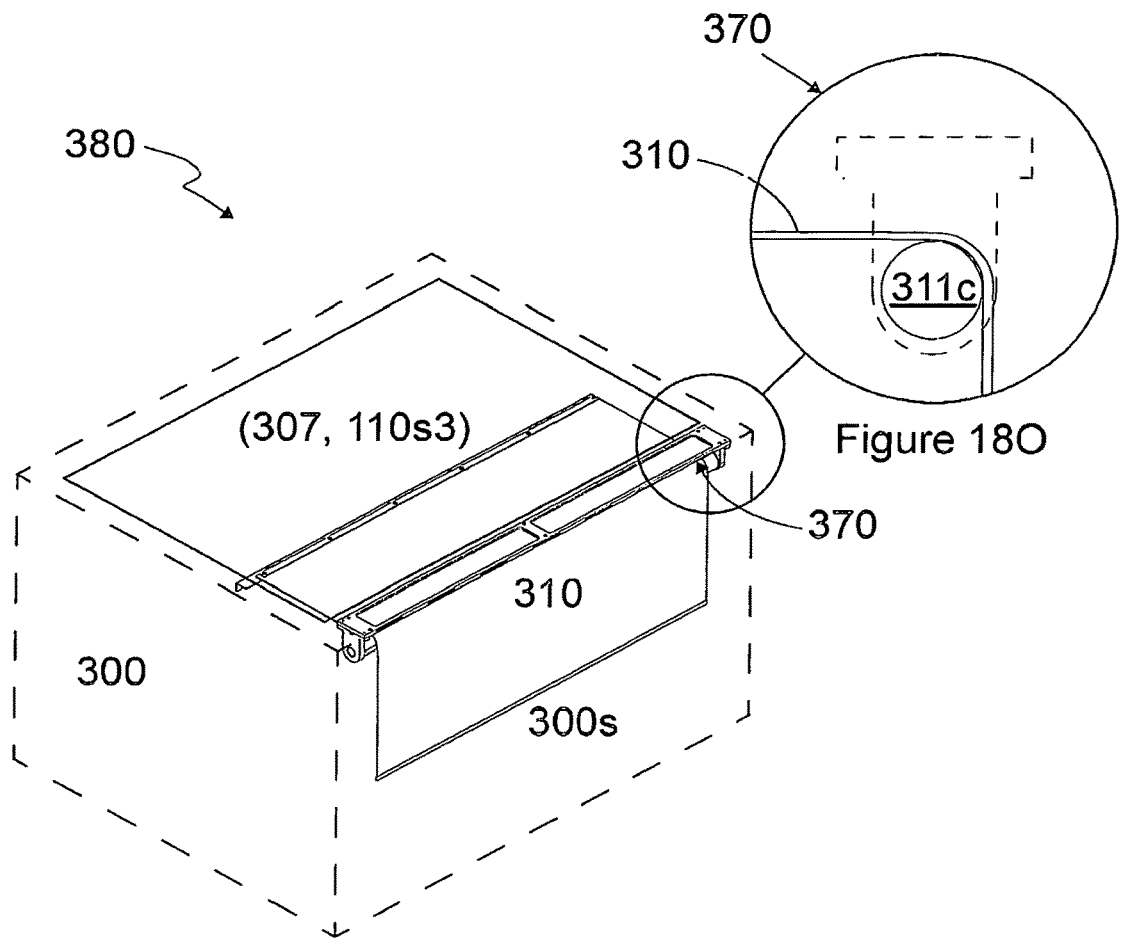
Figure 18O
Figure 18N
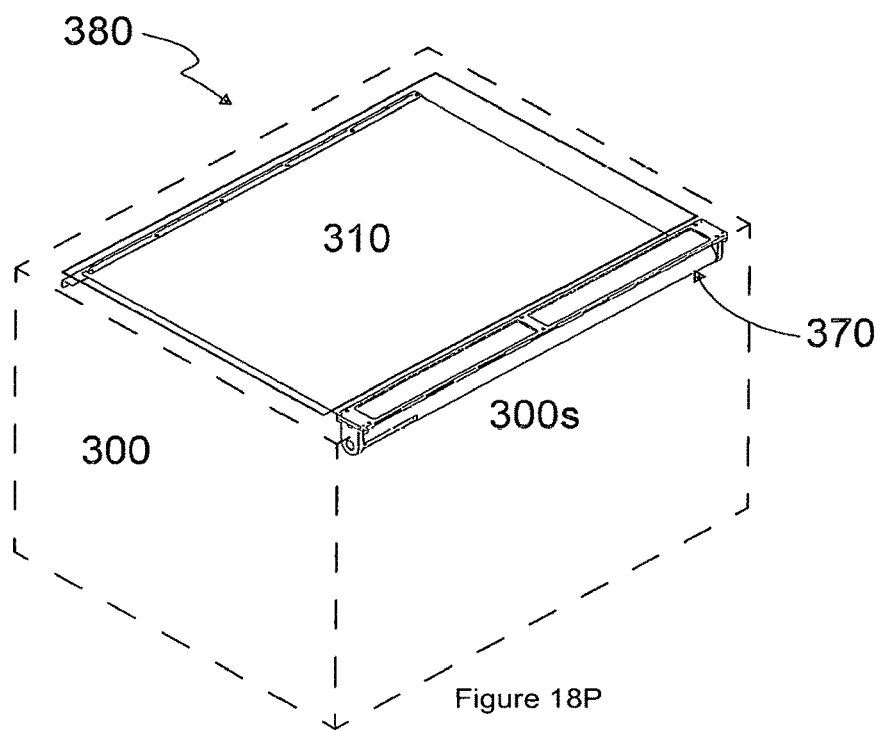
Figure 18P

AUTOMATED CLOSURE FOR HERMETICALLY SEALING AN IMMERSION COOLING TANK DURING A HOT SWAP OF EQUIPMENT THEREIN

RELATED APPLICATIONS

The present invention claims priority to Application No. 63/295,866 filed on Jan. 1, 2022, titled "Immersion Cooling Tank System with Cover Assembly" which is fully incorporated herein by reference under 35 U.S.C. 119(e). This application also fully incorporates by reference U.S. application Ser. No. 16/683,958, filed Nov. 14, 2019, titled "Hot Swap Condenser for Immersion Cooling", now U.S. Pat. No. 11,601,904B2, assigned to assignee of the present invention.

FIELD OF THE INVENTION

The present invention relates to immersion cooling equipment, specifically to removing objects from an immersion cooling tank and, more specifically, to removing electronic or electrical equipment or devices from a heat transfer fluid contained in an immersion cooling tank without altering the operation of other objects within the immersion cooling tank, while minimizing the loss of heat transfer fluid

BACKGROUND OF THE INVENTION

Heat generated by electronic equipment and devices may be removed by convection and/or conduction using, for example, a heat exchanger, an immersion cooling tank, and so forth. Heat removal by immersion cooling may include direct and indirect methods, as well as single- and two-phase approaches. For example, for two-phase immersion cooling, in a first phase, heat generated by operating electronic or electric equipment or devices vaporizes the heat transfer fluid and/or coolant in which the electronic or electric equipment or devices are immersed. In a second phase, heat transfer fluid vapor produced in the immersion cooling tank, upon contact with an exterior surface of a condensing device, e.g., condensing coils through which a cooling fluid flows at a prescribed flow rate and temperature, condenses. The condensate may then be added back, e.g., by gravity feeding, into the immersion cooling tank.

In certain instances, a dielectric fluid may be used as the heat transfer fluid and/or coolant. Dielectric fluids have high resistivity to the transmission or conduction of electrical current, which minimizes and/or prevents electrical current from the operating electronic or electric equipment or devices arcing and damaging other components of the electronic or electric equipment or devices. As a result, non-hermetically-sealed electronic equipment or devices can be immersed in a dielectric fluid used as the heat transfer fluid. Optionally, a heat transfer fluid with electrical conductivity may be used in the immersion cooling equipment; however, in that application, the cooled electronic equipment or devices should be hermetically sealed.

Conventionally, immersion cooling may take place in an immersion cooling tank or bath that may be sealed or semi-open. In some applications, it is preferred that the bath be hermetically sealed to prevent the escape and loss of heat transfer fluid vapor into the environment. Furthermore, heat transfer fluid may be expensive to replace.

Problematically, maintenance of the electronic or electric equipment or devices may be required from time to time, which is further complicated with a sealed bath that does not allow easy access to the electronics or electric equipment inside. For this reason, in some applications, a semi-open or selectively sealable bath may be preferred. Advantageously, a semi-open or a selectively sealable bath enables users to hot swap electronic or electric equipment or devices from the immersion cooling tank. In some applications, hot swap may refer to disconnecting (and/or reconnecting) some electronic or electric equipment or devices contained in an immersion cooling tank while other electronic or electric equipment or devices contained in the same immersion cooling tank continue to operate. As previously mentioned, however, the semi-open or selectively sealable bath can still release large amounts of dielectric vapor.

Alternative approaches to hot swapping provide unsatisfactory or unacceptable consequences. For example, the electronic or electric equipment or devices may be turned off so that the heat generated by their operation does not produce heat transfer fluid vapors that escape into the environment. This approach, however, may result in an undesirable loss of productivity and an unacceptable down time. Instead of being turned off, the electronic or electric equipment or devices also may be operated, such that the heat generated is insufficient to boil the heat transfer fluid, transforming the heat transfer fluid into a heat transfer fluid vapor. This approach results in an undesirable loss of productivity and an unacceptable down time of IT equipment using the in high-speed data centers.

Yet another approach may involve operating a tank or main condenser, on which the dielectric fluid vapor condenses, e.g., constantly or for an extended time, at a much lower temperature than the boiling point of the heat transfer fluid, to promote maximum condensation of the heat transfer fluid vapor. This technique is undesirably (energy) inefficient, increased downtime to activate this additional capital equipment leading to increased cost and complexity.

In still another approach, the loss of heat transfer fluid vapor may be reduced by employing a condenser configured to include multiple levels of, e.g., two or three, condensing coils, one coil atop another coil. Deploying a main tank condenser coil is costly and reduces data center throughput when the coil needs to cool the large tank of dielectric fluid before the tank lid is opened to access the IT equipment.

SUMMARY OF THE INVENTION

The purpose of the present invention is to provide an apparatus for hot swapping electronic or electrical equipment or devices from an immersion cooling tank containing a boiling heat transfer fluid that minimizes the loss of heat transfer fluid vapor or diffused dielectric fluid into the environment.

In some applications, some or all of the heat transfer fluid vapor produced inside an immersion cooling tank is condensed by reusable, external condenser that is lowered within the opening of the immersion cooling tank formed by the lid dimensions.

A first embodiment of the present invention relates to a device for hot swapping one or more electronic devices from an immersion cooling tank having a first opening. In some embodiments, the device includes a condensing device, removably located in the first opening of the immersion cooling tank, the condensing device having a condensing coil forming a second opening through which the electronic device(s) is removable; and an apparatus (e.g., a crane) coupled to the condensing device for selectively adjusting a height and/or a location of the condensing device about the first opening of the immersion cooling tank. In some implementations, the condensing device may further include an outer rim portion connected to a topmost portion of the condensing coil. In some embodiments, an outer peripheral surface of the condensing coil may be adapted to fit within an inner peripheral surface of the immersion cooling tank. Alternatively, in another application, one or more of the outer peripheral dimensions of the outer rim portion of the condensing device may be larger than one or more of the inner peripheral dimensions of the immersion cooling tank.

In some embodiments, the crane may include a lifting arm for adjusting the height of the condensing device, a movable platform operatively coupled to the lifting arm for adjusting the location of the condensing device, and a plurality of casters operatively coupled to a bottom portion of the movable platform for positioning the movable platform. In some embodiments, the crane may be integrated into a movable device such as a self-powered device, an externally powered device, a forklift, and a truck.

In some embodiments, the device may also include one or more of: a coolant container in fluid communication with the condensing device, a chiller pump for circulating a coolant fluid from the coolant container to the condensing device, an item lock selectively attachable to the electronic device(s), and an apparatus for adjusting a height of the item lock, e.g., a pulley system.

In some embodiments, the pulley system may include a plurality of sheaves, a winch (e.g., a hand-operated winch or a motor-driven winch), and a hoist wire disposed through sheaves and having a proximal end operatively attached to the winch and a distal end operatively attached to the item lock. Alternatively, the apparatus for adjusting the height of the item lock may include a chain hoist/forklift assembly or a belt-drive/forklift assembly. In some embodiments, the chain hoist/forklift assembly may include a number of gear-wheel operatively coupled to a winch and about which a roller chain, to which a mounting bracket may be coupled, may revolve.

In another embodiment, the present invention relates to a method of hot swapping one or more electronic devices from an immersion cooling tank having a first opening. In some embodiments, the method may include providing a condensing device having a condensing coil forming a second opening, selectively adjusting a height and a location of the condensing device about the first opening of the immersion cooling tank, inserting an item lock into the immersion cooling tank through the second opening, and removing, with the item lock, the electronic device(s) from the immersion cooling tank via the second opening. Alternatively, the second opening is smaller than the first opening.

In some implementations, selectively adjusting the height and the location of the condensing device may include using a crane and inserting the item lock may include using a pulley system to at least one of raise and lower the item lock.

In another embodiment, the present invention relates to a condensing device for use in hot swapping one or more electronic devices from an immersion cooling tank having a first opening, In another embodiment, the condensing device includes a condensing coil (e.g., a layered coil, such that at an upper coil is located atop a lower coil) forming a second opening through which the electronic device(s) is removable. In some implementations, the condensing device may include an outer rim portion connected to a topmost portion of the condensing coil. Moreover, in some embodiments, one or more of the outer peripheral dimensions of the outer rim portion is larger than one or more of the inner peripheral dimensions of the immersion cooling tank.

In another embodiment, the condensing device may include one or more of: a connection device (e.g., a pair of lifting shackles) for releasably attaching the condensing coil to a lifting device and/or a plurality of attaching device located on the outer rim portion for releasably attaching the outer rim portion to the immersion cooling tank. In further embodiments, the condensing device may be directly and fixedly attached to at least one of the lifting devices and a plurality of attaching device.

There is a long-felt need to provide an automated cover sheet assembly. The automated cover sheet assembly under motorized computer-control allows for varying cover sheets deployed to reduce vapor loss, to be sized by the overall dimensions of the object being inserted or removed from an immersion cooling tank system. Minimizing the exposed area of the tank opening when the lid is opened reduces the amount of loss of dielectric vapor. The diffusion loss of vapor is proportional to the area of opening and the period of time the opening is exposed.

Referring in to FIG. 17, the variable sized openings are partially sealed with a cover sheet sized to reduce vapor losses. Cover sheets do help reduce vapor loss after the lid to the immersion tank is open. As shown in printed publication dated 2014, titled "3M™ Two-Phase Immersion Cooling—High Level Best Practices for System Fabrication", at FIG. 1, lid is disclosed. FIG. 2 shows a cross-section of the lid with a seal between the tank edge and underneath portion of lid. The lid is secured compressing the seal to prevent dielectric liquid and vapor loss, due to the boiling action of the electronic fluid described in the 3M™ publication. The 3M™ publication further discloses how exposure to air that has varying levels of moisture, by regional conditions, this moisture exposure can result in failed electronic circuits. Although the 3M™ article discloses a desiccant to assist with moisture control, reducing the area of the immersion tank opening exposed directly to the ambient air can reduce moisture build up inside the head space of the tank above the electronic fluid. Although reducing moisture build up is a benefit, the long-felt need is reducing dielectric fluid loss due to vapor. The electronic fluids emit small amounts of greenhouse gases, and the electronic fluids are costly.

In a first embodiment of the retractable cover sheet assembly, a cover sheet attached to a motor is retracted or positioned over an opening formed by an exterior case. The exterior case has a condenser formed about a perimeter of the inner wall of the case. Coolant is delivered through thermally-conductive material or coils prior to forming a sized opening with the cover sheet. The retractable cover sheet assembly has at least one cover sheet that is operated by a motor in communication with a computer. Depending on the object size to be removed from the immersion cooling tank, the cover sheet is positioned to form an opening within the opening formed by the exterior case. The exterior case is position over the immersion tank opening and typically secured within the immersion tank system.

In a second embodiment, the retractable cover sheet assembly is configured with a containment structure formed of two sides that move cooperatively with the at least one cover sheet. The containment structure increases the freeboard ratio which reduces vapor loss when the tank lid is opened.

In a third embodiment, the containment structure may be shaped with a funnel or conical end that is fitted within the immersion tank opening directly, or through the sized opening formed by retractable cover sheet assembly. The containment structure has a o-ring to further seal the containment structure about the opening to reduce dielectric vapor loss when the tank lid is opened to access the objects being cooled within the immersion tank.

In a fourth embodiment, a method of removing objects of different sizes or within different locations, that is rack or rack and slot locations, within the immersion tank. The computer interface receives a signal from the object, typically a computer server, and positions and aligns a hot swap removal device, forms a sized opening with the retractable cover system assembly, opens the lid, and then replaceable removes the object. Once the removal and replaced object is placed back into the rack/slot, the computer closes the size opening with the at least one cover sheet and signals the tank lid to be close.

Various combinations of the above embodiments are claimed.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described;

FIG. 1B depicts a detail of an illustrative embodiment of the condensing device in FIG. 1A;

FIG. 7B depicts a detail of an embodied method of securely attaching the condensing device of FIG. 7A to a flange about the rim of the opening of the immersion cooling tank, in accordance with some embodiments of the present invention;

FIG. 16B depicts a detail of the item lock depicted in FIG. 16A, in accordance with some embodiments of the present invention;

FIG. 17B depicts a detail of the adjustable condensing device depicted in FIG. 17A, in a minimum opening mode that includes gaps between C-shaped portions, in accordance with some embodiments of the present invention;

FIG. 17C depicts a detail of the adjustable condensing device depicted in FIG. 17A, in a maximum opening mode that includes gaps between C-shaped portions, in accordance with some embodiments of the present invention;

FIG. 17D depicts a detail of the adjustable condensing device depicted in FIG. 17A, in which the condenser assemblies overlap each other, in accordance with some embodiments of the present invention;

FIG. 17E depicts a detail of the adjustable condensing device depicted in FIG. 17A, in a maximum opening mode that includes L-shaped portions and touching end pieces, in accordance with some embodiments of the present invention;

FIG. 17F depicts a detail of the adjustable condensing device depicted in FIG. 17A, in in a minimum opening mode that includes L-shaped portions and touching end pieces, in accordance with some embodiments of the present invention;

FIG. 18D1 depicts a top view of a cover sheet assembly deployed in FIG. 18C with a computer controlled motor;

FIG. 18D2 depicts a top view of a cover sheet assembly deployed in FIG. 18C with a computer controlled motor;

FIG. 18H depicts a perspective view of cover sheet (FIG. 18D) in a partial retracted position configured as part of an immersion cooling tank system FIG. 18I depicts a zoomed view of cylinder spooling assembly of the cover sheet assembly (FIG. 18D) as it is wound about a cylinder assembly according to a first embodiment of storing the retractable cover sheet;

FIG. 18J depicts a perspective view of a first cover sheet fully covering an opening of an immersion cooling tank system;

FIG. 18K depicts a perspective view of a first cover sheet assembly and a second cover sheet assembly configured to form a first sized opening;

FIG. 18L is a zoomed viewed of the cover sheet being spooled within the cover sheet cylinder as the cover sheet is retracted or displaced over the immersion cooling tank opening;

FIG. 18M depicts a first cover sheet displaced over the immersion tank opening and the second cover sheet spooled about the cylinder of the cover sheet assembly configured to form a second sized opening;

FIG. 18N depicts a perspective view of a second embodiment of storing a cover sheet along an inner side of an immersion tank wall;

FIG. 18O depicts a cover sheet being guide by the cylinder assembly during retracting of a cover sheet;

FIG. 18P depicts a perspective view of the cover sheet fully displaced covering an opening of an immersion cooling tank system;

FIG. 19A, FIG. 19B and FIG. 19C depict perspective views of a hot swap assembly deployed to swap a device of an immersion cooling tank system using the covering sheet assembly of FIG. 18A and FIG. 18B;

FIG. 20A, FIG. 20B and FIG. 20C depict perspective views of a hot swap assembly to swap a device during operation of an immersion tank system with cover sheets forming a tight gas seal as part of a containment structure;

DETAILED DESCRIPTION

Figure 1A:
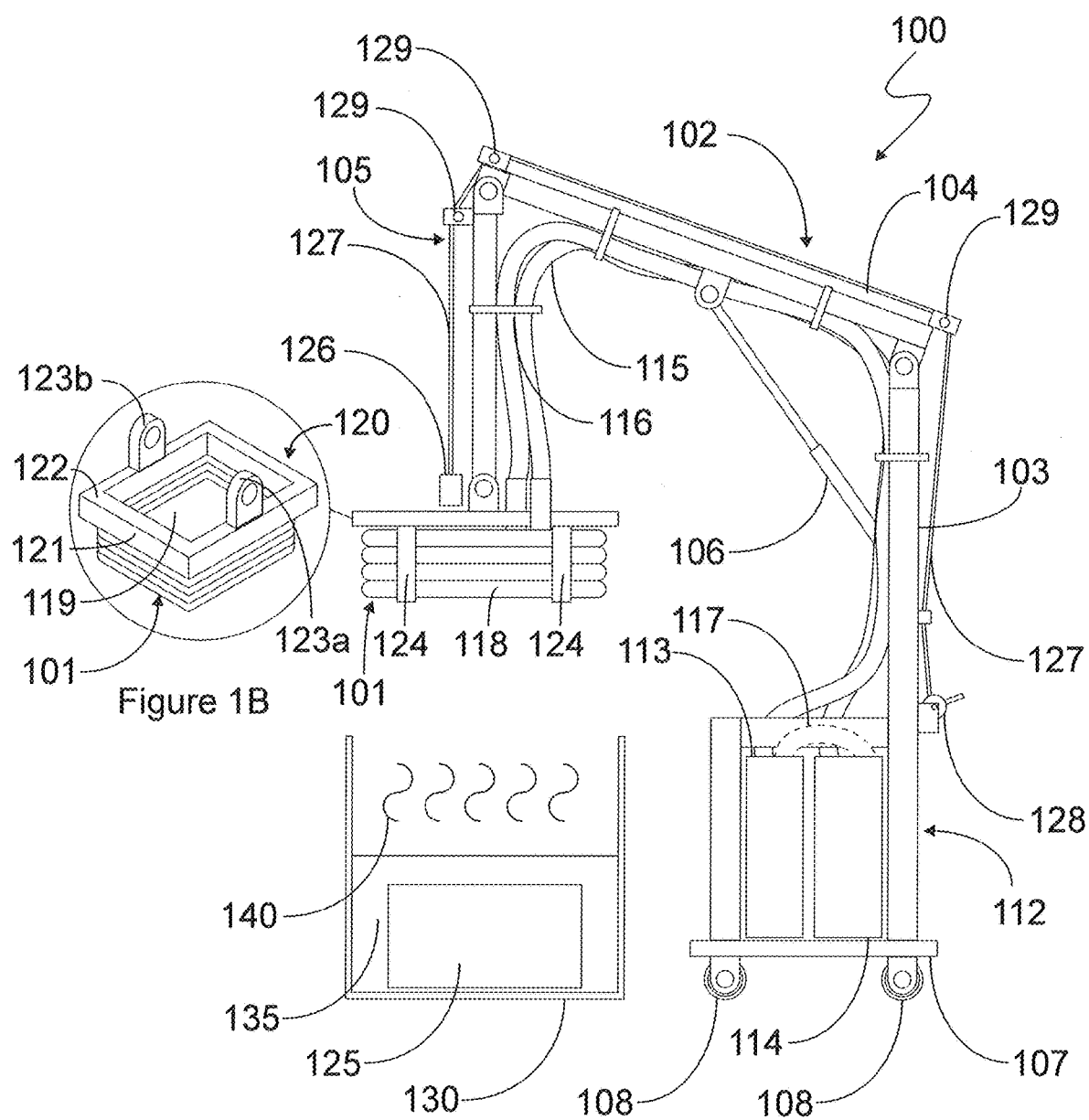
FIG. 1A is a side view of a first embodiment of a device for hot swapping an object, in which the condensing device is positioned above an immersion cooling tank containing the object, in accordance with some embodiments of the present invention.

Referring to FIGS. 1A through 3A, an illustrative first embodiment of device (100) for hot swapping object (125), (e.g., electronic or electric equipment or device), from immersion cooling tank (130) containing a bath of heat transfer fluid (135) (also referred to as dielectric fluid) is depicted. Advantageously, some or all of heat transfer fluid vapor (140) produced inside the immersion cooling tank (130) may be condensed and returned to immersion cooling tank (130) using (e.g., main) condenser (101) that is selectively locatable within, at, on, or above immersion cooling tank (130) and that is, further, structured and arranged to circulate coolant at desired temperature (e.g., at room temperature). In another application, some or all of heat transfer fluid vapor (140) produced inside immersion cooling tank (130) may be transported away actively or passively to a heat exchanger system that is located separate from immersion cooling tank (130), so that there is no (e.g., main) condenser (101) disposed within the opening of immersion cooling tank (130).

Continuing to refer to FIGS. 1A thru 3A, device (100) may include (e.g., main) condensing device (101) that is releasably coupled to apparatus (102) for selectively adjusting the height (z-direction) and the location (x- and y-directions) of condensing device (101) with respect to an opening provided in immersion cooling tank (130). Apparatus (102) for selectively adjusting the height and location of condensing device (101) may comprise a crane having vertical support portion (103), boom portion (104), and adjusting portion (105). Condensing device (101) may be configured to be releasably attach to a distal end of adjusting portion (105), such that translation of adjusting portion (105) may be accompanied by a raising or lowering of condensing device (101) (e.g., in a z-direction). The z-direction is defined as out of immersion cooling tank (130).

Continuing to refer to FIGS. 1A thru 3A, boom portion (104), at its proximal end, may be coupled to vertical support portion (103) and, at its distal end, vertical support portion (103) may be coupled may be coupled to adjusting portion (105). The coupling mechanism comprises a hinge, removable pin or similar mechanism that allows two or more axis of movement about the coupling point, lifting arm (106), (e.g., an hydraulic cylinder), coupled (e.g., at its proximal end) to vertical support portion (103), (e.g., at about the mid-span or mid-length of vertical support portion (103)), and may be coupled (e.g., at its distal end) to boom portion (104), such that operation of lifting arm (106) may cause boom portion (104) to rotate about the coupling point at vertical support portion (103). Rotation of boom portion (104) about the coupling point at vertical support portion (103) may cause adjusting portion (105) to translate in a z-direction, e.g., up or down with respect to a planar (e.g., an xyz-plane) surface, defined as the floor. Rotation of boom portion (104) about the coupling with vertical support portion (103) may also result in some positional movement of condensing device (101) in the horizontal or x-direction.

Continuing to refer to FIGS. 1A thru 3A, vertical support portion (103) of the crane may be fixedly attached to platform (107) operatively coupled to device(s) (108) configured to position platform (107) relative to immersion cooling tank (130), in order to compensate for positional movement of condensing device (101) in the horizontal direction. FIG. 1A discloses platform (107) as a cart and with positioning device (108) as a plurality of casters or wheels, as a non-limiting example. Platform (107) may be secured to a motorized carriage under robotic control or wheels (108) may be guided along tracks secured to the floor (not shown). An objective of moving device (100) is the xyz-plane is to position condensing device (101) at a desired location above the xyz-plane, (e.g., above an opening in immersion cooling tank (130)). Such devices (108) may be motorized, self-propelled, and/or powered externally. Non-limited examples include movable platforms may include, for the purpose of illustration rather than limitation, a truck, a forklift, and so forth.

Figure 2:
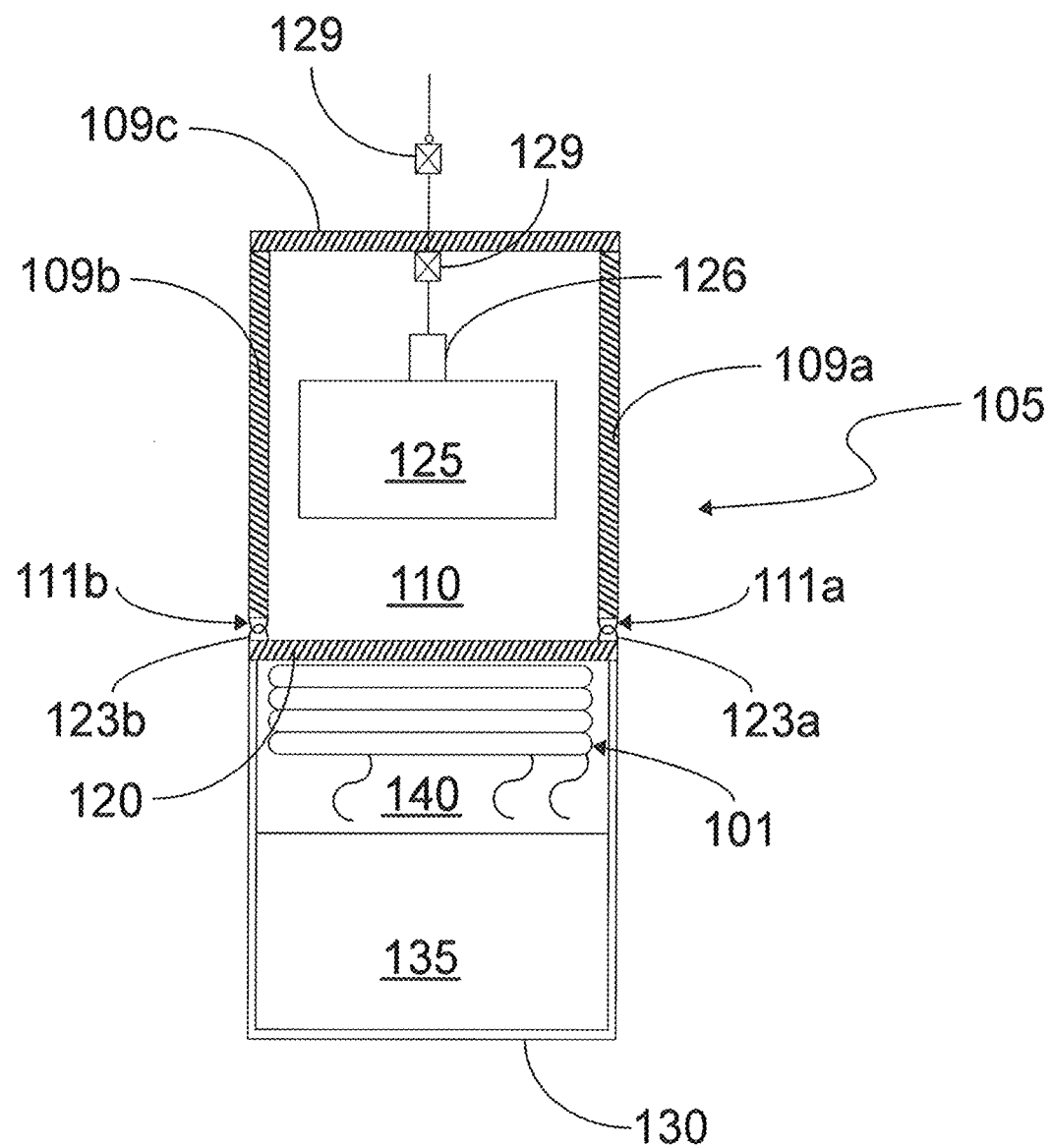
FIG. 2 depicts a front view of an illustrative embodiment of a raising/lowering portion of the device depicted in FIG. 1A, in accordance with some embodiments of the present invention.

FIG. 2 depicts, adjusting portion (105) may comprise first vertical arm (109a) and second vertical arm (109b) that are each fixedly attached to crossbeam (109c) that is coupled, by a hinge or pin, to boom portion (104), such that movement (e.g., rotation) of boom portion (104) causes rotation about the coupling point connecting to crossbeam (109c), which results in a vertical (e.g., up/down) translation of adjusting portion (105) and a corresponding raising/lowering of condensing device (101). First vertical arm (109a), second vertical arm (109b), and crossbeam (109c) are arranged to provide therebetween opening (110) dimensioned to accommodate item lock (126), as well as object (125) to be hot swapped. The free ends of each of first (109a) and second vertical arms (109b) (i.e., the ends of vertical arms (109a), (109b)) that are not fixedly attached to the crossbeam (109c) may be configured to include a respective attaching device (111a, 111b) for releasably attaching first (109a) and second vertical arms (109b) to corresponding connection device (123a, 123b) fixedly attached to condensing device (101). For example, respective attaching device (111a, 111b) on vertical arms (109a, (109b) may include openings or holes that may be aligned with openings in the corresponding connection device (123a, 123b). In some implementations, a pin, bolt, cotter pin, and the like may be inserted into or through the aligned openings in attaching device (111a, 111b) of first (109a) and second vertical arms (109b) and corresponding connection device (123a, 123b) are attached to condensing device (101) to releasably attach adjusting portion (105) to condensing device (101).

Figure 3A:
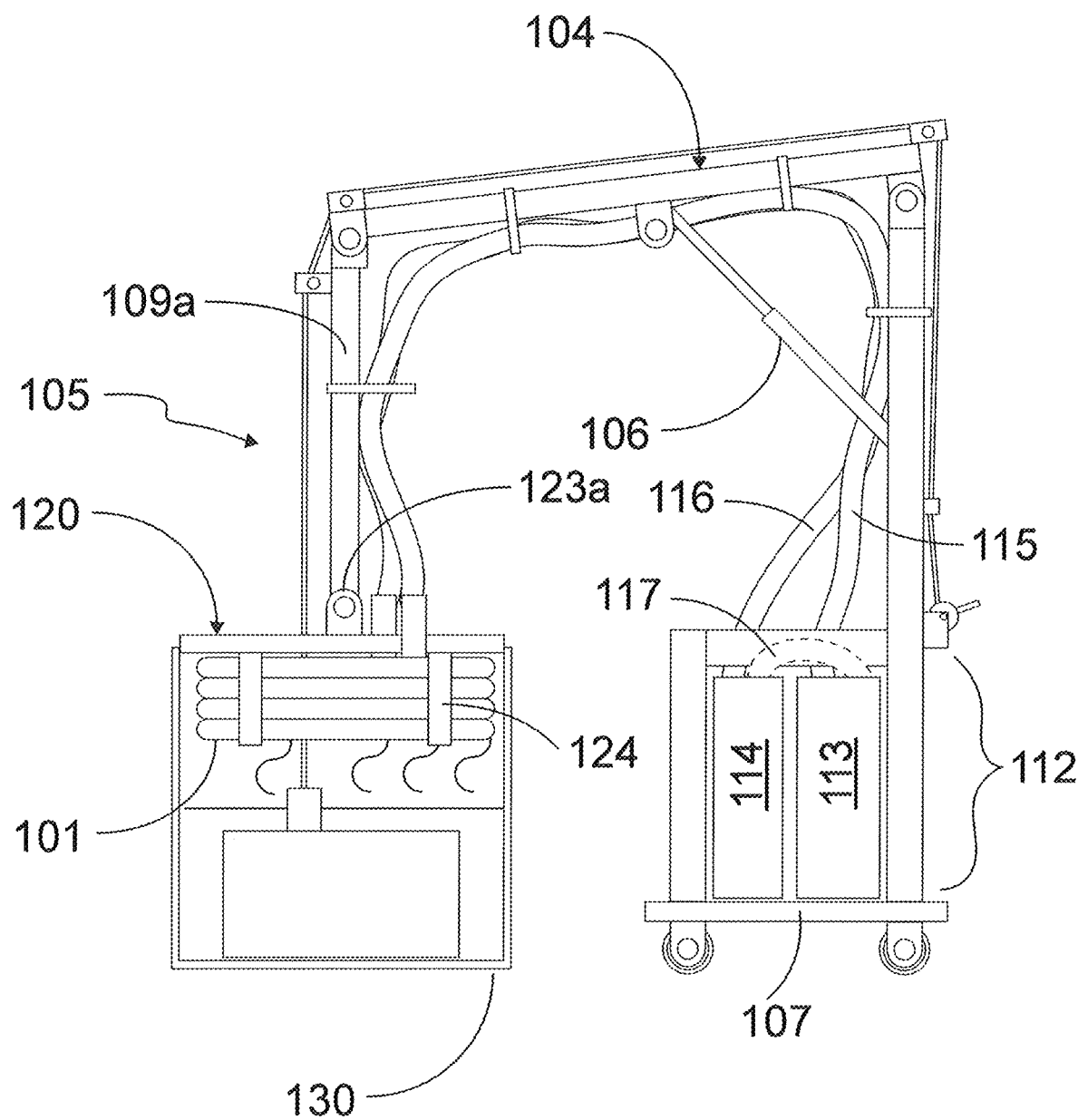
FIG. 3A depicts a side view of the device depicted in FIG. 1A, in which the condensing device is positioned at the opening of and within the immersion cooling tank, in accordance with some embodiments of the present invention.
Figure 14:
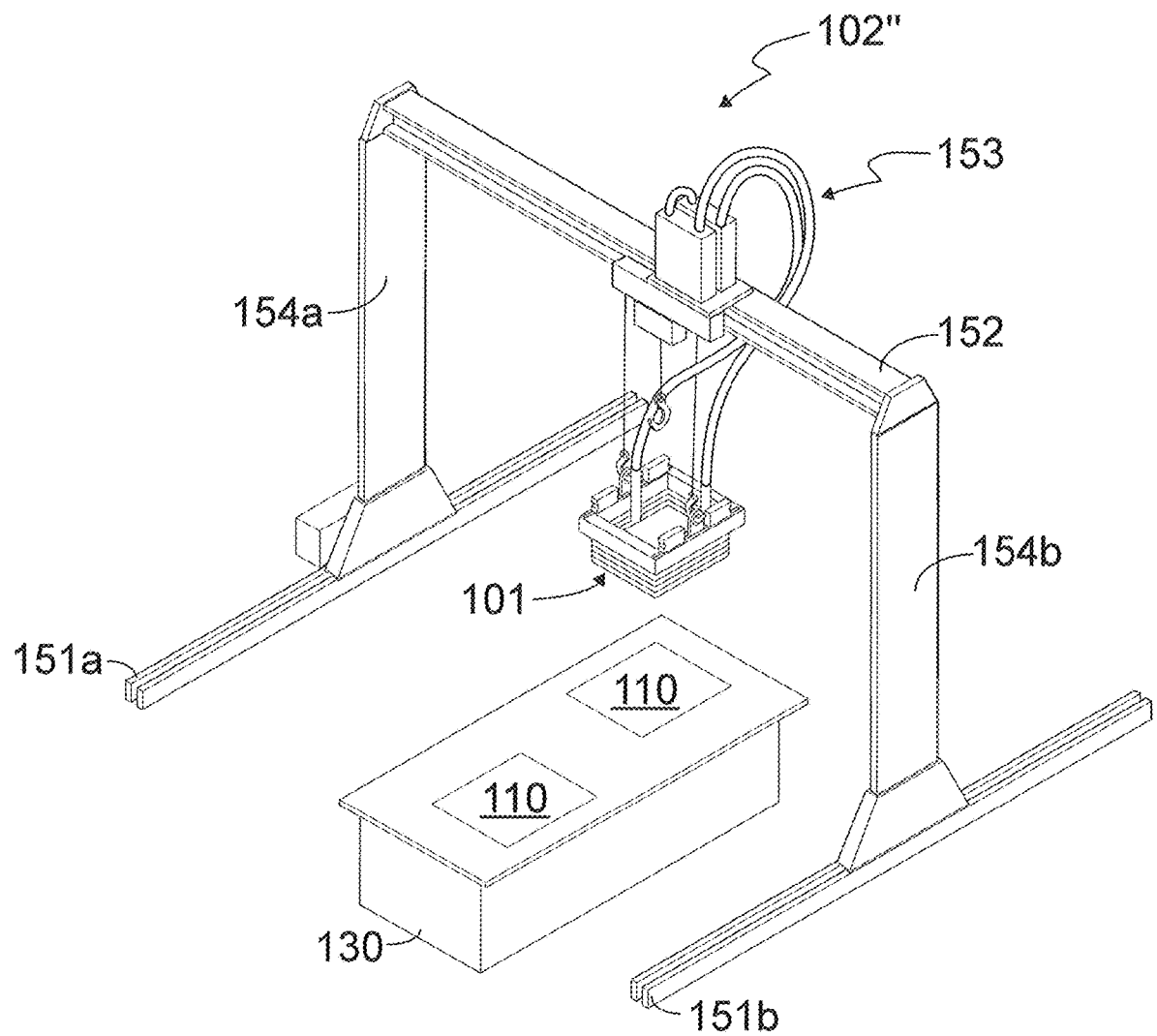
FIG. 14 depicts an isometric view of a fifth embodiment of a device for hot swapping an object that includes a hook as the item lock and that transports the condensing device along rails mounted to the ground, in accordance with some embodiments of the present invention.

Referring to FIG. 3A and FIG. 14, (where like numbers refer to the same or similar functioning component), in addition to supporting apparatus (102) for selectively adjusting the height and location of condensing device (101), platform (107) may also support coolant system (112) for providing, forcing, and/or pumping a cooling fluid (e.g., water, coolant, Freon, and so forth) through condensing device (101) for the purpose of causing heat transfer fluid vapor to condense on an exterior surface of condensing device (101). Coolant system (112) may comprise coolant container (113), chiller pump (114), coolant delivery conduit (115), and coolant return conduit (116). Coolant container (113) provides a reservoir containing a volume of fluid coolant and is configured to be in fluid communication with chiller pump (114) (e.g., via a fluid conduit (117), as well as with a coolant return conduit (116). Chiller pump (114) may be configured to be in fluid communication coolant container (113) and coolant delivery conduit (115), without departing from the scope of the present invention. The need for the coolant reservoir is to ensure the chiller pump is operating during hot swap of object (125) as described in the present invention. Chiller pump (114) recycles the warmed coolant back through condenser (101) that condenses vapor (140) that escapes when the lid of the coolant tank (130) is opened to swap out an object. The coolant delivery conduit (115) and coolant return conduit (116)) may be in fluid communication with condensing coils (118) of condensing device (101). Upper condensing coil (118) has an inlet and an outlet (attached to coolant delivery conduit (115) and coolant return conduit (116), respectively) and all of condensing coils (118) provide fluid communication between the inlet and outlet. In some implementations, in operation, chiller pump (114) extracts fluid coolant from coolant container (113) via fluid conduit (117), forcing the fluid coolant serially through coolant delivery conduit (115), condensing device (101), coolant return conduit (116), and back into coolant container (113). Under computer control (or settings at the chiller pump), chiller pump (114) controls the flow rate of the fluid coolant and thereby controls the coolant temperature, which directly impacts the amount of vapor that is condensed. Controlling the temperature and flow rate of the fluid coolant allows the user to control the rate and degree of condensation of heat transfer fluid vapor (140) on exterior surface of coils (118) of condensing device (101).

Referring to FIG. 1A, 3A, 5 or 6, condensing device (101) is comprised of condensing coils (118) configured to have a shape of the tank opening and to provide opening (119) for object (125). The shape and dimensions of condensing device (101) and condensing coils (118) may be selected or designed, such that the shape and dimension are consistent with those of immersion cooling tank (130). More specifically, the shape and dimension of condensing device (101) and condensing coils (118) may be selected so that, condensing coils (118) may be inserted into, at, or above the opening of immersion cooling tank (130) with sufficient clearance, (e.g., a gap, between outer peripheral surface (121) of condensing coil (118) and an inner peripheral surface of immersion cooling tank (130) to prevent or minimize frictional resistance when condensing coils (118) are inserted into opening (130) of immersion cooling tank (130). The size and shape of opening (119) of condensing device (101) may also be dimensioned to enable a user to remove any piece of electronic or electric equipment or device (125) immersed in heat transfer fluid bath (135).

Referring to FIGS. 1A and 1B depict a rectangular or substantially rectangular condensing device (101) for use with a rectangular or substantially rectangular immersion cooling tank (130), those of ordinary skill in the art can appreciate that this is done for illustrative purposes only. The shape of immersion cooling tank (130) and the shape of the corresponding condensing device (101) and condensing coils (118) may be square, circular, substantially circular, elliptical, substantially elliptical, and so forth.

Figure 6:
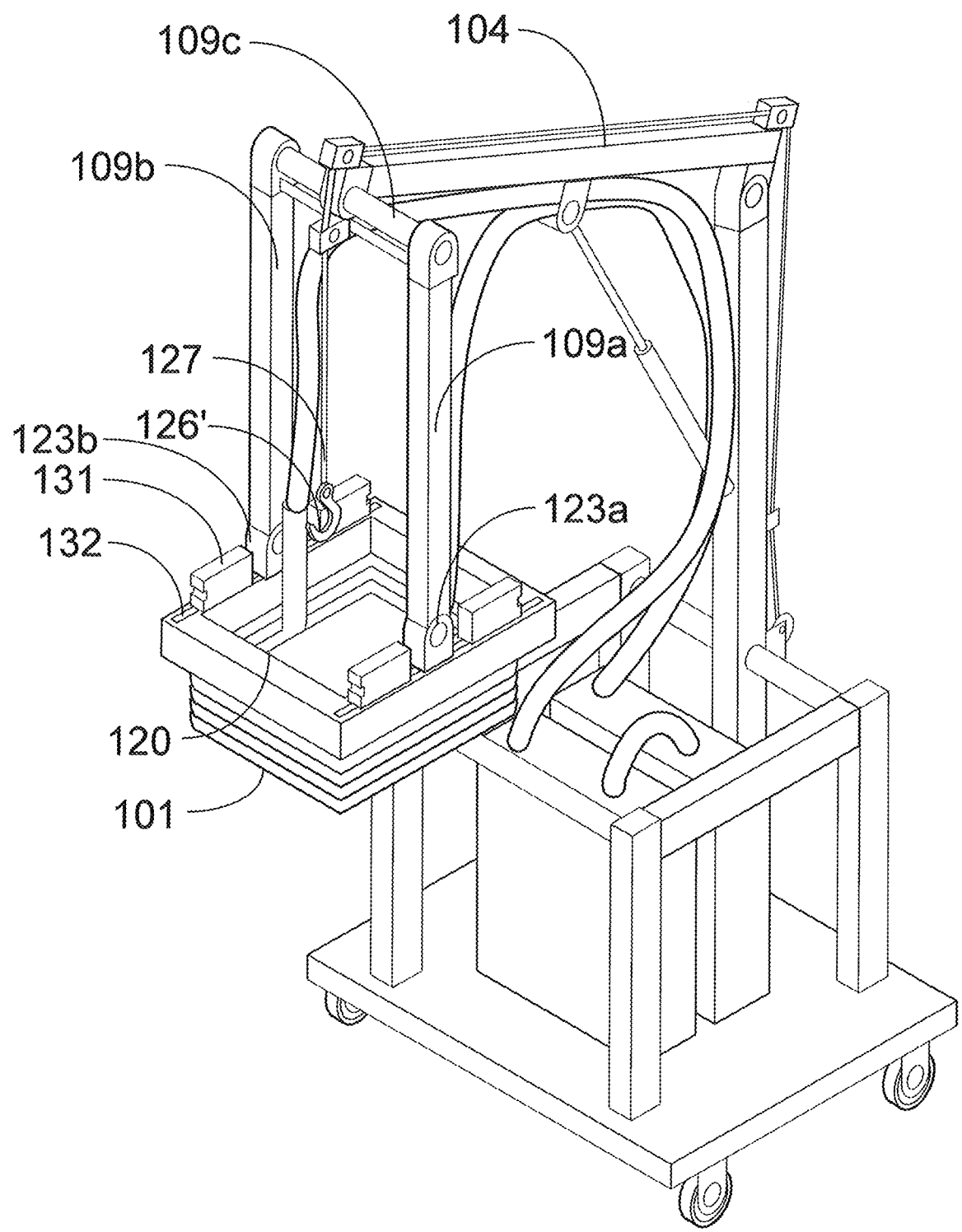
FIG. 6 depicts an isometric view of a second embodiment of a device for hot swapping an object using a hook as the item lock, in accordance with some embodiments of the present invention.

Continuing to refer to FIGS. 1A and 3A, condensing coils (118) may include a coil conduit that is configured in a (e.g., rectangular, circular, elliptical, and so forth) shape having multiple layers of tubing atop one another. Condensing device (101) may also include an outer rim portion (120) that may be fixedly or releasably attached to condensing coils (118). For example, in some embodiments, condensing coils (118) may be fixedly or releasably attached to the (e.g., bottom surface of the) rim portion (120) using a plurality of holding elements (124) (e.g., metal straps). Referring to FIG. 6, condensing coils (118) may be fixedly or releasably attached to boom portion (104) of the crane directly.

Referring to FIGS. 1-4, the inner peripheral surface of the outer rim portion (120) may be dimensioned to correspond to the size and shape of the opening (119) in condensing device (101). Outer peripheral edge (121) (refer to FIG. 1A) of the outer rim portion (120) may be dimensioned to extend beyond or past the largest dimension of the inner peripheral surface of the opening in immersion cooling tank (130), so that, when condensing device (101) is properly installed, the outer rim portion (120) covers, substantially covers, or partially covers at least some portion of the rim and/or opening of immersion cooling tank (130). Such coverage provides a temporary seal to prevent or minimize heat transfer fluid vapor (140) from escaping from immersion cooling tank (130), (e.g., while object (125) is being removed from or being placed into immersion cooling tank (130)). Alternatively, the dimensions (e.g., length and width, circumferential, and so forth) of outer peripheral edge (121) of outer rim portion (120) may be dimensioned to be slightly less than the corresponding dimensions of the inner peripheral surface of the opening in immersion cooling tank (130), such that condenser (101) fits within immersion cooling tank (130), providing a sealed fit within the opening in immersion cooling tank (130).

Referring to FIGS. 2 and 3A, a pair of connecting devices (123a, 123b), (e.g., lifting shackles), may be fixedly attached to upper surface (122) of outer rim portion (120). Each of the pair of connecting devices (123a, 123b) may be configured to releasably connect to respective attaching device (111a, 111b) of a corresponding first or second vertical arm (109a, 109b) of the adjusting portion (105).

Figure 3B:
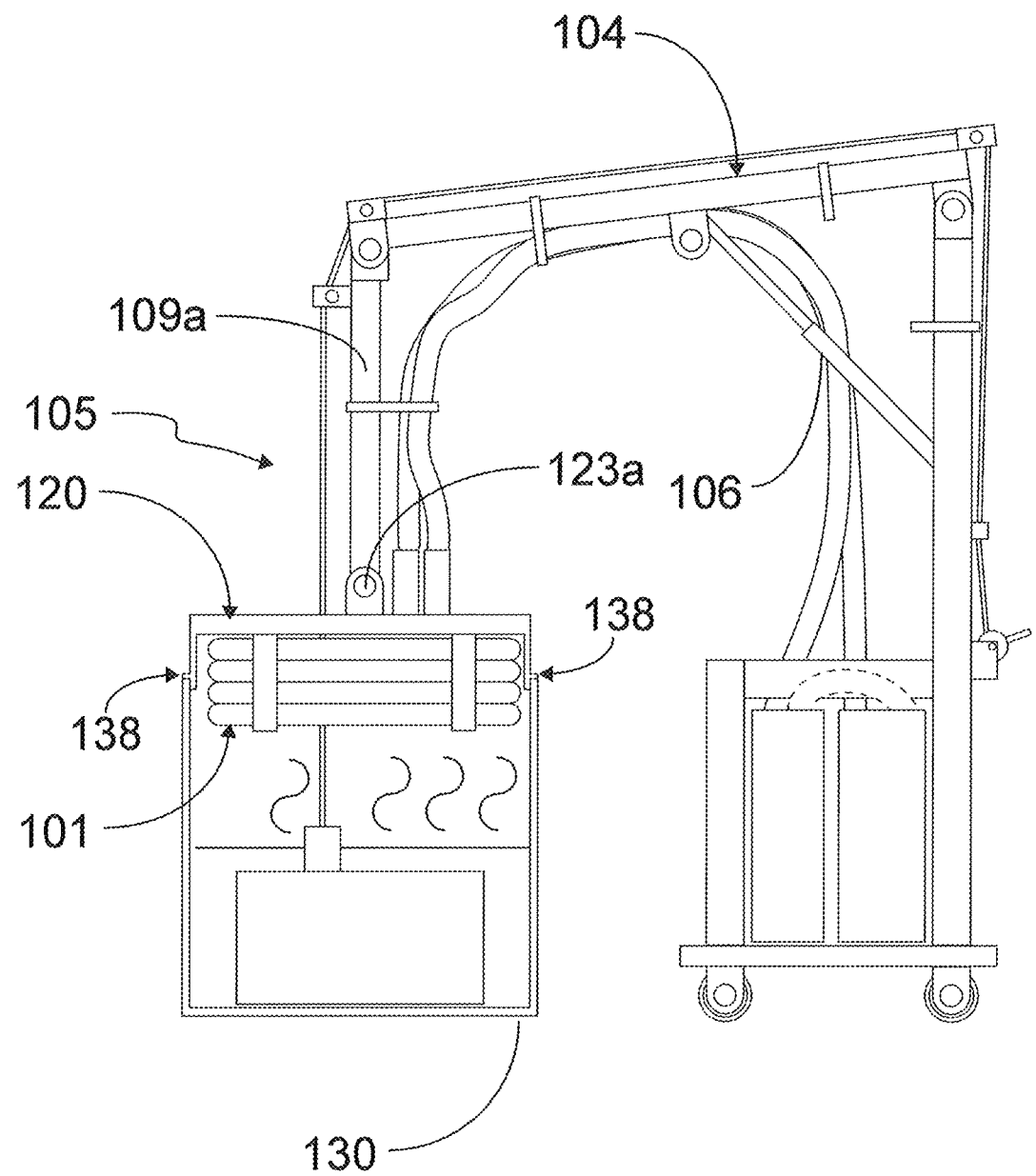
FIG. 3B depicts an alternative side view of the device depicted in FIG. 1A, in which the condensing device is positioned at the top of the opening of the immersion cooling tank using a flange formed about the outer peripheral edge of the outer rim portion of the condensing device, in accordance with some embodiments of the present invention.
Figure 3C:
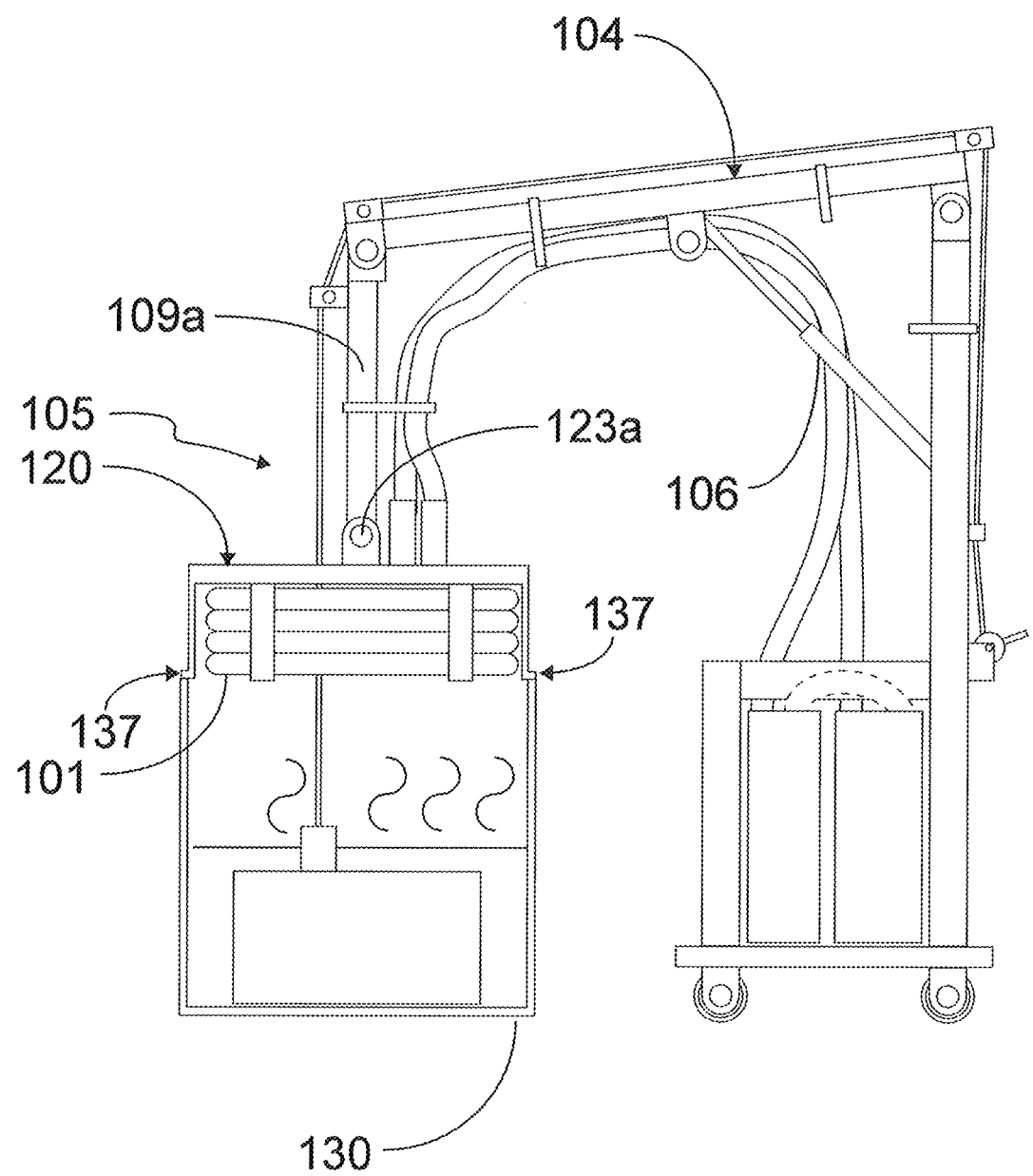
FIG. 3C depicts yet another side view of the device depicted in FIG. 1A, in which the condensing device includes a flange that rests atop the outer rim of the immersion cooling tank, in accordance with some embodiments of the present invention.

Referring to FIGS. 3A thru 3C, outer rim portion (120) may include an outer lip or flange portion that is configured to extend beyond and down some portion of the outer peripheral surface of immersion cooling tank (130). The outer lip or flange portion provides a seal to prevent or minimize heat transfer fluid vapor (140) escaping from immersion cooling tank (130). Optionally, the outer lip or flange portion may provide a platform for an attaching device that may be used for releasably attaching condensing device (101) to immersion cooling tank (130). Exemplary attaching device, for the purpose of illustration rather than limitation, may include mechanical quick connection device (e.g., a snap catch, a locking detainer, and so forth).

Figure 3D:
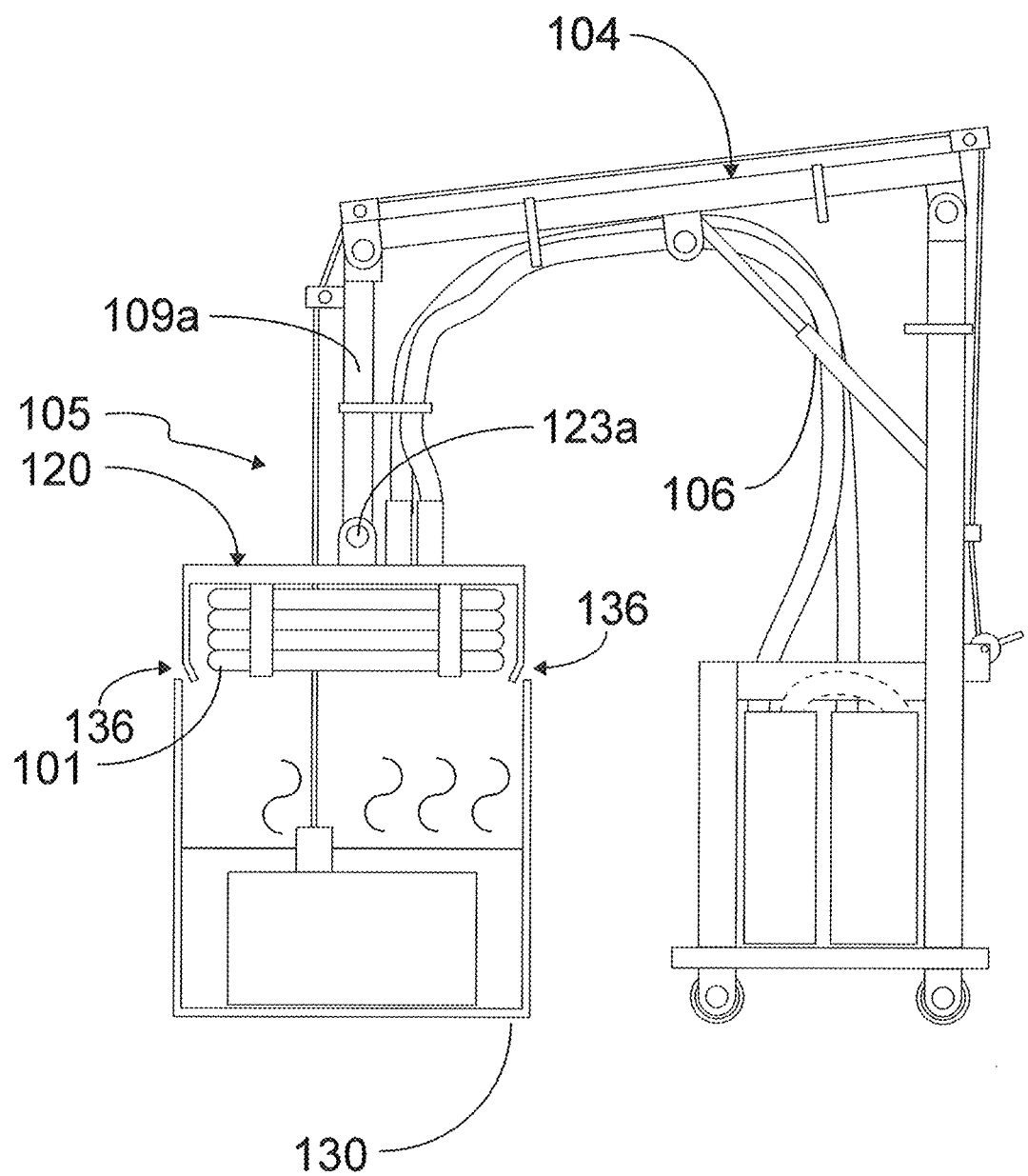
FIG. 3D depicts yet another side view of the device depicted in FIG. 1A, in which the condensing device includes a chamfered edge that is adapted to position the condensing device above the opening of the immersion cooling tank, in accordance with some embodiments of the present invention.

As depicted in FIGS. 3B through 3D, various embodiments are disclosed for positioning condensing device (101) at or about the opening of immersion cooling tank (130). By contrast, FIG. 3A depicts condensing device (101) that is completely or substantially disposed within immersion cooling tank (130). Immersion cooling tanks (130) disclosed in FIGS. 3B through 3D may only be partially disposed within immersion cooling tank (130). Referring to FIG. 3B, flange (138) is formed about outer peripheral edge (121) of outer rim portion (120). Flange (138) and outer peripheral edge (121) are configured such that flange (138) rests on the outer rim of immersion cooling tank (130). As depicted in FIG. 3B, all or some portion of condensing device (101) may extend into the opening of immersion cooling tank (130). Optionally, condensing device (101) may be adapted such that coils (118) remain above the opening of immersion cooling tank (130).

Referring to FIG. 3C, flange (137) that is formed at the opening of outer rim portion (120). Flange (137) may be configured such that flange (137) rests atop the outer rim of immersion cooling tank (130). As shown in FIG. 3C, condensing device (101) is disposed substantially out of and above immersion cooling tank (130) and may be configured to partially or completely cover the opening in immersion cooling tank (130). Optionally, condensing device (101) may be adapted such that some of coils (118) extend into the opening of immersion cooling tank (130).

FIG. 3D depicts outer rim portion (120) of condensing device that may include chamfered edge (136). Chamfered edge (136) may be configured, such that all or some portion of chamfered portion (136) fits within the opening of immersion cooling tank (130). In some embodiments, the meshing of chamfered portion (136) and immersion cooling tank (130) may be adapted such that condensing device (101) remains above and completely outside of immersion cooling tank (130). Alternatively, condensing device (101) having chamfered edge (136) may be configured so that a few of coils (118) extend into the immersion cooling tank when chamfered edge (136) is inserted into immersion cooling tank (130). Advantageously, condensing device (101) may fully (e.g., so as to seal) or partially cover the opening of immersion cooling tank (130). The deployment of condenser (101) and its coils (118) depends on the immersion cooling tank used and the objects being exchanged.

In some embodiments, as shown in FIGS. 4-7B, an attaching system may include position locks (131) that are disposed in sliding tracks (132) formed in outer rim portion (120). For the purpose of illustration, rather than limitation, attaching system may include a plurality of (e.g., four) translatable position locks (131) that are configured with notched end (131n) for the purpose of releasably securing position locks (131) and condensing device (101) to flange (133) formed about the outer rim at the opening of immersion cooling tank (130). As shown in FIG. 6, position locks (131) are slidingly attached to outer rim portion (120) at sliding tracks (132). In operation, after condensing device (101) has been lowered into immersion cooling tank (130), position locks (131) may be (e.g., manually or automatically) translated towards flange (133), such that notched (131n) catches the flange (133), preventing removal or further movement of condensing device (101). As discussed above, the movement of the condenser may result in binding of the condenser with the tank opening, and further interfere with a seal formed by the outer portion of the condenser and tank opening to further minimize dielectric vapor loss.

Figure 5:
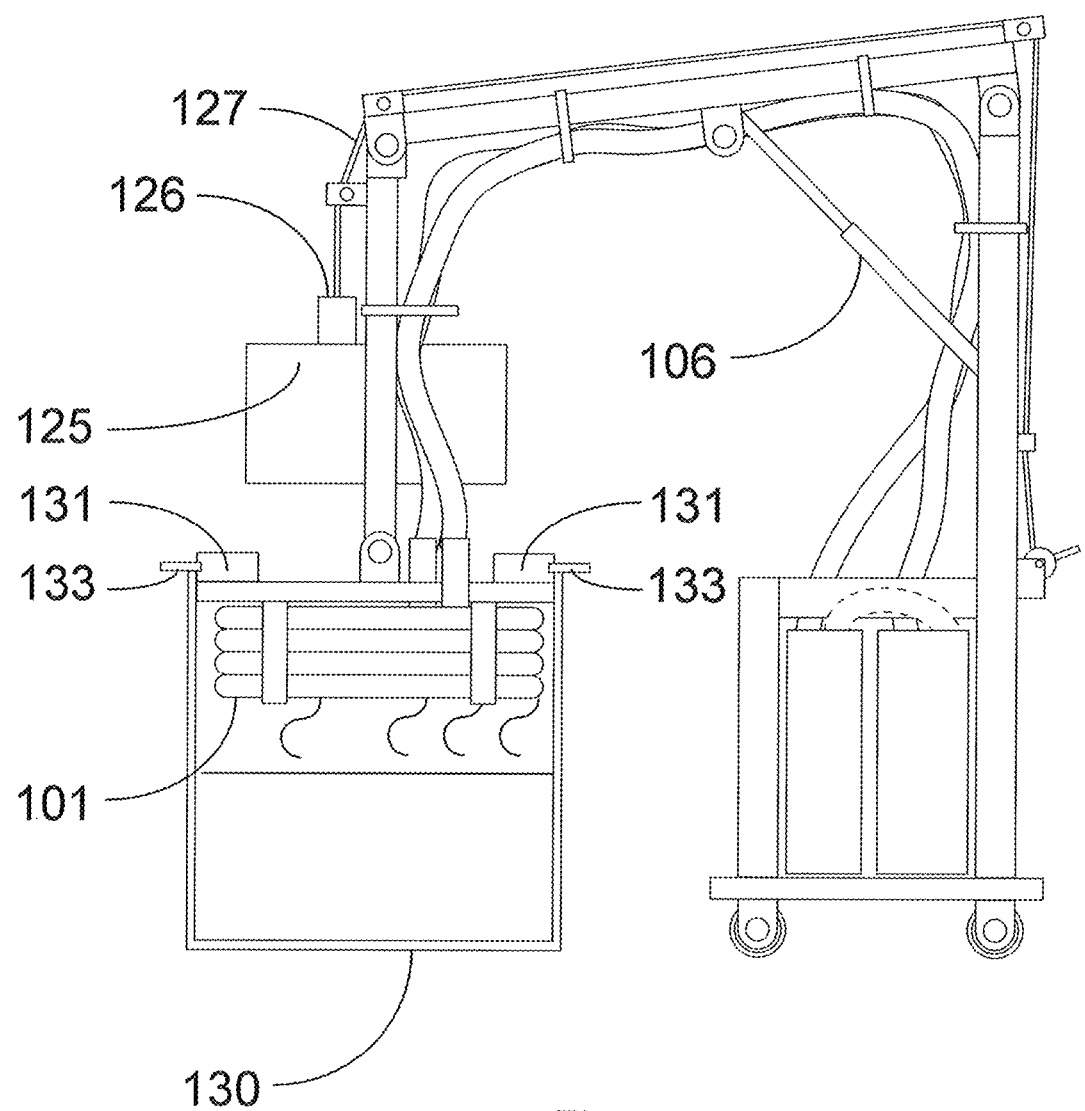
FIG. 5 is a side view of the device depicted in FIG. 1A, in which the condensing device is positioned within the immersion cooling tank and an object connected to the item lock has been raised out of the immersion cooling tank, in accordance with some embodiments of the present invention.

Referring to FIG. 5 and FIG. 6, device (100) may also include item lock (126) that is releasably attachable to object (125) immersed in heat transfer fluid bath (135) for the purpose of removing object (125) from and re-installing object (125) into heat transfer fluid bath (135). Item lock (126) may include any kind of a device (e.g., mechanical, magnetic, electrical, or a combination thereof) suitable for gripping, raising, holding, and lowering object (125). Exemplary item locks (126), for the purpose of illustration rather than limitation, may include a magnet, a claw or gripper (126) (FIG. 5), clevis (126"), a pair of grippers, a collet insert, a hook (126') or eyebolt (134).

Figure 7A:
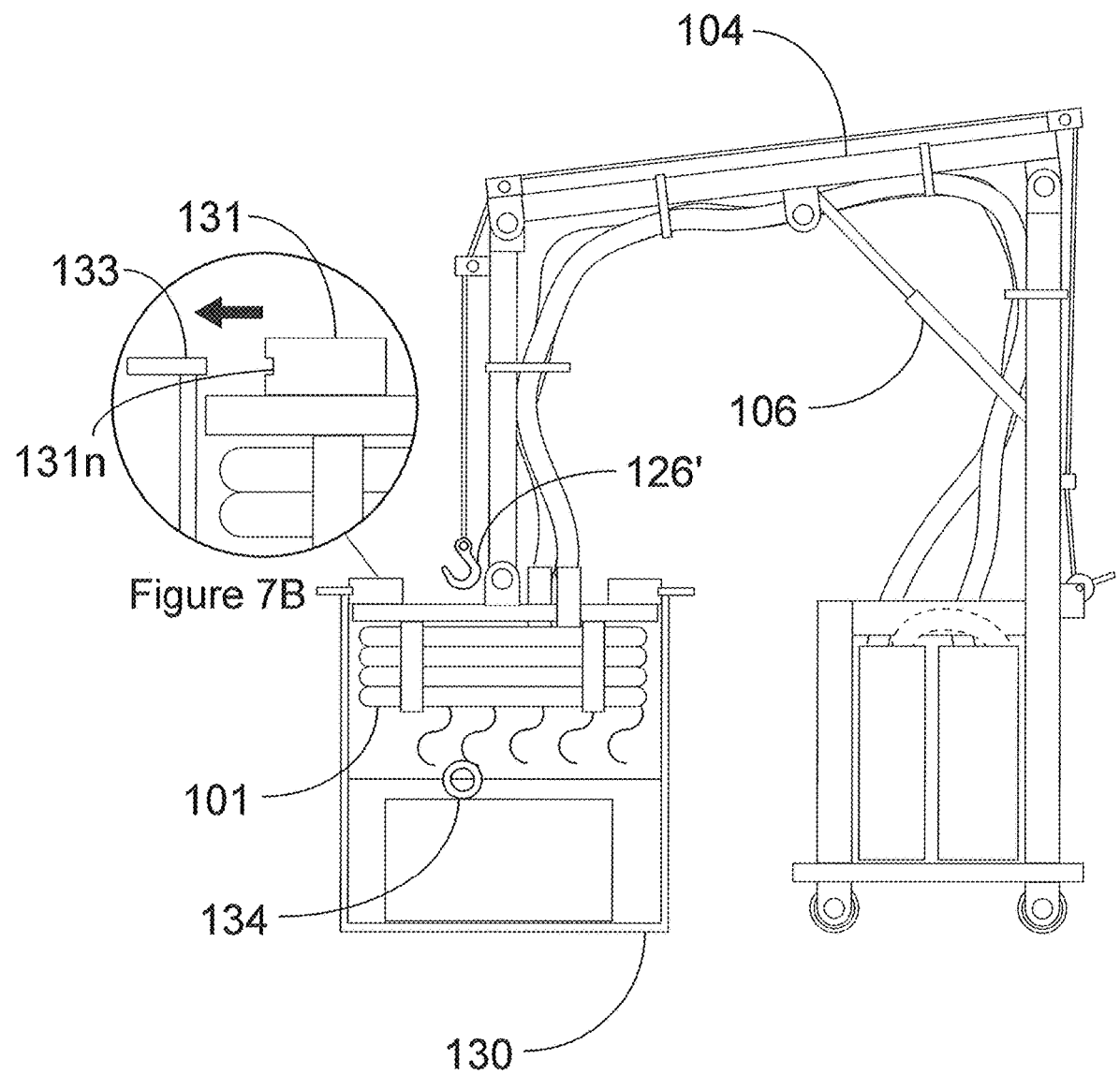
FIG. 7A depicts a side view of the device of FIG. 6, in which the condensing device has been lowered into the immersion cooling tank, in accordance with some embodiments of the present invention.

Referring to FIG. 6 and FIG. 7A, item lock (126) may be mechanically coupled to an apparatus for adjusting the height, (i.e., selectively raising and lowering), item lock (126). For example, a hoisting or pulley system may include hoist wire (127), winch (128), and plurality of sheaves or pulleys (129). Referring to FIG. 5, item lock (126) may be attached to a distal end of hoist wire (127), while winch (128) may be attached to a proximal end of hoist wire (127). Between the distal and proximal ends, the hoist wire (127) may be routed through a plurality of sheaves or pulleys (129) that provide, inter alia, mechanical advantage to the hoisting/pulley system. Winch (128) may be manually- and/or automatically operated to adjust the height of item lock (126). Item lock (126) may have a self-aligning capability to detect and clutch and/or grip object (125). Alternatively, capturing and gripping of object (125) with item lock (126) may be implemented manually by an operator. For example, item lock (126) may be lowered manually but a winch motor may engage to raise item lock (126) once it is attached object (125) in immersion cooling tank (130).

As depicted in FIGS. 6 through 9, the item lock may be configured as hook (126') that is configured to mesh or lock with eyebolt (134), lifting lug, and the like that is fixedly attached to object (125). In operation, hook (126') can be lowered (e.g., manually or automatically) through opening (119) in condensing device (101) into heat transfer fluid (135) until hook (126') catches eyebolt (134), lifting lug, and the like. Once hook (126') is coupled to eyebolt (134), lifting lug, and the like, hook (126') and object (125) may be raised out of heat transfer fluid (135), through the opening (119) in condensing device (101) to a desired elevation above immersion cooling tank (130). Once heat transfer fluid (135) has been allowed to drain from the surface of the removed object (125), object (125) may be removed from hook (126').

Figure 10:
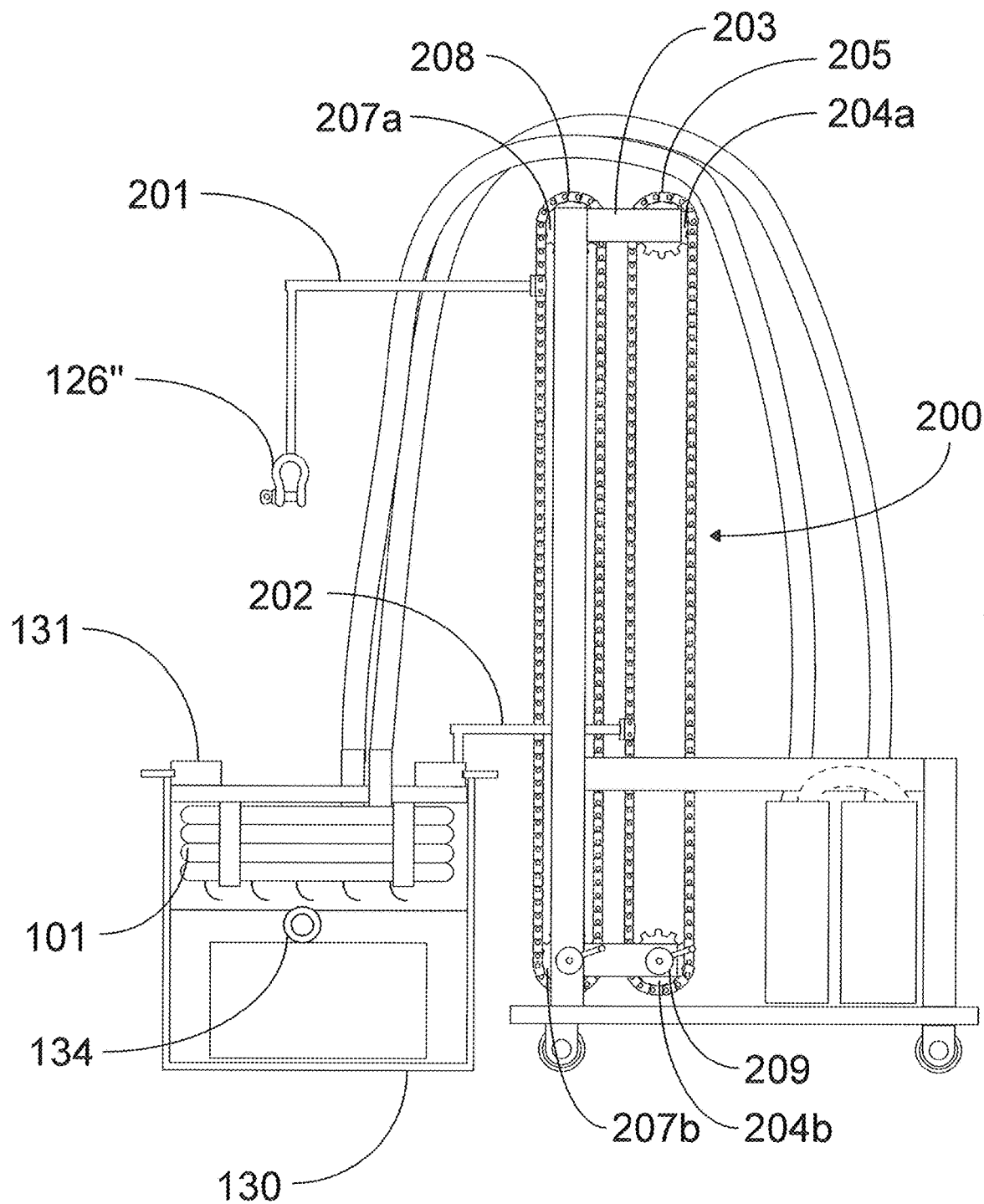
FIG. 10 depicts a side view of a third embodiment of a device for hot swapping an object that includes a clevis as the item lock and a chain hoist for adjusting the height of the object to be removed, in accordance with some embodiments of the present invention.
Figure 11:
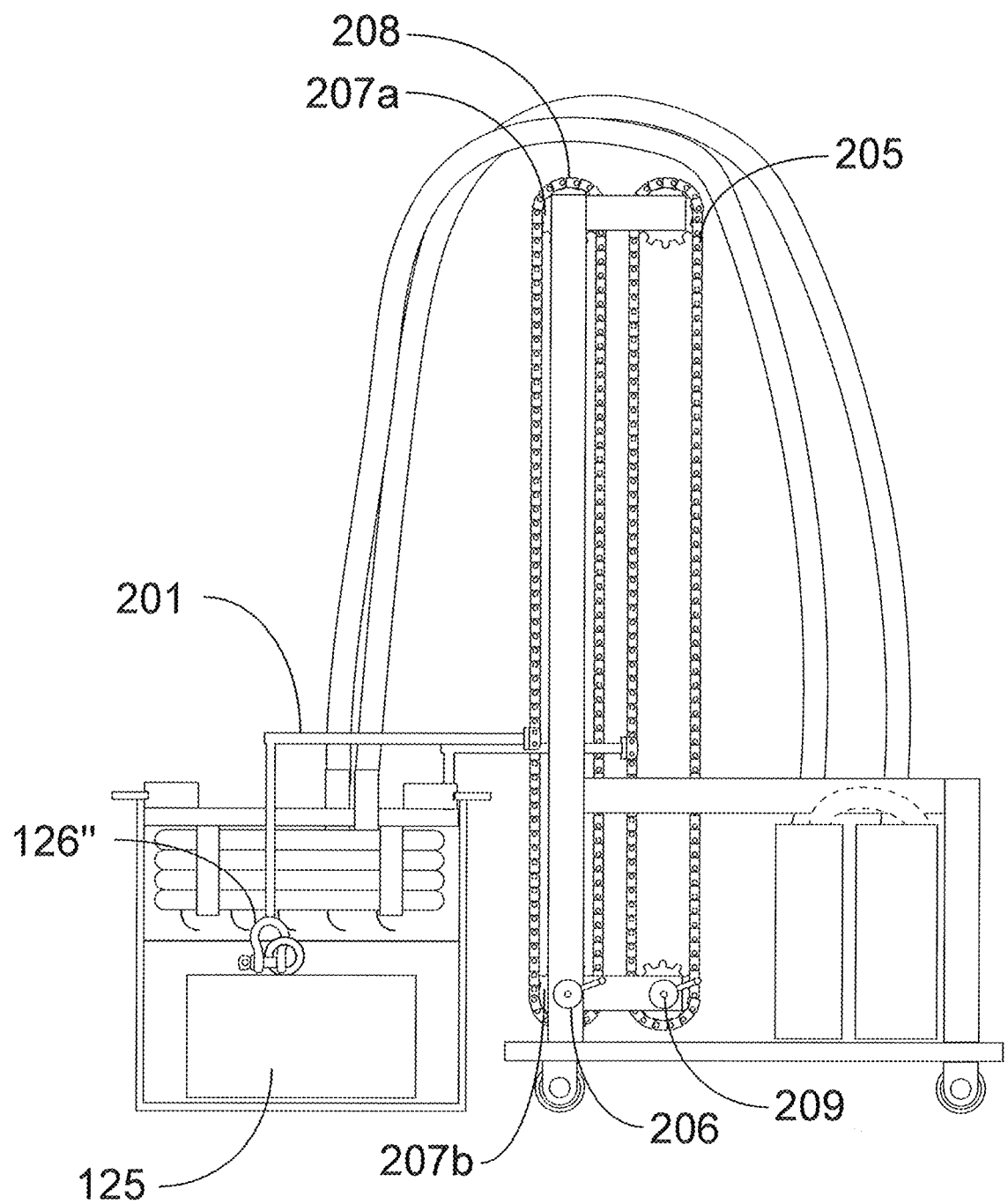
FIG. 11 depicts the device shown in FIG. 10, in which the clevis is coupled to a lifting lug on the object to be removed from the immersion cooling tank, in accordance with some embodiments of the present invention.
Figure 12:
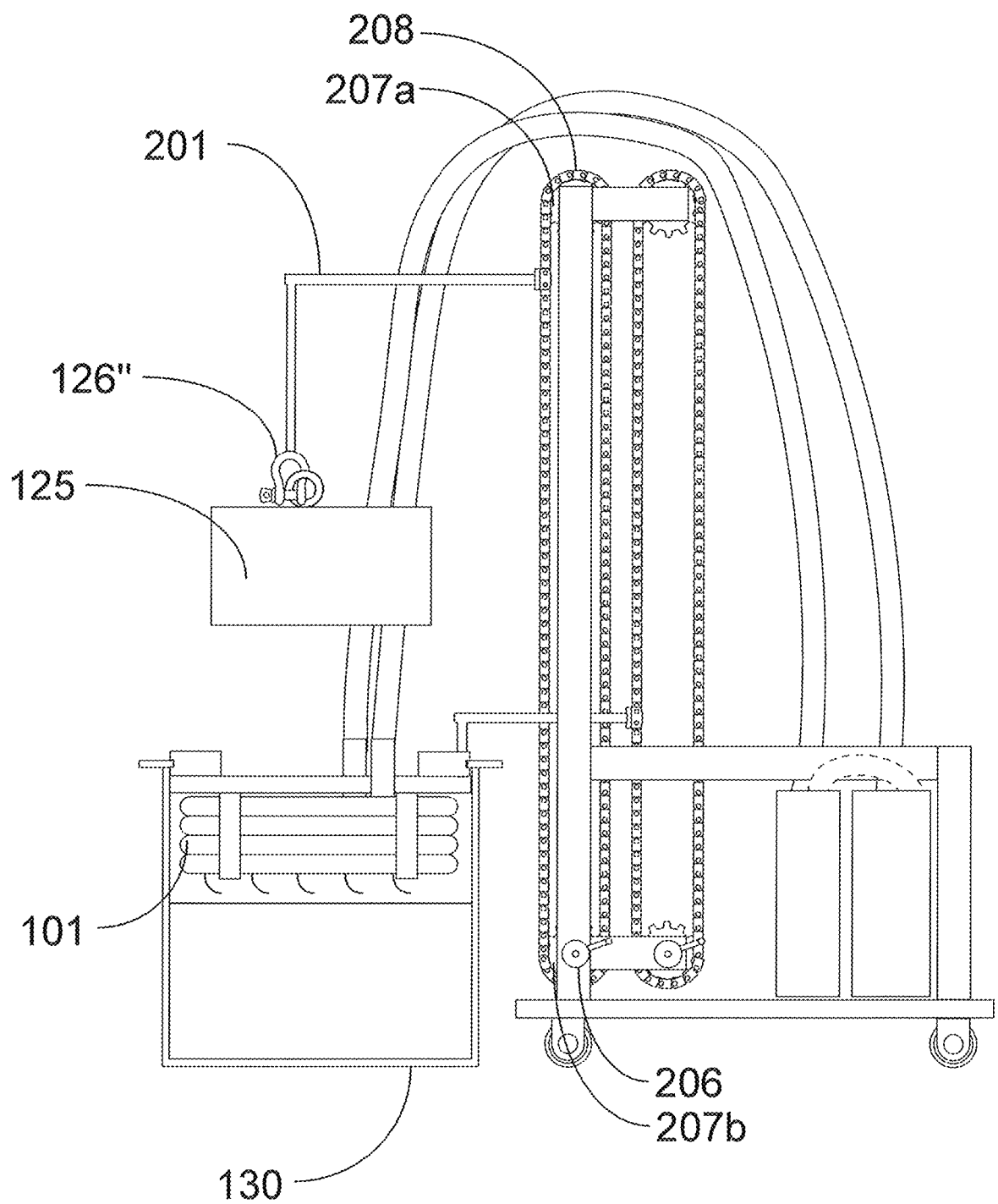
FIG. 12 depicts the device shown in FIG. 10, in which the clevis and object have been raised from the immersion cooling tank, in accordance with some embodiments of the present invention.

As depicted in FIGS. 10 through 12, the item lock may be configured as clevis (126") that is configured to mesh or lock with eyebolt (134), lifting lug, and the like that is fixedly attached to object (125). In operation, clevis (126") (with its clevis pin removed) may be lowered (e.g., manually or automatically) through opening (119) in condensing device (101) into heat transfer fluid (135) until clevis (126") is proximate eyebolt (134), lifting lug, and the like. Using a clevis pin, i.e., by inserting the clevis pin in the openings provided in the clevis (126") therefor, clevis (126") may then be coupled (e.g., manually or mechanically) to eyebolt (134), lifting lug, and the like. The clevis (126") and object (125) may then be raised out of heat transfer fluid (135), through opening (119) in condensing device (101) to a desired elevation above immersion cooling tank (130).

Continuing to refer to FIGS. 10 through 12, instead of using a hoisting or pulley system, chain hoist/forklift (200) may be used for selectively adjusting the height and the location of condensing device (101), as well for selectively adjusting the height and location of item lock (126) and object (125) to be removed from/installed in immersion cooling tank (130). In some implementations, for the purpose of illustration rather than limitation, chain hoist/forklift (200) may include a plurality of (e.g., two) roller chain systems or assemblies having plurality of gear-wheels ((204a, 204b), (207a, 207b)), roller chains (205, 208), and winches (206, 209) that are configured to raise and lower condensing device (101), item lock (126"), and/or object (125). In some implementations, roller chain (208) of first roller chain assembly may be operatively disposed about first (e.g., an upper) gear wheel (207a) and second (e.g., lower) gear wheel (207b). Winch (206), mechanically coupled to one of gear wheels (207a, 207b), e.g., to second (e.g., lower) gear wheel (207b), may be configured to drive second gear wheel (207b), causing roller chain (208) to rotate about gear wheel (207a, 207b). Roller chain (205) of the second roller chain assembly may be operatively disposed about first (e.g., an upper) gear wheel (204a) and second (e.g., lower) gear wheel (204b). Winch (209), mechanically coupled to one of the gear wheels (204a, 204b), e.g., to second (e.g., lower) gear wheel (204b), may be configured to drive second gear wheel (204b), causing roller chain (205) to rotate about gear wheel (204a, 204b). First (e.g., upper) gear wheel (204a, 207a) may be an idle wheel or, optionally, may also be mechanically coupled to a winch.

Continuing to refer to FIGS. 10 through 12, first mounting bracket (201) may be coupled to item lock (126") and mechanically connected to first roller chain (208), while second mounting bracket (202) may be coupled condensing device (101) and mechanically connected to second roller chain (205). Each of first roller chain (208) and second roller chain (205) may be independently and automatically operated to raise/lower item lock (126") or condensing device (101), respectively. For example, first winch (206) and first plurality (e.g., set or pair) of gear wheels (207a, 207b) may be adapted to move first roller chain (208), such that the movement of first roller chain (208) adjusts the height of item lock (126"). Second winch (209) and second plurality (e.g., set or pair) of gear wheels (204a, 204b) may be adapted to move second roller chain (205), such that the movement adjusts the height of condensing device (101).

FIGS. 10 through 12 show an embodiment of chain hoist/forklift (200) in which first roller chain (208) and second roller chain (205) appear to be aligned, one substantially behind the other, this is done for the purpose of illustration rather than limitation. Indeed, in some implementations, first roller chain (208) and second roller chain (205) may be configured in a side-by-side arrangement. When first roller chain (208) and second roller chain (205) are substantially aligned as shown in FIGS. 10 through 12, however, first roller chain (208) and second roller chain (205) should be offset, so that the paths of first mounting bracket (201) and second mounting bracket (202) do not interfere with one another. Referring to FIG. 10, support structure (203) may be used to support the assembly for second roller chain (205) and to connect the assembly for second roller chain (205) to the assembly for first roller chain (208). Alternatively, instead of using chain hoist/forklift (200), a belt drive drive/forklift may be used in its place, positioned and operated in a similar manner.

Figure 13:
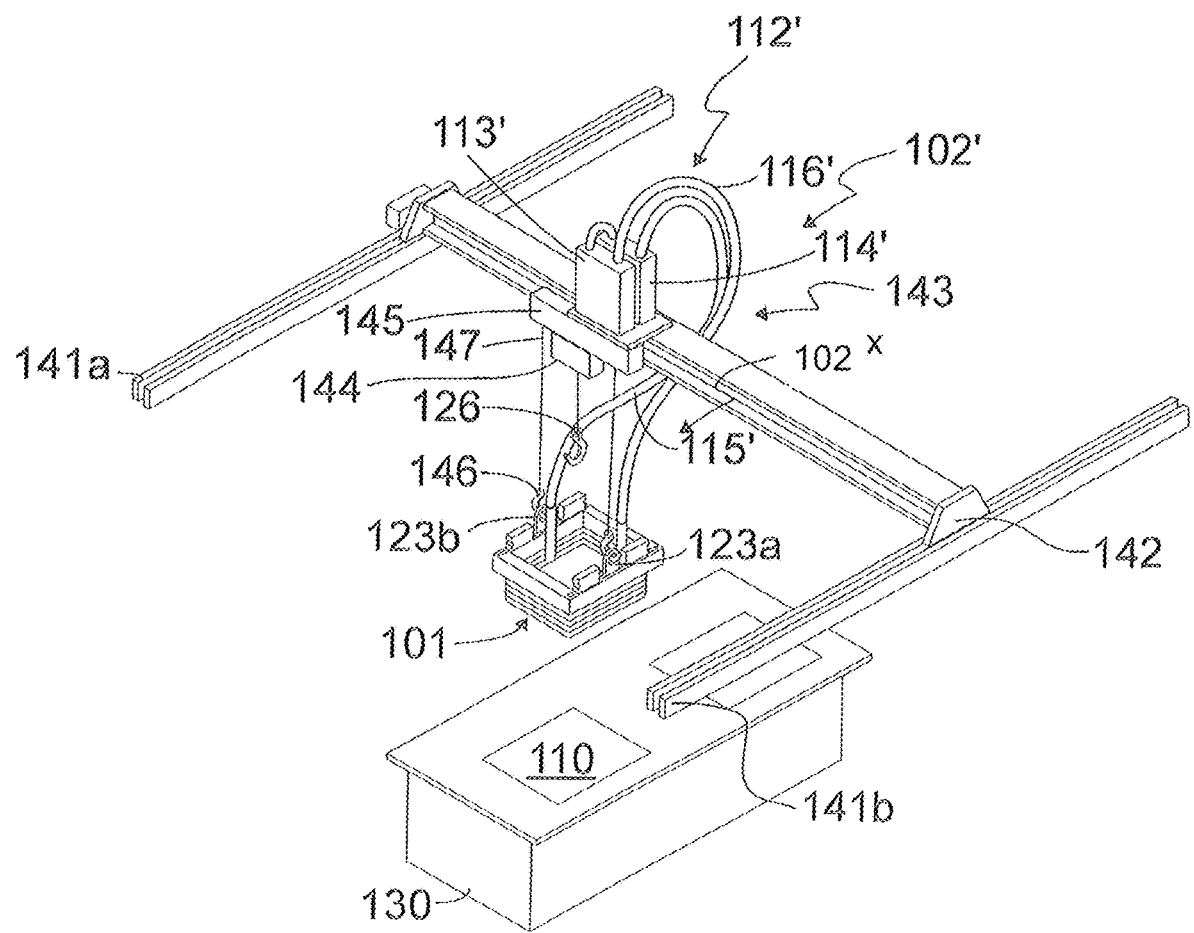
FIG. 13 depicts an isometric view of a fourth embodiment of a device for hot swapping an object that includes a hook as the item lock and that transports the condensing device along rails mounted to the ceiling, in accordance with some embodiments of the present invention.

Referring to FIG. 13, instead of using mobile crane ($102^x$) to selectively adjust the height and location of condensing device (101), the apparatus for selectively adjusting the height and location of condensing device (101) may comprise an overhead (e.g., gantry, monorail, and so forth) crane (102'). As shown in FIG. 13, overhead crane (102') may include a pair of tracks (141a, 141b) that are fixedly attached to a structure that is capable of supporting the weight of the crane (102'), condensing device (101), and object(s) (125) contained in immersion cooling tank (130). A selectively movable, motorized element (142) (e.g., a cross beam, a gantry girder, and the like) (hereinafter referred to as the "cross beam") may be operatively disposed on each of tracks (141a, 141b), such that motorized element (142) may translate in a first (e.g., a y-axis) direction that is parallel to the longitudinal axes of tracks (141a, 141b). A second, selectively movable, motorized element (143) may be operatively disposed on cross beam (152), such that second motorized element (143) may translate in a second (e.g., an x-axis) direction that is perpendicular to the longitudinal axes of tracks (141a, 141b).

Figure 13A:
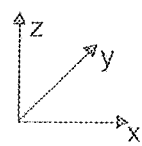
FIG. 13A depicts the direction of the X-axis, Y-axis and Z-axis for figures described as isometric drawing sheets.

Continuing to refer to FIG. 13, second motorized element (143) may be further configured to support first winch assembly (144), second winch assembly (145), and coolant system (112'). First winch assembly (144) may be operatively coupled to and configured for selectively adjusting the height of unit lock (126). The second winch assembly (145) may be operatively coupled to one or more attaching device (146) (e.g., hooks, clevises, and the like) that are adapted to be removably attachable to connection device (123a, 123b) fixedly attached to condensing device (101). In some embodiments, second winch assembly (145) may selectively adjust the height of attaching device (146) via one or more cables (147). Coolant system (112') may include chiller pump (114') and coolant container (113') that are configured to provide fluid coolant serially through coolant delivery conduit (115'), condensing device (101), coolant return conduit (116') and coolant container (113'). Chiller pump (114') and coolant container (113') may be supported along cross beam (152) of motorized element (143). FIG. 13A depicts the xyz plan for isometric drawing sheets of the present invention. X plane is defined along the horizontal. Y plane is defined as along the vertical. And Z plane is defined as perpendicular to the X and Y planes. For example, the X-Y plane defines the surface area of the immersion tank opening.

Referring to FIG. 14, the apparatus for selectively adjusting the height and location of a condensing device (101) may comprise bridge-type crane (102"). Bridge-type crane (102") may include pair of tracks (151a, 151b). A pair of selectively movable, motorized elements (154a, 154b) (e.g., columns) may be operatively disposed on each of tracks (151a, 151b), such that motorized element (154a, 154b) may translate in a first (e.g., a y-axis) direction that is parallel to the longitudinal axes of tracks (151a, 151b). A selectively movable, motorized element (152) (e.g., a cross beam a gantry girder, and the like) (hereinafter referred to as the "cross beam") may be operatively disposed on each of columns (154a, 154b). Second, selectively movable, motorized element assembly (153) may be operatively disposed on cross beam (152), such that second motorized element assembly (153) may translate in a second (e.g., an x-axis) direction that is perpendicular to the longitudinal axes of tracks (151a, 151b). Second motorized element assembly (153) may be further configured to support first winch assembly (144), second winch assembly (145), and the coolant system, as previously described. As shown in FIG. 14, condenser (101) is moved perpendicular to the longitudinal direction of tracks (151a, 151b) to position the condenser above tank opening (110). As shown in FIG. 14, immersion tank openings may be off set from one another depending on how the tanks are configured for the objects to be cooled.

Figure 15:
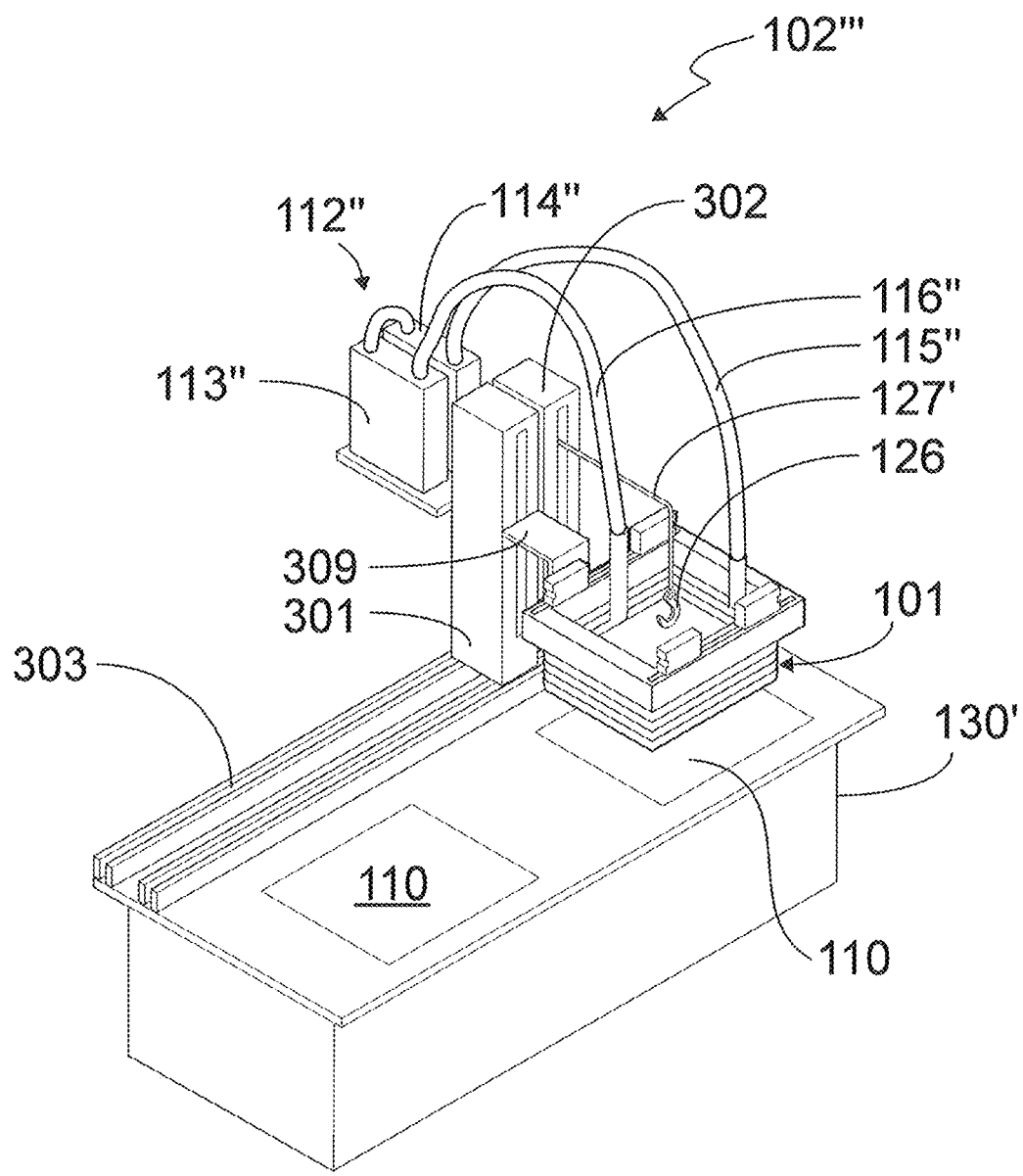
FIG. 15 depicts an isometric view of a sixth embodiment of a device for hot swapping an object that includes a hook as the item lock and that transports the condensing device along rails mounted to the immersion cooling tank, in accordance with some embodiments of the present invention.

As shown in FIG. 15, apparatus (102''') for selectively adjusting the height and location of condensing device (101) comprises one or more lifting towers (301, 302) that are configured to be movable (e.g., in a first (e.g., y-axis) direction) along fixed rails (303). In some implementations, the fixed rails (303) may be immobile and fixedly attached to (e.g., mounted on) immersion cooling tank (130'). Although fixed rails (303) (in FIG. 15) only allow lifting towers (301, 302) to move in a single (e.g., y-axis) direction, this is done for the purpose of illustration rather than limitation. Those of ordinary skill in the art can appreciate fixed rails (303) could be configured to be movable in the x-axis direction. Advantageously, for immersion cooling tanks (130') having multiple openings (110) that are linearly aligned, such design enables condensing device (101) to serve the multiple openings in immersion cooling tank (130'). Objects contained in opening (110a) can be serviced before the objects via opening (110b) are serviced next. Although not shown, it is known in the prior art that a lid would cover the opening until service is required. Dielectric fluid boils when heated, so the lid is required for safety reasons, as well as, preventing vapor loss.

Still referring to FIG. 15, first lifting tower (301) may be configured to selectively adjust the height of condensing device (101), while second lifting tower (302) may be configured to adjust the height of unit lock (e.g., hook) (126), e.g., using an extension rod (127'). For example, first lifting tower (301) may include arm (309) that is removably attachable to condensing device (101). A hoisting or elevating system operatively disposed within first lifting tower (301) is configured to raise and lower arm (309), which selectively adjusts the height or elevation of condensing device (101). In like manner, a hoisting or elevating system operatively disposed within second lifting tower (302) is configured to raise and lower the angled extension rod (127'). Although angled extension rod (127') is shown in FIG. 15, this is done for the purpose of illustration rather than limitation. Those of ordinary skill in the art can appreciate that the angled extension (127') may be replaced with alternative raising devices (e.g., a flexible element, a chain, a rope, a hoist wire, and combinations thereof), as well as a straight extension rod.

Still referring to FIG. 15, coolant system (112") for the embodied apparatus (102''') may be supported by and disposed behind one or more lifting towers (301, 302). In some embodiments, coolant system (112") may comprise chiller pump (114") and coolant container (113") that are configured to provide fluid coolant from chiller pump (114") through coolant delivery conduit (115"), condensing device (101), coolant return conduit (116"), and coolant container (113"), thereby chilling coils (118) that condense vapor (140) (refer to FIG. 1A), which returns via opening (110) of tank (130').

Figure 16A:
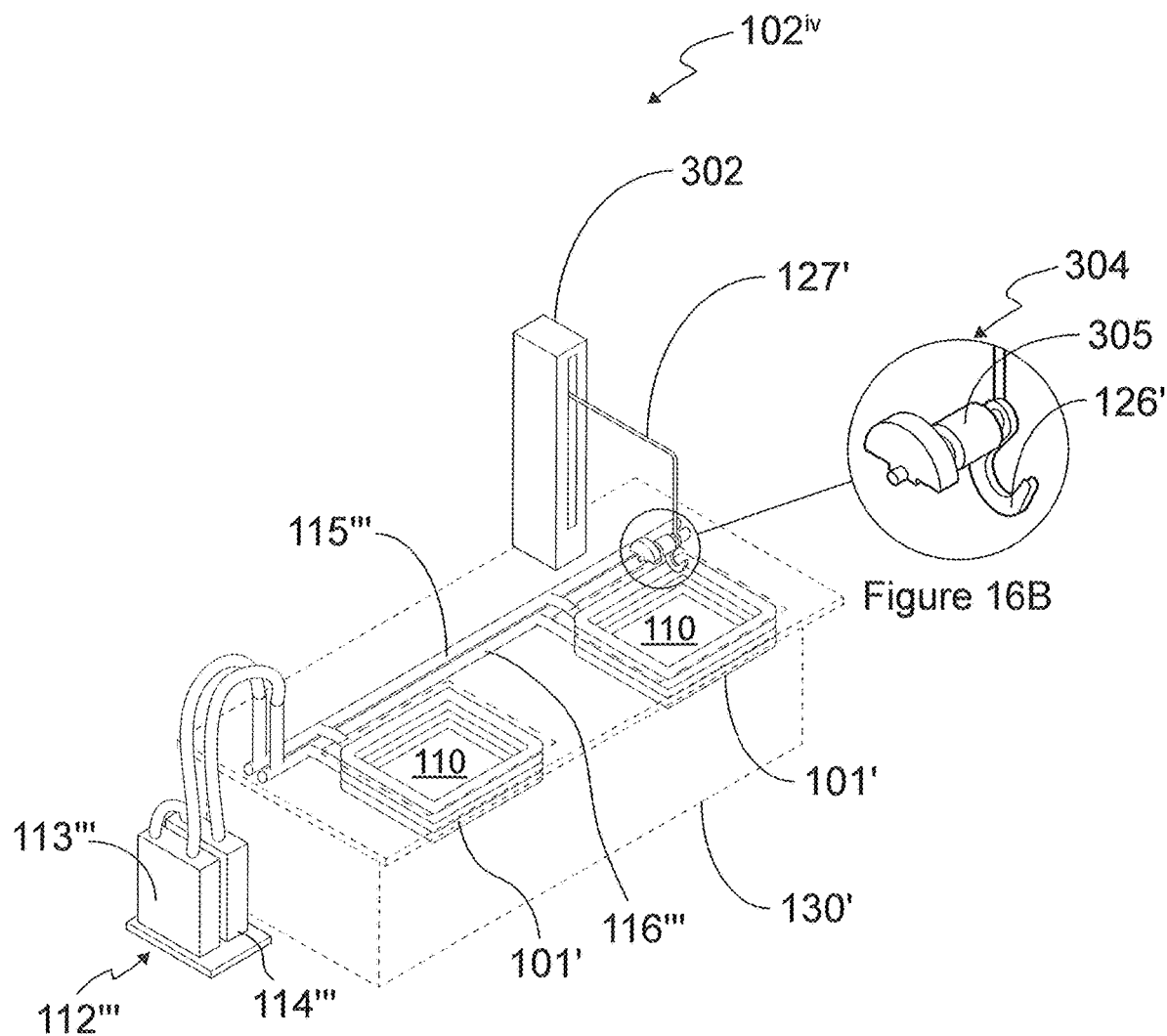
FIG. 16A depicts an isometric view of a seventh embodiment of a device for hot swapping an object that includes a hook coupled to a vibratory motor as the item lock and a condensing device that is mounted to the interior of the immersion cooling tank, in accordance with some embodiments of the present invention.
Figure 17A:
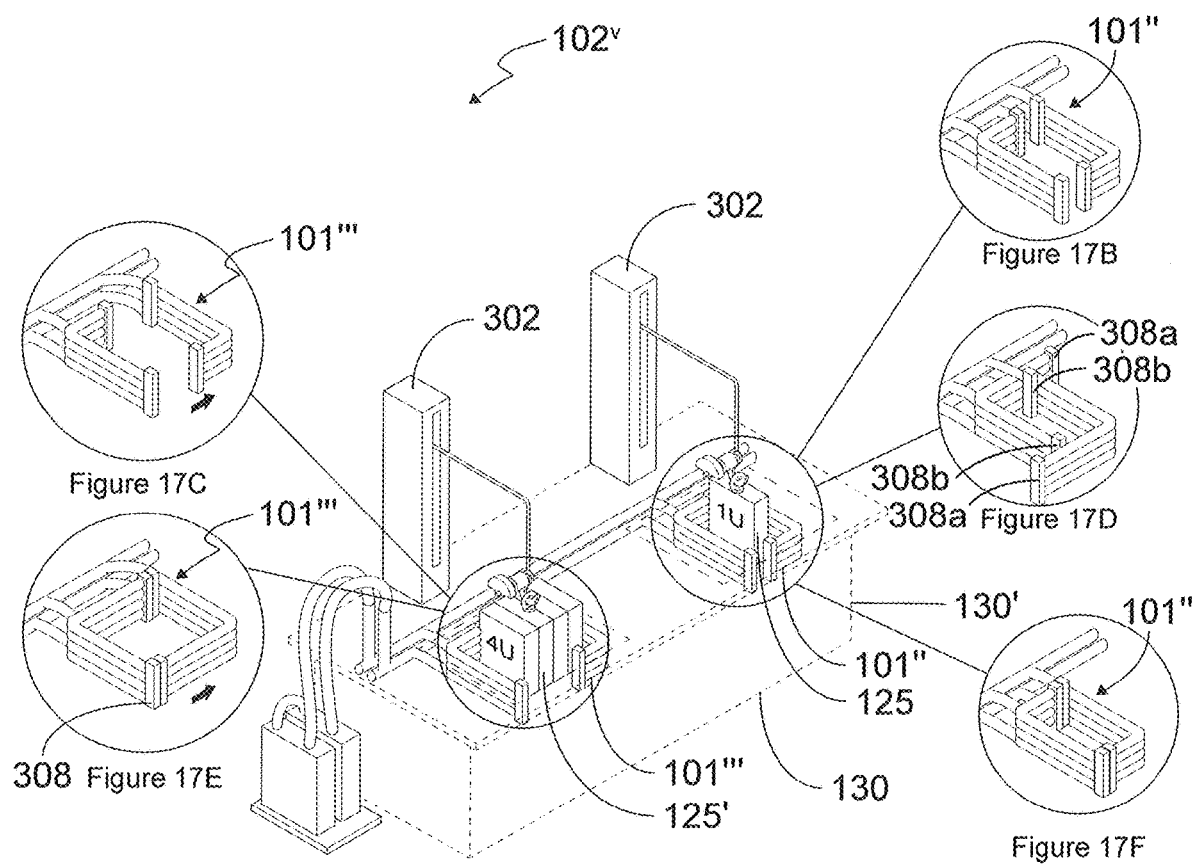
FIG. 17A depicts an isometric view of an eighth embodiment of a device for hot swapping an object that includes an adjustable condensing device having an adjustable opening size, in accordance with some embodiments of the present invention.

As shown in FIG. 16A, condensing devices (101') may be removably attached or permanently attached to immersion cooling tank (130') within corresponding opening (110). Immersion cooling system (102$^x$) for selectively adjusting the height of item lock (304) comprises lifting tower (302) installed on immersion cooling tank (130'), proximate the opening in immersion cooling tank (130'), in combination with an angled extension rod (127'). For example, condensing device (101') may be mounted inside immersion cooling tank (130'), e.g., using a set of mounting brackets. Alternatively, condensing device (101') may be welded to the internal wall of immersion cooling tank (130'). In some embodiments, immersion cooling tank (130') may be configured to include a mounting area for installing lifting tower (302). Lifting tower (302), in turn, may be fixedly or movably installed. If fixedly installed, lifting tower (302) may be configured to include tank opening (110) within reach of the lifting tower, and every opening may be equipped with its own lifting tower (e.g., as shown in FIG. 17A). If movably installed, lifting tower (302) may be placed on rails (303) (refer to FIG. 15), so that one or more lifting tower (302, 302) can extract objects from any of the plural openings of immersion cooling tank (130').

As depicted in FIG. 16B, item lock (304) may comprise vibration motor (305) movably or rigidly attached to hook (126'). In operation, vibration motor (305) produces vibration, for example, by rotating an unbalanced rotor. Vibration motor (305) is turned ON before or during lifting of object (125) to assist the draining of dielectric liquid from object (125) back into immersion cooling tank (130'). Although an unbalanced rotor-type vibration motor (305) is shown in FIG. 16B, this is done for the purpose of illustration rather than illustration. Indeed, those of ordinary skill in the art can appreciate that any device that is capable of producing vibrations (e.g., a piezoelectric device, an electro-magnetic device, and the like) may be used to promote drainage of dielectric fluid.

Continuing to refer to FIG. 16A, immersion cooling system ($102^{iv}$), comprises coolant system (112''') position at one end of immersion cooling tank (130'). Coolant system (112''') comprises chiller pump (114''') and a coolant container (113''') that are configured to provide fluid coolant from chiller pump (114''') through coolant delivery conduit (115''') to one or more condensing devices (101'), coolant return conduit (116'''), and coolant container (113'''). Since condensing devices (101') are removably attached to immersion cooling tank (130'), all or some portions of coolant delivery conduit (115''') and coolant return conduit (116''') may also be removably or permanently attached to immersion cooling tank (130'). Moreover, the coolant delivery conduits (115''') to the individual condensing devices (101') may be fluidically coupled to each other in series and coolant return conduit (116''') from the individual condensing devices (101') may be fluidically coupled to each other in series.

FIGS. 17A through 17G depict embodiments to immersion cooling system ($102^v$) shown in FIG. 16A for condensing device (101') having a fixed size and dimensions has been described for use. However, in FIGS. 17A through 17G, tank opening can vary in size, or objects (125) may vary in size. For example, if electronic device (125) includes a single rack unit (i.e., "1 U"), or multiple object size (e.g. "4 U"), then opening (110) (refer to FIG. 1A) needs to vary. As depicted in FIG. 17B through FIG. 17F, the condenser can be configured to accommodate different objects (125), as described below. For example, FIG. 17B and FIG. 17E depicts condenser (101'') is sized for a "1 U" object (125). Likewise, condenser (101''') is sized for "4 U" object size, in FIG. 17C and FIG. 17E. However, condensers (101, 101'', 101''') are costly. Moreover, switching between condensers sizes is time consuming for immersion cooling systems ($102$-$102^{vi}$).

Before continuing with FIG. 17B through FIG. 17E, FIG. 17G depicts variable sized cover sheets (306, 306') placed about tank openings (307, 307'), the cover sheets may be selectively altered (e.g., manually or automatically) to correspond to an opening size at or near its minimum opening size of the condenser, or object (125) being serviced with the condenser.

Referring to FIGS. 17B through 17G, the coolant lines at their designed lengths when condensing device is at minimum opening size. Thus, when the coolant lines are flexibly extended, condensing device would be at maximum opening size. Alternatively, the coolant lines could also at its design length when the condensing device is at maximum opening, then the coolant line could be curled into roll(s) when the condensing device is at minimum opening size. Alternatively, if another electronic device (125') includes 4 rack units ("4 U"), the size of the opening of condensing device (101''') may be selectively adjusted (e.g., manually or automatically) to correspond to an opening size that is at or near its maximum opening size (FIG. 17C).

As depicted in FIGS. 17B and 17C, condensers (101'', 101''') are sized between minimum and maximum tank opening sizes, as depicted in FIGS. 17B and 17C, respectively, instead of condensing device (101''') having C-shaped halves with gaps or openings between the ends of the C-shaped halves in its minimum opening configuration (FIG. 17B), in an alternative embodiment, the gaps may be eliminated, such that opposing L-shaped halves touch each other at the maximum opening size (FIG. 17F). Moreover, instead of condensing device (101''') having C-shaped halves with gaps or openings between the ends of the C-shaped halves in its maximum opening configuration (FIG. 17C), in an alternative embodiment, the gaps may be eliminated, such that opposing L-shaped halves touch each other at the maximum opening size (FIG. 17E). In some embodiments, a (e.g., elastic) thermally-conductive material 308 (e.g., thermo-conductive rubber and the like) may be used in instances with condensing devices (101'', 101''') touch each other at both maximum or minimum opening sizes.

As shown in FIG. 17D, for condensing devices (101'') that touch each other at maximum opening, for such condensing device (101'') to be selectively adjusted to correspond to its minimum opening size, one or both of the opposing L-shaped halves of condensing device (101'') must be moved, such that some thermally-conductive elements (308a) protrude past the other thermally-conductive elements (308b). Typically, the coolant lines may comprise flexible hoses (e.g., rubber, plastic, and the like), which are adapted to stretch and deform around the thermally-conductive elements. Alternatively, the distance between the coolant lines supplying the thermally-conductive elements (308b) could be larger than the height of the thermally-conductive elements (308a), so that the thermally-conductive elements (308a) can pass through the thermally-conductive elements (308b) without interference.

Figure 17G:
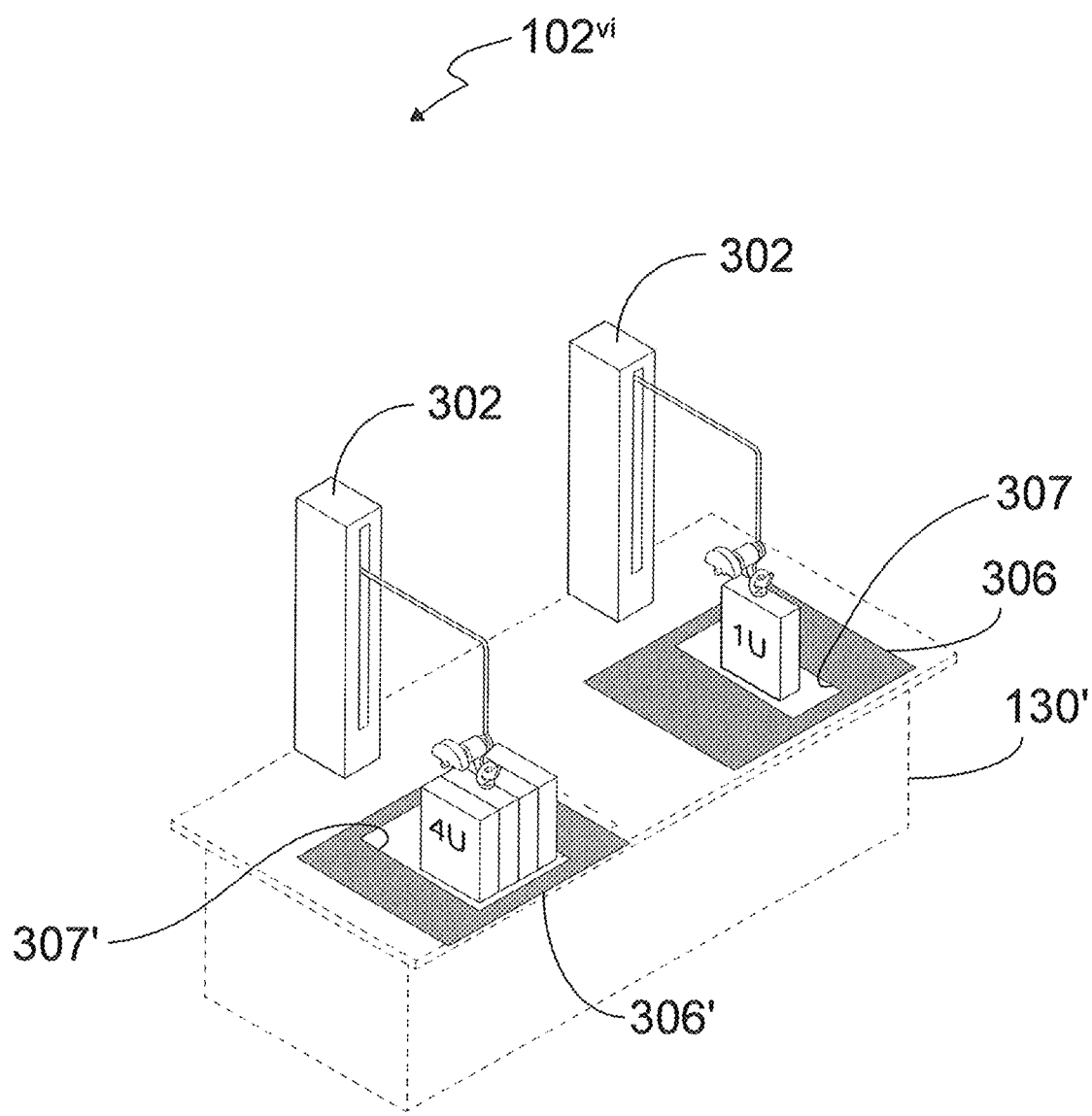
FIG. 17G depicts an isometric view of a ninth embodiment of a device for hot swapping an object that includes opening covers having adjustable opening sizes, in accordance with some embodiments of the present invention.

Referring to FIG. 17G, immersion cooling system ($102^{vi}$) cover sheets (306, 306') may be used to cover an unused portion of an opening in immersion cooling tank (130'), for example, to reduce fluid vapor loss. Advantageously, plurality of covering sheets (306, 306') having variable or fixed size can cover tank openings (307, 307'). Cover sheet (306') having a maximum size covers opening (307') may allow 4 U devices to pass through, while cover sheet (306) having minimum size covers opening (307) may only allow 1 U devices to pass through. Those of ordinary skill in the art can appreciate that the opening size may be selected to allow devices smaller than 1 U and larger than 4 U to pass through them, as well as to allow devices larger than 1 U but smaller than 4 U.

Figure 18A:
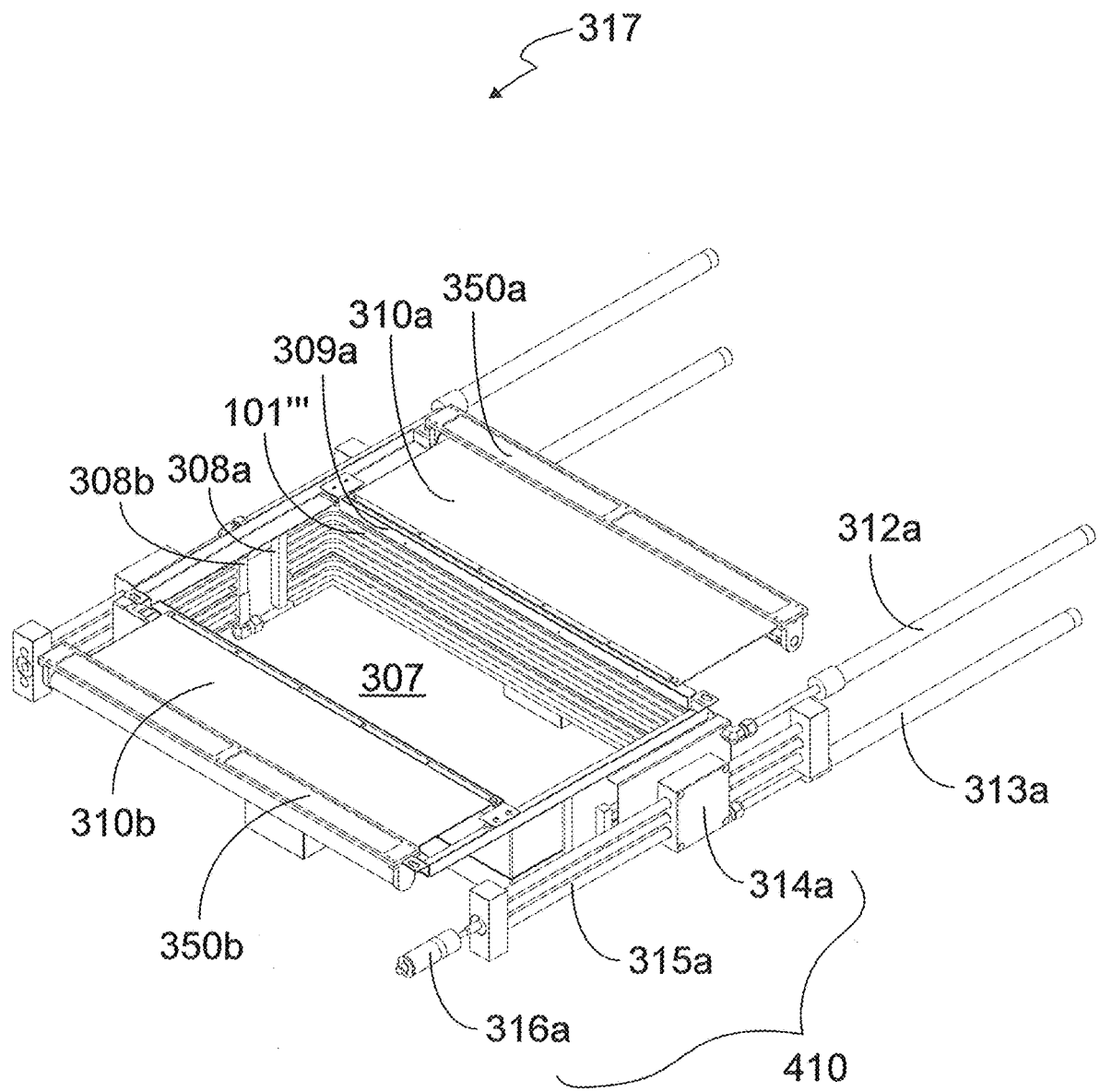
FIG. 18A and FIG. 18B depict isometric views of details of a covering sheet assembly with adjustable sheet covers under computerized motor control.
Figure 18B:
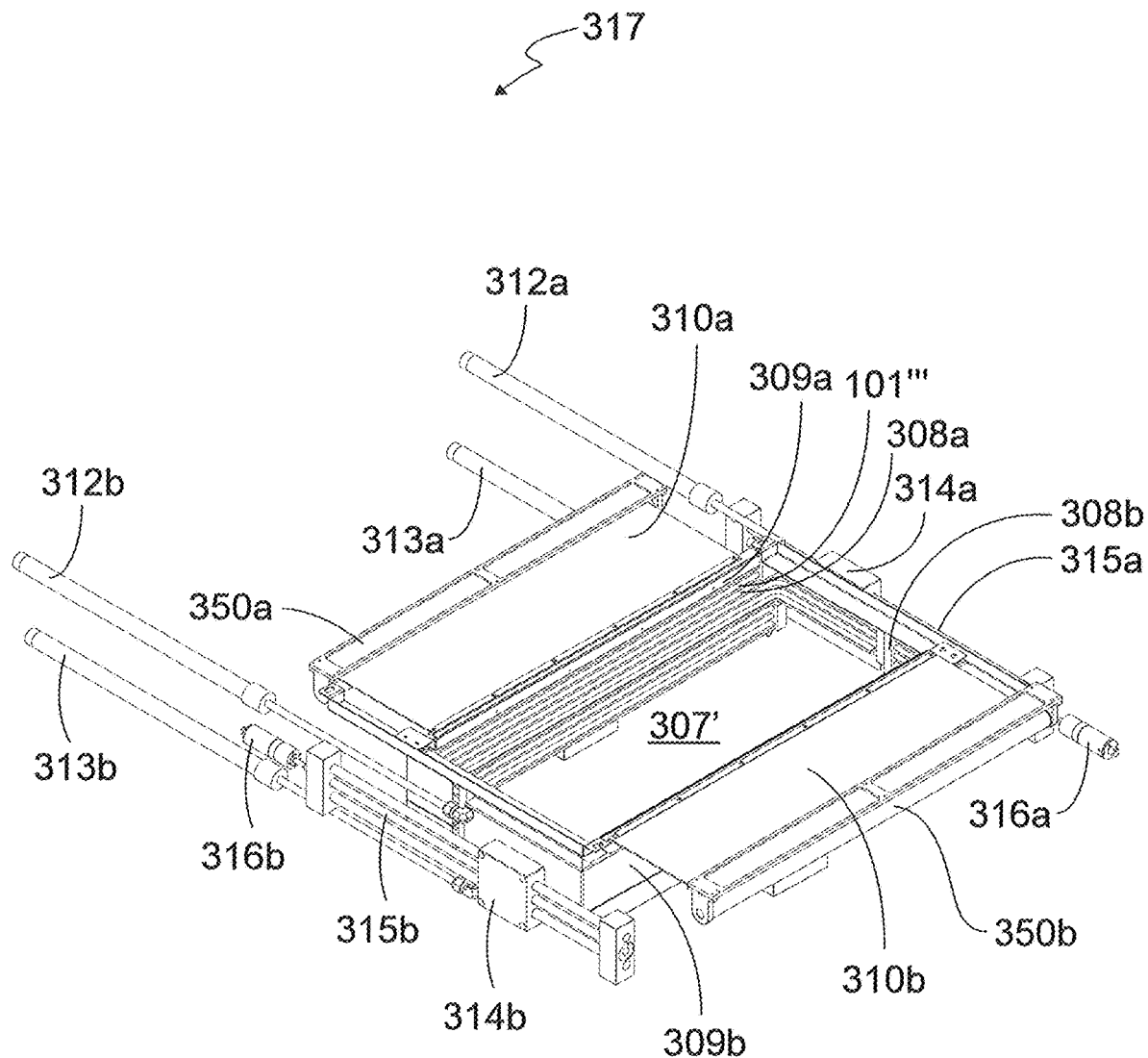
Figure 18C:
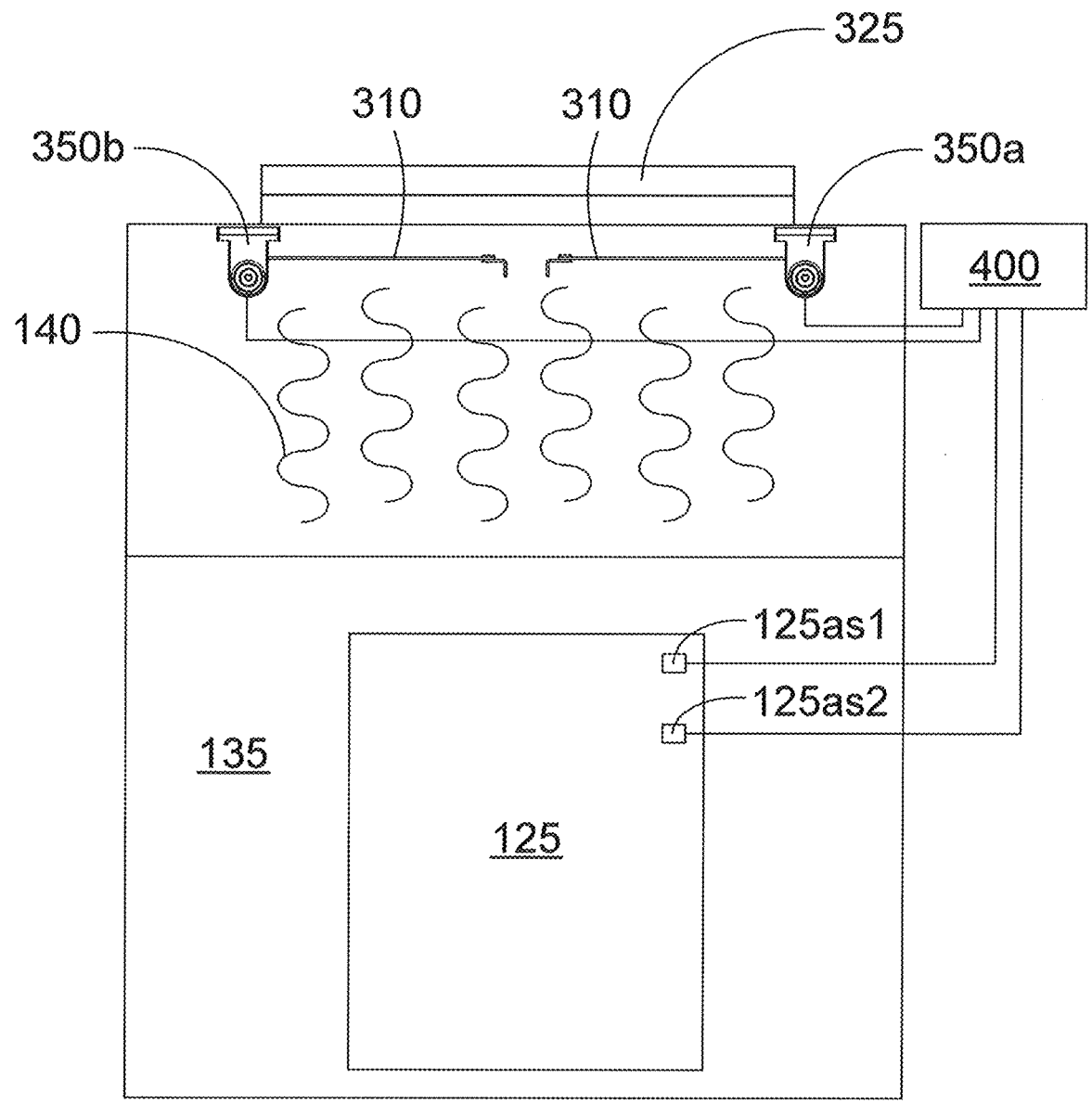
FIG. 18C is depicts a front view of a pair of cover sheets partial retracted to access to the object within the dielectric fluid of the immersion cooling tank.
Figure 18E:
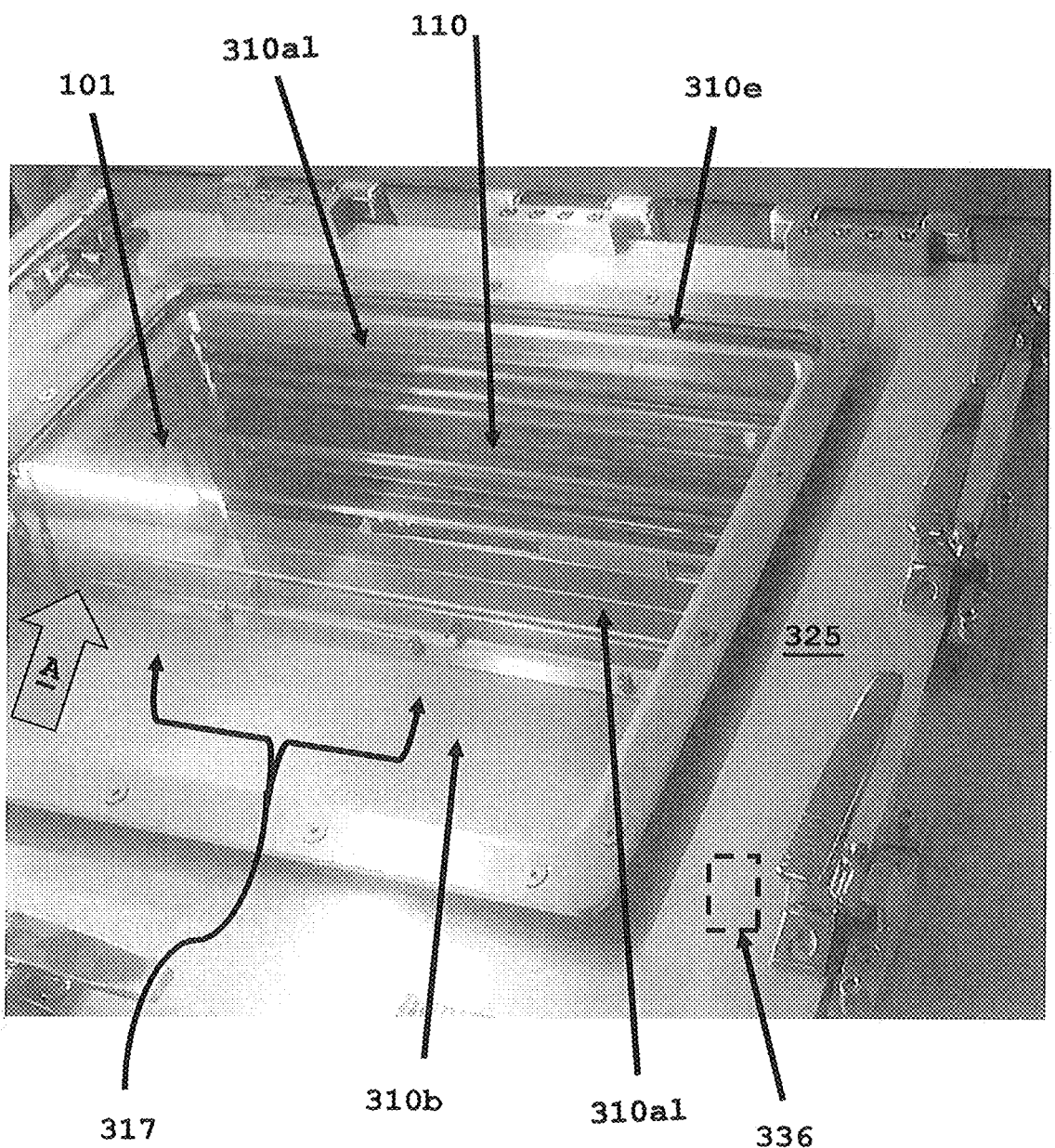
FIG. 18E, FIG. 18F and FIG. 18G depict a series of screen shots of a motorized cover sheet partially open (FIG. 18E), partially retracted (FIG. 18F) and fully retracted (FIG. 18G)

Referring to FIG. 18A and FIG. 18E, an alternative embodiment, is a retractable cover sheet assembly (317) with variable, retractable cover sheet (310) that can cover tank opening (110). Retractable cover sheet assembly (317) can be adjusted manually, electrically, pneumatically or hydraulically to cover an unused portion of an opening in immersion cooling tank (130'), to reduce fluid vapor loss. The retractable cover sheet assembly (317) can be adjusted from fully opened to fully closed.

FIG. 18A and FIG. 18B depict retractable covering sheet assembly (317) configured to cover or partially cover, opening (307, 307', 110) of immersion cooling tank system (as depicted in FIG. 17G or FIG. 19B). Retractable cover sheets (310a, 310b) are operated by motor controllers (314a, 314b), to cover and seal variable openings (307, 307') of FIG. 17, or openings (110s1-110s3) described in FIG. 18K and FIG. 18M. As shown in FIG. 18I and FIG. 18L, covering sheets (310a, 301b) can be retracted spirally to spool about cylinder assembly (350) or the cover sheet can be displaced and secured along an inner tank side wall (300s) as shown in FIG. 18N and FIG. 18O. Covering sheets (310a, 310b) are displaced, under computerized motor control (refer to FIG. 18C and FIG. 18D2), to extend the cover sheet along or parallel to the tank opening (refer to FIG. 13A), and to partially or fully cover openings (307, 307', 110) of immersion cooling tank (130', 300).

Still referring to FIG. 18A and FIG. 18B, retractable cover sheet assembly (317) further comprises thermally-conductive elements (308a, 308b) attached to or formed as part of exterior cases (309a, 309b) respectively where the thermally-conductive elements function as condenser (101'''). Besides supporting the thermally-conductive elements, exterior cases (309a, 309b) are configured to collect the condensed dielectric liquid from thermally-conductive elements (308a, 308b). The dielectric vapor condenses and trails along the thermally-conductive elements and is collected within a cavity of the exterior case. Linear guide systems (315a, 315b) may be physically attached to motors (316a and 316b), and both the linear guide systems and the thermally-conductive elements are under control of computer subsystem (400) (refer to FIG. 18C) forming a motorized assembly (410). Linear guide systems (315a, 315b) are powered by computer-controlled motor systems (316a, 316b) respectively. The motorized assembly further comprises square nuts (314a, 314b) that can be moved by linear guide systems (315a, 315b) to change location of thermally-conductive elements (308a, 308b). Square nuts (314a, 314b) are attached to exterior cases (309a, 309b), respectively. As shown in FIGS. 18A and 18B, as an example, square nuts (314a, 314b) are fixed by screws onto the exterior cases (309a, 309b) respectively.

Still referring to FIG. 18A and FIG. 18B, the position change of cover sheets (310a, 310b) (e.g. parallel to the immersion tank opening), that is, extended or retracted may also change the position of the thermally-conductive elements (308a, 308b). As an example, linear guide systems (315a, 315b) further comprise a ball screw and two guides on the sides. Thermally-conductive elements (308a, 309a) may be fluidically coupled to coolant delivery conduit (312a, 312b) and coolant return conduit (313a, 313b). As an example, coolant delivery conduits (312a, 312b) and coolant return conduits (313a, 313b) may be telescoping pipes that allow the conduits to be extended or retracted linearly during movement of the cover sheets of retractable cover sheet assembly (317).

FIG. 18C depicts retractable cover sheet assembly (317) installed within immersion cooling tank (300). During operation of the immersion cooling system, dielectric vapor (140) is generated while dielectric liquid (135) cools operating IT equipment (125). Retractable cover sheet assembly (317) is operated under computer control of motors (as shown in FIGS. 18A-18B) that retract each cover sheet (310a, 310b) through cylinder assembly (350a, 350b) (FIG. 18D) about cylinder (311c) then along an inner side wall of immersion cooling tank prior to opening tank lid (325) as shown in FIG. 18N or the cover sheet is spooled as shown in FIG. 18I and FIG. 18L. Deploying two retractable cover sheet assembly (317) (referring to FIGS. 19A and 19C) varies the opening size of the immersion tank opening and further positions sized openings (307, 110s1, 110s2) (refer to FIGS. 18K-18M) parallel to the surface of immersion tank opening (110), depending on object (125) (refer to FIG. 18C) that needs to be retrieved according to FIGS. 1-17G above. The positioning of sized openings (307, 307', 110s1-110s3) allow the remove one or more objects (4 U, 1 U) which reduces dielectric fluid vapor loss (140) by minimizing the size of the opening exposed. Sized openings (307, 110s1-110s3) reduce the surface area exposed when lid (325) is open. Reducing the exposed area of the opened tank lid above the dielectric fluid reduces vapor loss. The rate of vapor loss is reduced, and vapor (114) is condensed back into a liquid and returned to the immersion cooling tank directly, or as described in FIGS. 18A-18B by condenser (101) (refer to FIGS. 1-17G) or thermally-conductive elements (308a, 309a) (FIG. 18A, 18B).

Figure 19A:
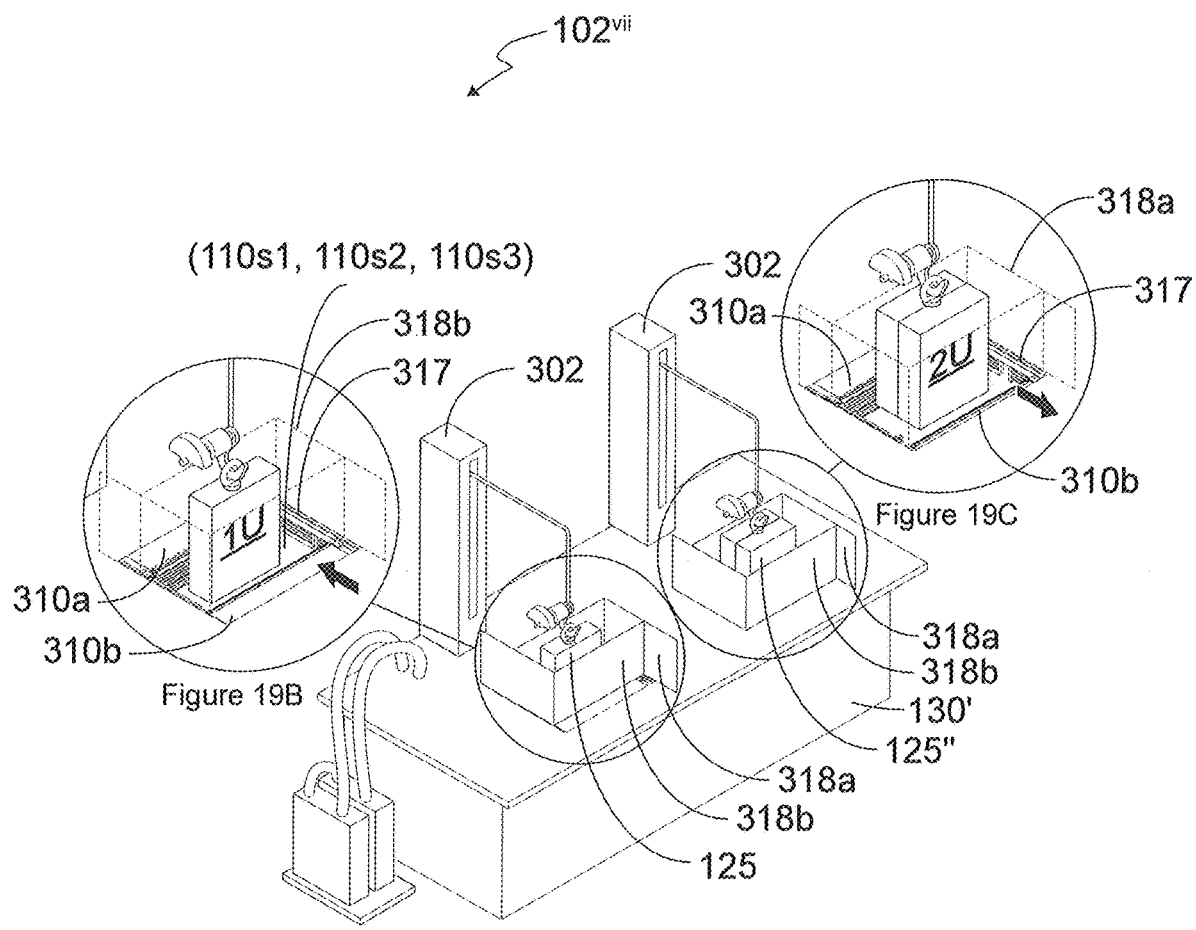

Still referring to FIG. 18C, object (125) may be one or more computer servers generating heat energy during operation. The servers are programmed to issue signal (125as1, 125as2) by wireless or as part of an Ethernet network each object (125) that is programmed with an individual MAC address. The signal or Mac address is read by motor controller interface (400) that operates motorized retractable cover sheet assembly (317) to configure sized opening (110s1, 110s2, 110s3) above the server equipment to be serviced in place or removable replace from the immersion cooling tank dielectric fluid (135), by the removal devices disclosed in FIGS. 1-17G. Without departing from the scope of the present invention, the one or more retractable cover sheet assembly can be deployed as part of an immersion cooling tank farm, as shown in FIG. 19A. An immersion tank farm be one tank (130) with multiple openings (110, 307) or multiple interconnected tanks with one or more openings (110, 307). Opening (110) includes openings (110', 110"). Opening (307) includes opening (307').

FIG. 18D1 and FIG. 18D2 depict cylinder subassembly (350) for the retractable cover sheet assembly (317) comprising cover sheet (310), cylinder subassembly (311) that includes housing (311h) sized to store a spooled cover sheet, wrapped around cylinder (311c) (refer to FIG. 18I). Cylinder (311c) spools a cover sheet (FIG. 18L) or supports the cover sheet that is stored along inner wall of tank side (300s) (refer to FIGS. 18N-18P). Cylinder assembly (350) motorized interface (335) is configured to accept motor (336) that spools the cover sheet about cylinder (311c) (refer to FIG. 18L) within housing (311h) of cylinder assembly (350) or moves the cover sheet along tank side (300s) (refer to FIG. 18N and FIG. 18O). Computer controller interface (400) is in communication with motor (336). This interface controls the cover sheets to provide the sized opening to access objects (125) as described above. Lip (340) is received within a cut-out formed as part of the immersion tank to secure cover sheet (310) from distorting or moving (e.g. xyz plane described at FIG. 13A), until activated by the computer.

Figure 18F:
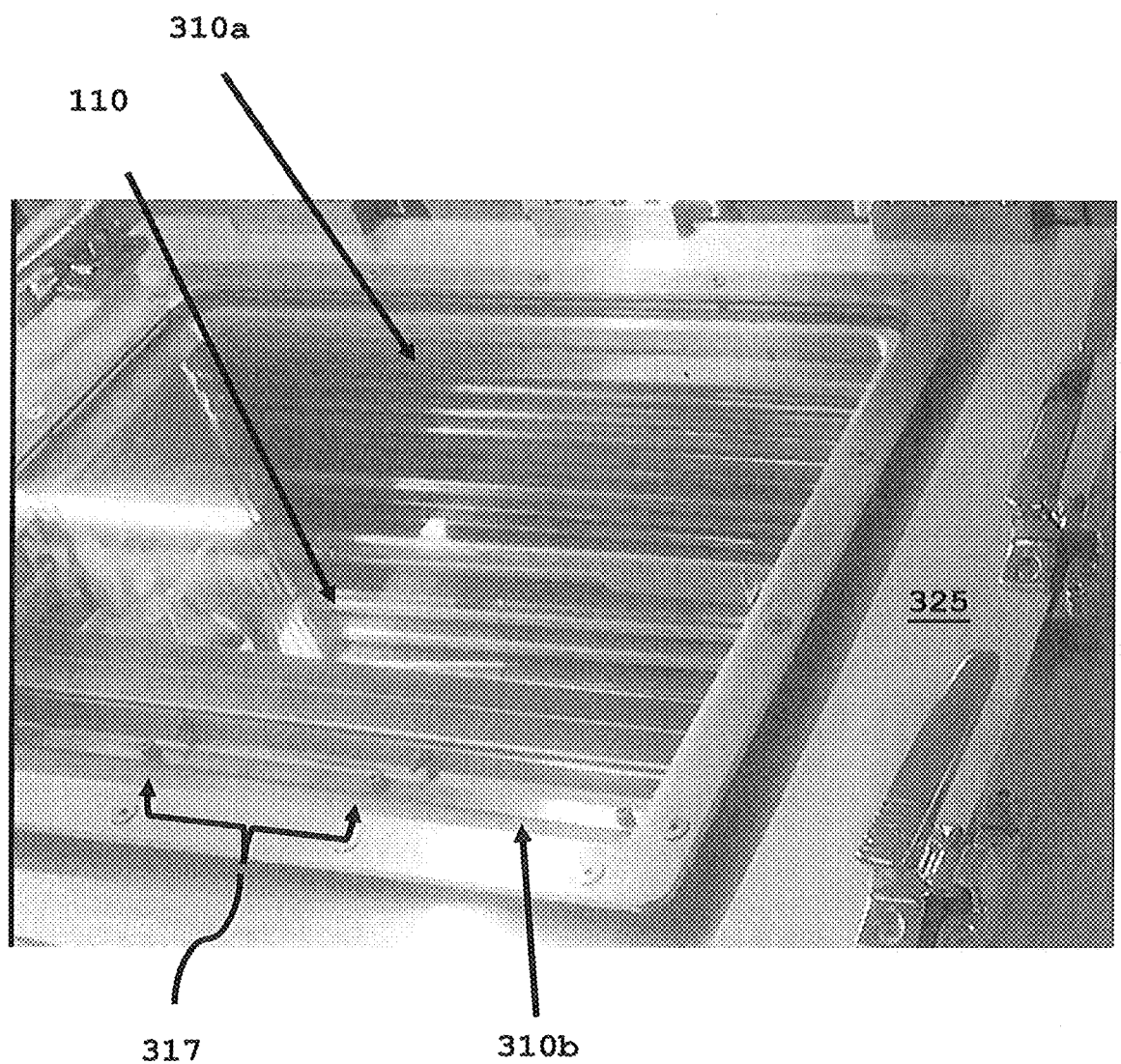
Figure 18G:
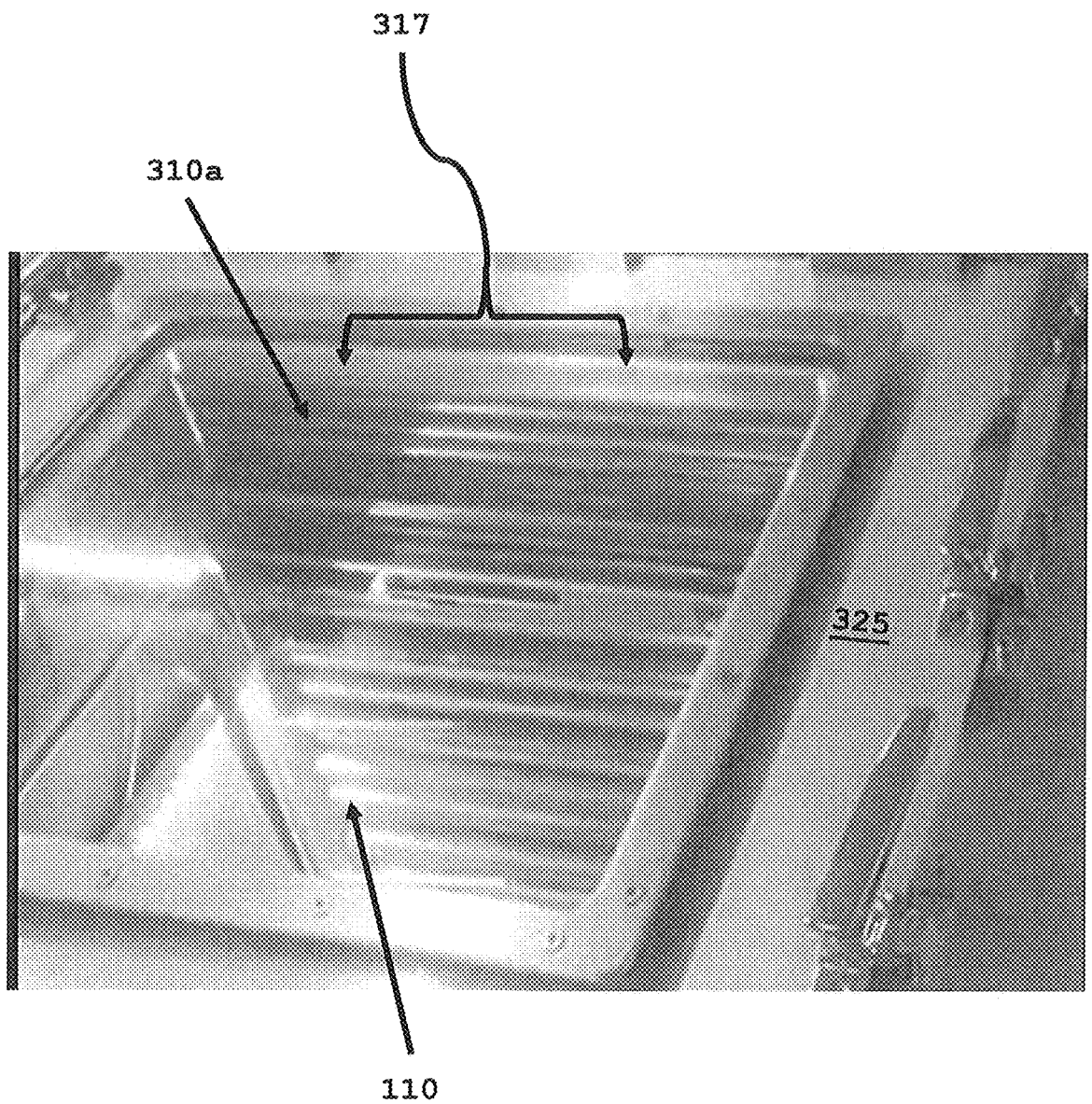

FIG. 18E through FIG. 18G depict the time lapsed actual operation of retractable cover sheet assembly (317) being positioned to cover a portion of the immersion tank opening, further described in FIGS. 18H-18P. FIG. 18E depicts retractable cover sheet assembly (317) with cover sheet (310b) being closed in direction of arrow "A", under computer control (400), as installed (refer to FIG. 19B or FIG. 19C), while immersion cooling system (100) is operating. FIG. 18E further depicts retractable cover sheet assembly is secured within the immersion tank under lid (325). During operation, motor controller (336) can close cover sheet (310b) in direction of arrow "A" to seal tank opening (110). Still referring to FIG. 18E, condenser (101) is configured beneath cover sheet (310b). Lip or edge (310al) seals up against a corresponding lip of cover sheet (310l) or against the edge (310e) of inner tank wall to seal the immersion tank opening before the lid (325) is opened. FIG. 18F depicts cover sheet (310b) nearly fully retracted and cover sheet (310a) retracted. As the cover sheet is positioned by the computer controller to sized opening (110, 110s1, 110s2, 110s3) (refer to FIG. 18K or 18M), tank lid (325) is closed as depicted in FIGS. 18D-18F.

Figure 23:
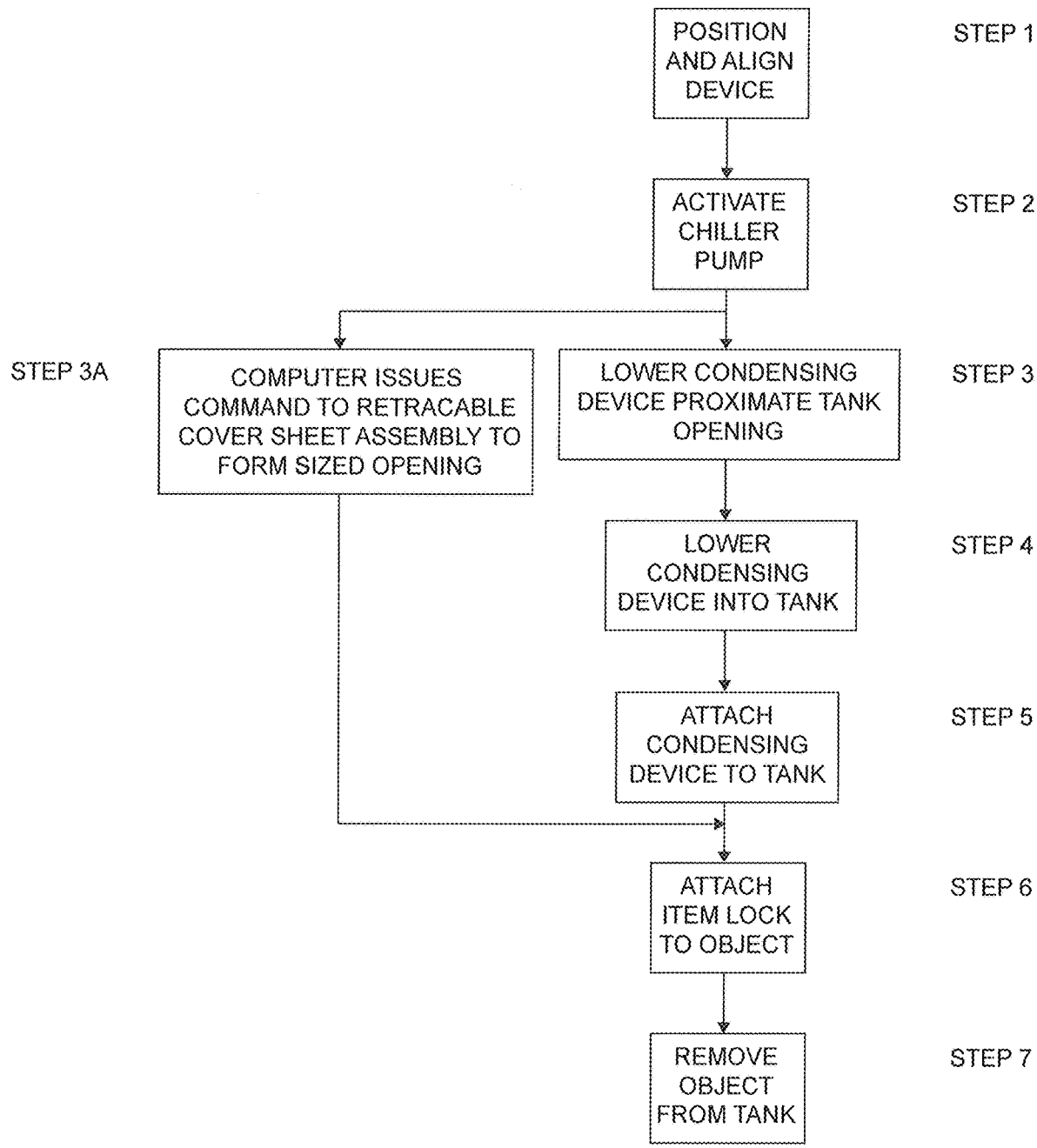
FIG. 23 depicts a flow chart of an exemplary method of hot swapping an object from an immersion cooling tank deploying a retractable cover sheet assembly.

Comparing FIG. 18E with FIG. 18F, the sized openings are different. If FIG. 18E is the sized opening to access 1 U object (FIG. 19B), computer controller (400) at the user interface (not shown) signals the operator that tank lid (325) can be opened using the tank handles as shown. The tank handles may be under computer control preventing the user from opening lid (325) until the object retrieval devices (FIGS. 1-17G) such as a crane, are in position above the correct server to access, as described in FIG. 18C. FIG. 23 describes the steps to retrieve an object. Referring FIG. 18F, cover sheet (310a) is stored on the inner tank wall (refer to FIG. 19N). FIG. 18G depicts cover sheet (310a, 310b) stored along the inner side wall for complete access to opening (110).

FIGS. 18H-18J depict an immersion cooling tank with the retractable cover sheet assembly (360) comprising one retractable cover sheet assembly (317) further comprising cover sheet (310) that can be extended to cover opening (110) and is then retracted to sized opening (307, 110s1-110s3) for tank (300). FIG. 18H depicts cover sheet (310) partially retracted over opening (307s1, 110s1). FIG. 18I depicts cylinder (311c) spooling cover sheet and the spooled cover sheet is stored in housing (311h). FIG. 18J depicts cover sheet (310) fully covering tank (300) opening (110).

FIGS. 18K-18M depict two retractable cover sheet assembly (317a, 317b) configured with immersion cooling tank (300). The dual retractable cover sheet assembly system (365) allows for varied sized opening (110s1, 110s2, 110s3) parallel to tank opening. Operating under computer control sized opening (110s2) may pass second object (125") located in rack slot (RS2) (refer to FIG. 18K), where retractable cover sheet assembly (310a) is stored (as described in FIG. 18I or FIG. 18N, FIGS. 18E-18G) to provide access to first object (125') stored in rack slot (RS1) using sized opening (110s1) (refer to FIG. 18M. FIG. 18L shows spooling the cover sheet about cylinder subassembly as described in FIG. 18I.

FIGS. 18N-18P depict a second embodiment (380) of an immersion cooling tank and a retractable cover sheet assembly. Without departing from the scope of the present invention, one or more retractable cover sheet assembly (317) may be deployed as part an immersion tank or tank farm as described in FIGS. 18L and 18M to provide for varied sized openings (110s1, 110s2, 110s3). Referring to FIG. 18O, cover sheet (310) is guided over cylinder (311c) and then stored along tank side wall (300s) (FIG. 18N). In embodiment (380), cover sheet (310) is not spooled, but stored along the tank side wall, otherwise the operation of embodiment (380) provides the same functionality as the embodiment (360) described in FIGS. 18H, 18L, 18K, and 18M. Referring to FIG. 18P, dielectric vapor is sealed within tank (300) when cover sheet (310) covers the tank opening preventing vapor loss when lid (325) is opened.

FIGS. 19A through 19C depicts deploying retractable cover sheet assembly (317) as part of immersion cooling tank (130') with lifting towers (302). Multi-opening immersion cooling tank system (102$^{vii}$) further comprises containment structure (318) with that is configured to vary with opening (110s1-110s3). Containment structure (318) comprise two L-shaped plates (318a, 318b) that may be attached to retractable covering sheet (310a, 310b) respectively. L-shaped plates (318a, 318b) may be located very close or touch each other along one or more edges that formed openings (307, 307', 110s1-110s3). The containment structure reduces dielectric liquid loss by effectively increasing the freeboard ratio temporary during hot swap operation. Freeboard ratio is defined as length from top of condenser to top of the immersion cooling tank divided by width or shorter dimension of the immersion cooling tank opening. Increased freeboard ratio reduces vapor loss when the lid of the immersion cooling tank is opened to perform hot swapping or other related service. The retractable cover sheet assembly displaces and positions the containment structure to obtain the freeboard ratio benefit when accessing objects of varying sizes.

As shown in FIG. 19A and FIG. 19B, when electronic device (125, 125') (FIG. 17A) is moved in and/or out of immersion cooling tank (130'), retractable covering sheet (310a, 310b) are configured be positioned about objects (1 U, 2 U), which positions L-shaped plate (318a, 318b) about the objects. As a result, the area of openings (307, 307', 110s1-110s3) is surrounded by L-shaped plate (shown as a dashed line) (318a, 318b) thereby limiting further dielectric vapor loss. The containment structure (318) may be cooled, by chiller system (112') to further improve the condensation of dielectric vapor diffusing, as described in FIGS. 20A to 20C. The operation of towers (302) under computer control is described in FIG. 15 and FIG. 17 above.

As shown in FIG. 19C, when larger electronic device (125') (FIG. 17A) needs to be moved in and/or out of immersion cooling tank (130'), either one or both of retractable covering sheet (310a, 310b) is configured to required sized opening (110s1-110s3) positioned above the opening of immersion cooling tank (130') to allow access to objects (125, 125') while minimizing dielectric vapor loss. During cover sheet positioning, one or both of L-shaped plates (318a, 318b) are position toward or away from the edge of the opening of immersion cooling tank (130') and about the size opening formed by the retractable cover sheet assembly. As a result, the area of the opening, contained by L-shaped plates (318a, 318b), can be extended about the opening disclosed in FIG. 19B. The L-shaped plates (318a, 318b) are configured to cooperate with the retractable cover sheet assembly. The plates move relative to one another as the fixed sized opening is formed by the retractable cover sheets. The plates are releasably attached to an inside wall of exterior cases (309a, 309a), so as the cover sheets are displaced the two L-shaped plates are moved relative to one another to form an opening about the sized opening formed by cover sheet(s), as illustrated in FIG. 19B as compared with FIG. 19A. Without departing from the scope of the present invention, as shown in FIG. 19A, immersion tank (103') openings (307, 307') do not require containment structure (318) or L-shaped plates (318a, 318b) to practice the claimed invention.

Figure 20A:
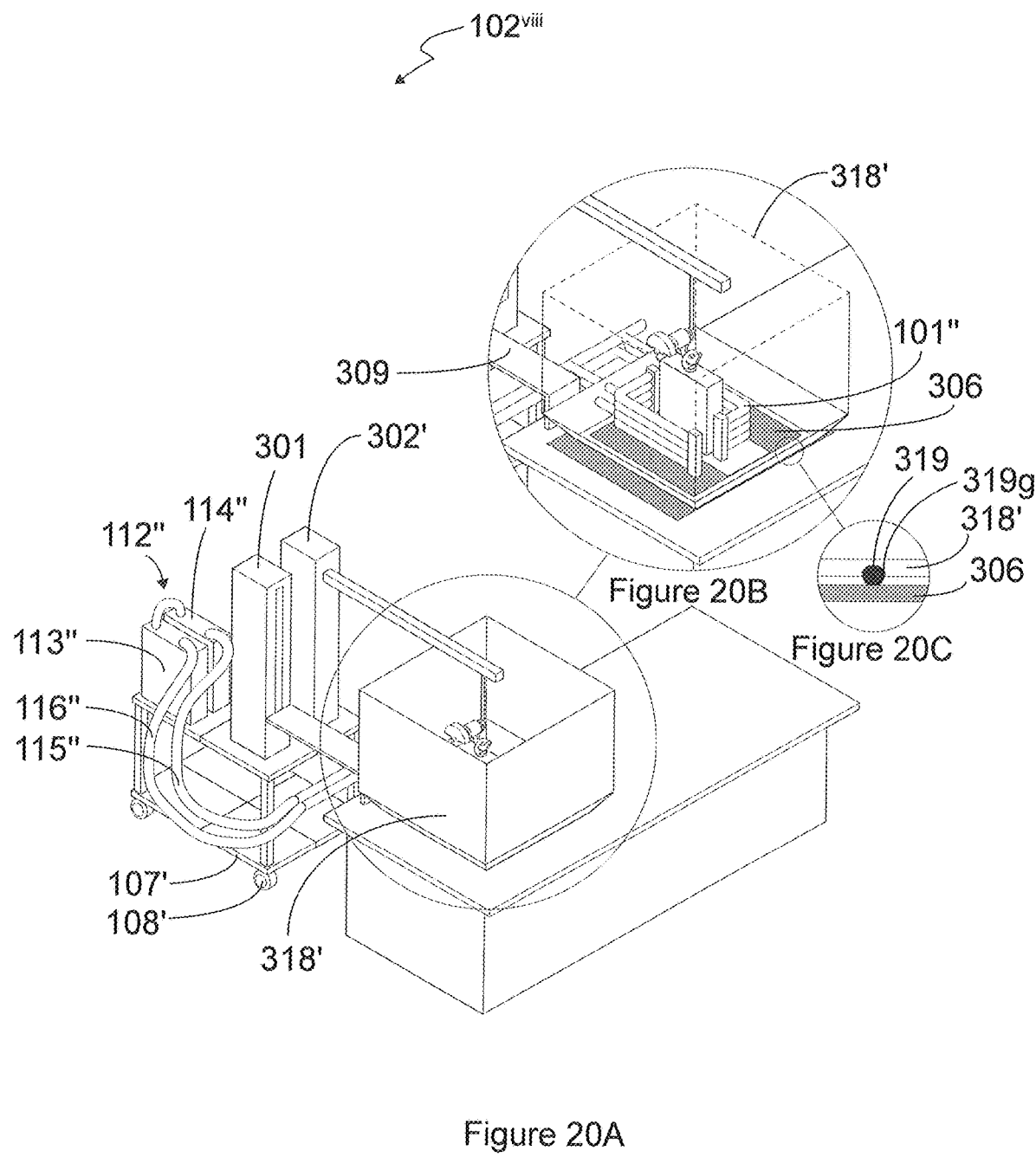

FIG. 20A through FIG. 20C illustrates deploying containment structure (318') with cover sheet (306). As described in FIGS. 17A-17G, a movable hot swap apparatus selectively adjusts the height and location of condensing device (101") and containment structure (318'). Containment structure (318') comprises a rectangular tube with a gradient at the bottom having a fixed opening on both top and bottom, with the opening at the top greater than the opening at the bottom. As a non-limiting example, the containment structure can be funnel shaped at the bottom, as described in FIGS. 21-22. Containment structure (318') may be removably or physically attached to lifting tower (301) through arm (309). Condensing device (101") maybe removably attached or physically attached to containment structure (318') with a variable opening described in FIG. 17A or a fixed opening. Alternative lifting tower (302) may use a pulley system (described above) so that the movement of containment device (318') and movement of the electronic device will not interfere with each other.

Continuing to refer to FIG. 20A-20C, containment structure (318') may be moved on top of covering sheet (306) to reduce fluid vapor loss. Optionally, containment structure (318') and covering sheet (306) can form a temporary gas tight seal at an interface edge where the containment structure and covering sheet (306) meet. As illustrated in FIG. 20C, the gas tight seal may be further improved by use of O-ring (319) within groove (319g) formed within containment structure (381') to form a gas tight seal at the bottom of the containment structure (318'). The seal helps prevent vapor loss but does not interfere with the operation of the claimed invention.

Dielectric vapor that has escaped through the opening of the covering sheet will accumulate inside the containment structure as most of the dielectric vapor is heavier than air. (e.g., NOVEC-7100, FC-72, FC-3284 from 3M Company headquartered in Mapleton, Minn.). The dielectric vapor that touches condensing device (101"), condenses into a dielectric liquid, which flows into immersion cooling tank (130') is assisted by the gradient at the bottom of containment structure (318') under gravity. Containment structure (318') helps prevent dielectric vapor to diffuse out horizontally.

Figure 21:
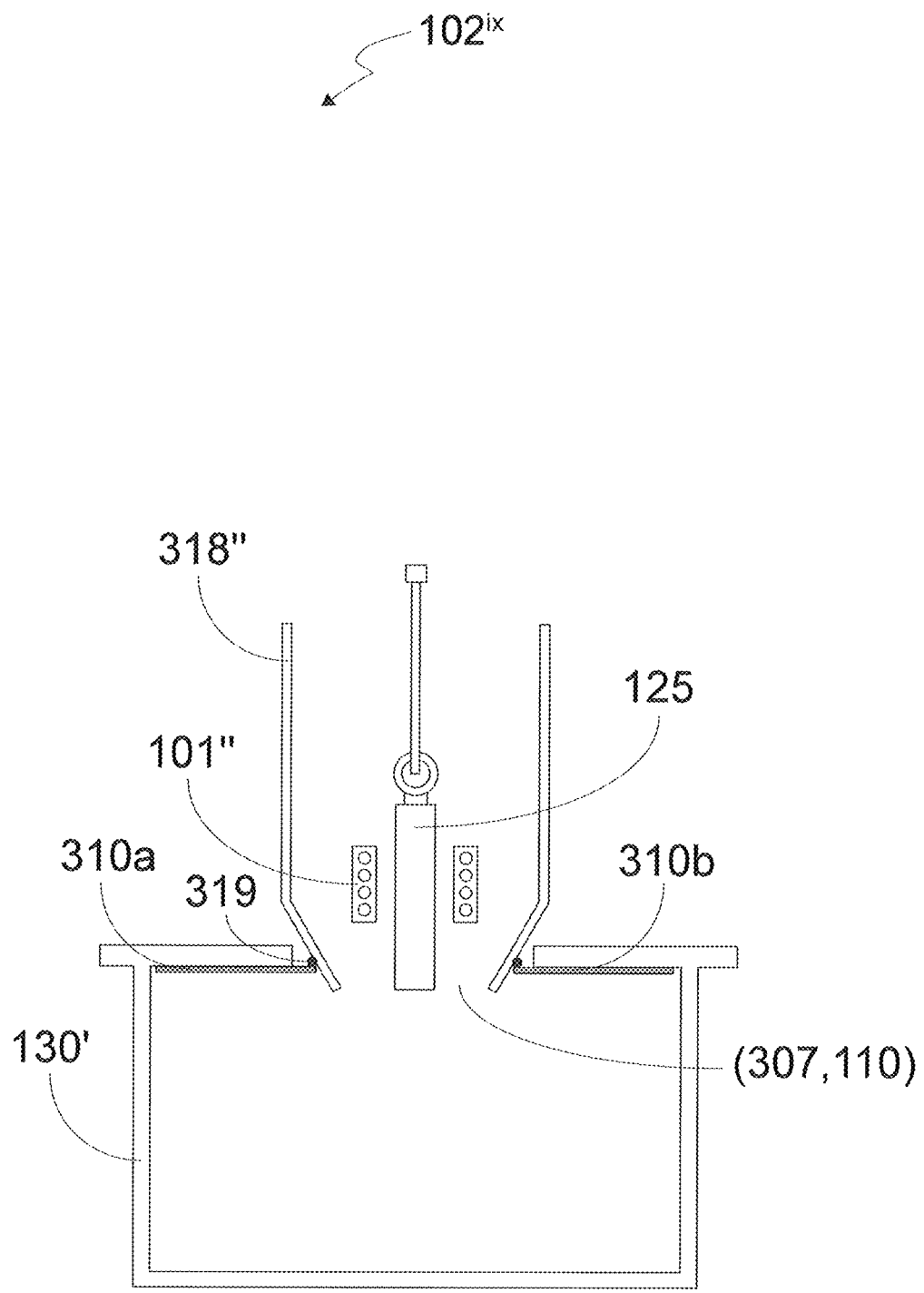
FIG. 21 and FIG. 22 depict perspective views of a hot swap assembly to swap a device during operation of an immersion tank system with gradient cover sheets forming a tight gas seal within an opening of the tank system.

FIG. 21 depicts the cross-section of containment structure (318) having funnel or cone shape (318") at one end instead of a rectangular shape disclosed in FIGS. 19A-20C. The principal to increase freeboard ratio is retained. The non-rectangular containment structure system ($102^{ix}$) allows the condensed dielectric to flow inward toward the center of the tank opening formed by the sized opening to help limit fluid leakage along the containment structure edges that touch the immersion cooling tank side. Containment structure (318") comprises rectangular tube with one or more gradients), at the bottom that extend through the opening of covering sheets (310a, 310b) positioned inside the opening of immersion cooling tank (130'). The gradients, as described above, assist with directing condensed dielectric fluid return to immersion cooling tank (130'). While FIG. 20B or FIG. 21 illustrates covering sheets (306, 310a, 310b) inside opening (307, 307', 110s1-110s3) of immersion cooling tank (130'), the system can also work if the covering sheet is on top of the opening of immersion cooling tank (130').

Figure 22:
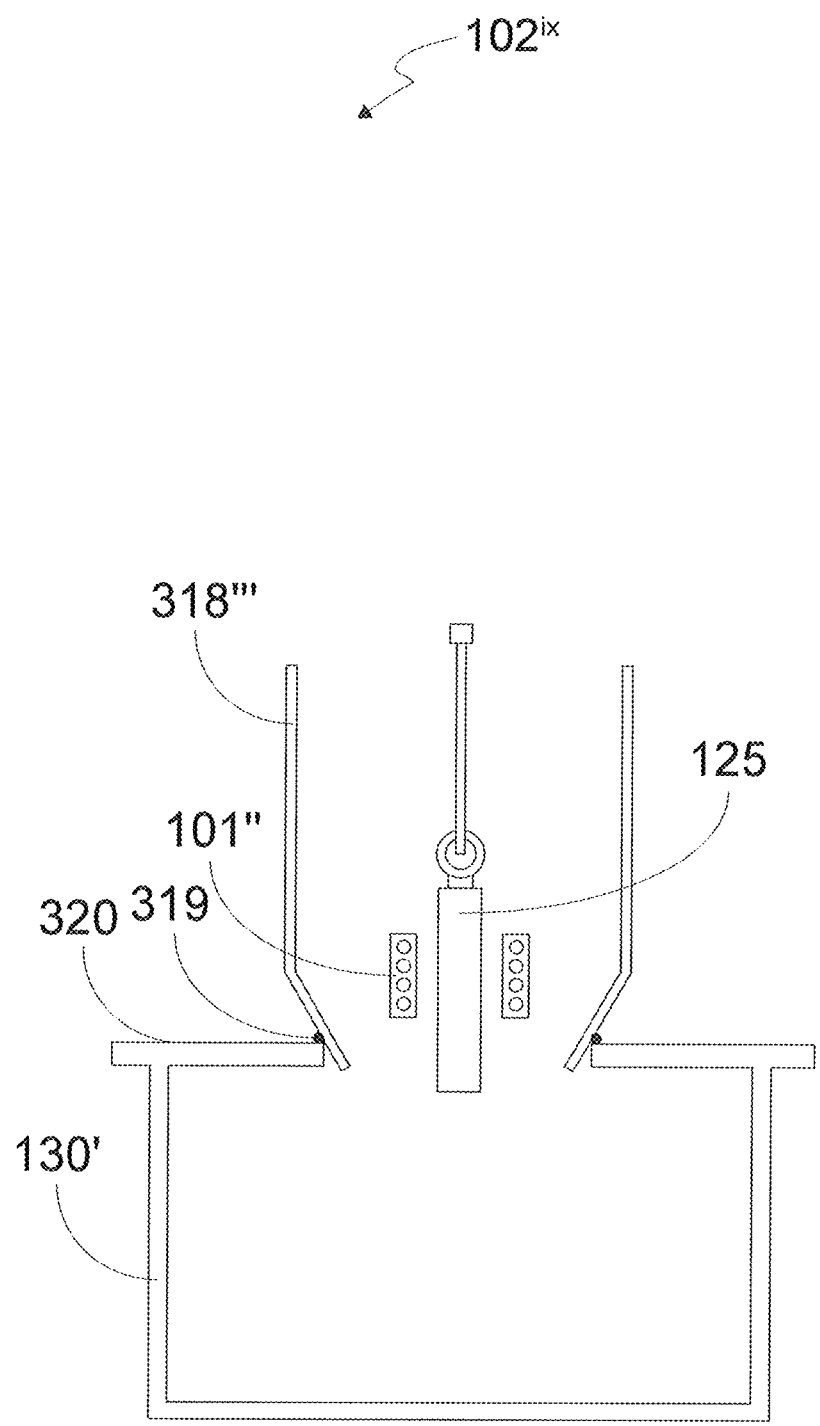

FIG. 22 depicts containment structure (318''') positioned at top surface (320) of immersion cooling tank (130') instead of indirectly through covering sheet (310a, 310b) of FIG. 21. This may be desirable, if electronic device (125) undergoing hot-swap, is comparable smaller in size when compared to opening (307,307', 110s1-110s3) of immersion cooling tank (130'), and there is no need to disrupt covering sheet (306, 310a, 310b) to obtain a much smaller secondary opening within cover sheet to access electronic device (125).

Having described a device for hot swapping electronic or electric equipment of devices from a heat transfer fluid bath of an immersion cooling system, a method of hot swapping electronic or electric equipment of devices from a heat transfer fluid bath of an immersion cooling system will now be described. Advantageously, the embodied hot swapping method may occur while other electronic or electric equipment or devices contained in the immersion cooling bath continue to operate, to generate heat, and to cause heat transfer fluid to vaporize.

FIG. 23 depicts an exemplary flow chart showing the operation of the present invention deploying retractable cover sheet assembly (317) with an immersion cooling system. Each STEP may be under computer commands or performed manually without departing from the scope of the present invention. With lid (325) secured, the device may be positioned, e.g., using the movable platform and/or lifting arm of hot swap assemblies described above in STEP 1. Contemporaneously with positioning and aligning condensing device (STEP 1), chiller pump (112) may be activated to initiate the flow of fluid coolant through the condensing device (101), 309a, 309b), (STEP 2). STEP 3 lowers condensing device (101), as described in FIGS. 1-17G with an item lock to retrieve the object. Prior to retrieving the object, coolant flow rate and thus coolant temperature may be adjusted to selectively and actively control condensation of the heat transfer fluid vapor once the condensing device has been lowered proximate opening (110) of the immersion cooling tank (STEP 3). Those of ordinary skill in the art can appreciate that chiller pump may be activated to initiate the flow of fluid coolant through condensing device (STEP 2) at any time before the item lock and object(s) to be removed and may then be raised out of the heat transfer fluid bath (STEP 5).

Still referring to FIG. 23, once the coolant flow rate and temperature of the condensing device reach setpoint the condensing device may be lowered into the opening of the immersion cooling tank (STEP 4) as shown in FIG. 3 for example. In some implementations, the condensing device may be lowered into the opening until the outer rim portion of the condensing device forms a full or a partial seal with the rim at the opening of the immersion cooling tank, as described in FIGS. 1-3. In other implementations, after the condensing device has been lowered into the opening of the immersion cooling tank (STEP 4), as shown in FIGS. 7A and 7B, the condensing device may be releasably attached to a flange disposed about the rim of the immersion cooling tank, e.g., using a snap catch, a locking detainer, a plurality of sliding position locks, and the like (STEP 5). Advantageously, once the outer rim portion of the condensing device forms a full or partial seal with the immersion cooling tank, the size of the opening of the immersion cooling tank has been reduced to the size of the opening in the condensing coil. As a result, not only does condensation of the heat transfer fluid vapor proximate the exterior surface of the condensing device reduce or minimize the volume of heat transfer fluid vapor capable of escaping into the environment, but, also, the area available for heat transfer fluid vapor to escape has been reduced.

Still referring to FIG. 23, while the immersion cooling tank is still covered, the device may be positioned, e.g., using the movable platform and/or lifting arm, such that the condensing device is aligned with the opening of the immersion cooling tank (STEP 1). After the condensing device has been lowered proximate the opening of the immersion cooling tank (STEP 2) lowering the condensing device into the opening of the immersion cooling tank (STEP 3) may be optional since it is not required for condensing device to be placed at or above the opening of the immersion cooling tank. Moreover, attaching the condensing device to a flange disposed about the rim of the immersion cooling tank, e.g., using a snap catch, a locking detainer, a plurality of sliding position locks, and the like, may also be optional (STEP 4).

Figure 4:
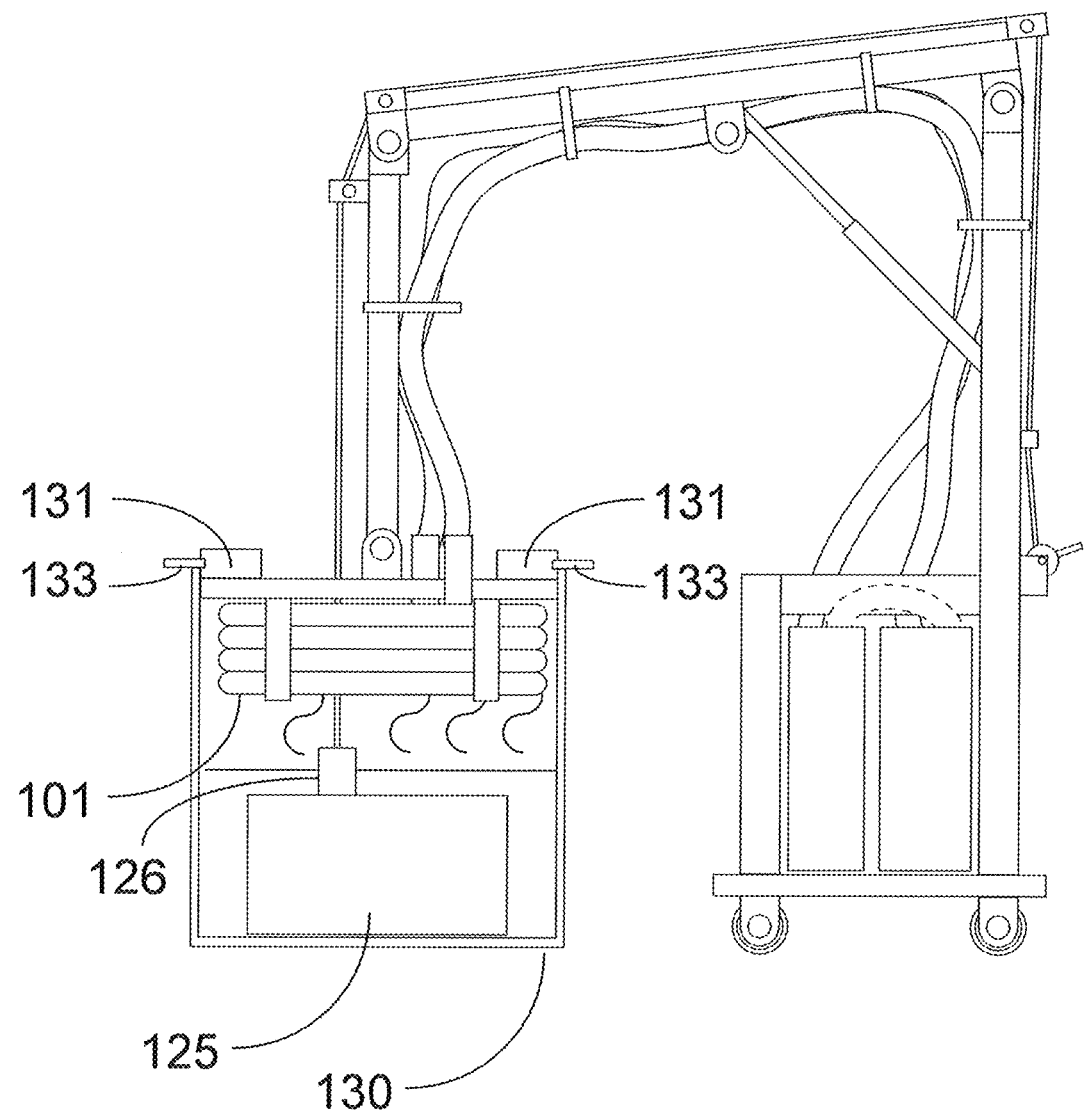
FIG. 4 is a side view of the device depicted in FIG. 1A, in which the condensing device is positioned within the immersion cooling tank and the item lock has been lowered into the immersion cooling bath and is coupled to the object to be removed, in accordance with some embodiments of the present invention.
Figure 8:
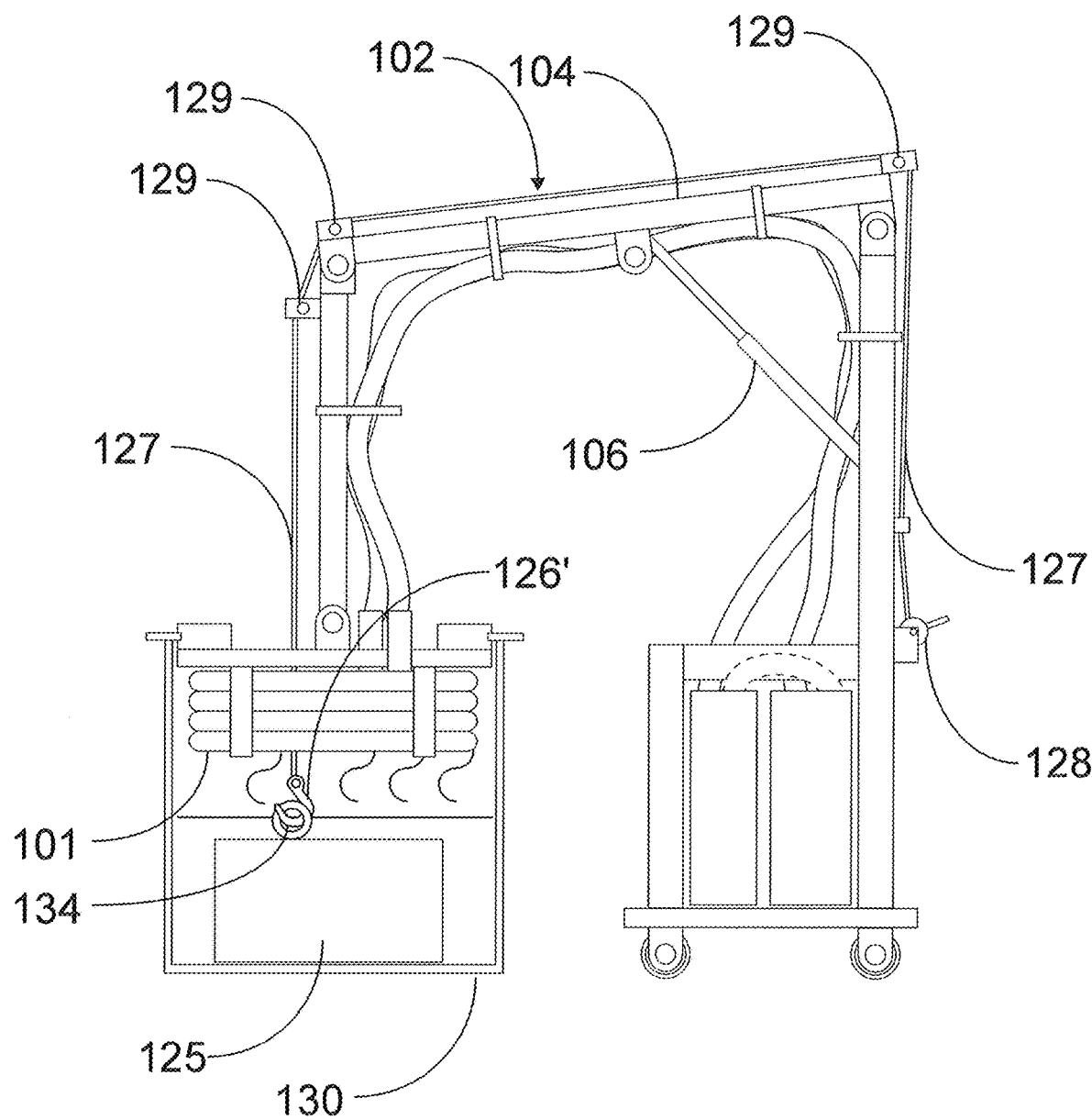
FIG. 8 depicts the device of FIG. 6 in which the hook is coupled to a lifting lug on the object to be removed from the immersion cooling tank, in accordance with some embodiments of the present invention.

Subsequently, an item lock may be lowered into the heat transfer fluid bath, through the opening in the condensing device, and the item lock may be releasably attached to object(s) to be removed from the heat transfer fluid bath (STEP 6). Lowering the item lock may be performed manually, e.g., using a hand crank and a winch, or automatically, e.g., using a hoisting/pulley system, chain hoist/forklift system, and so forth. FIGS. 4, 8, and 11 depict the item lock lowered into the heat transfer (dielectric) fluid bath. Connecting to and/or capturing the object may be performed manually by an operator or by means of a self-aligning/self-adjusting capability of the item lock to detect and attach to/clutch the object under computer control.

Figure 9:
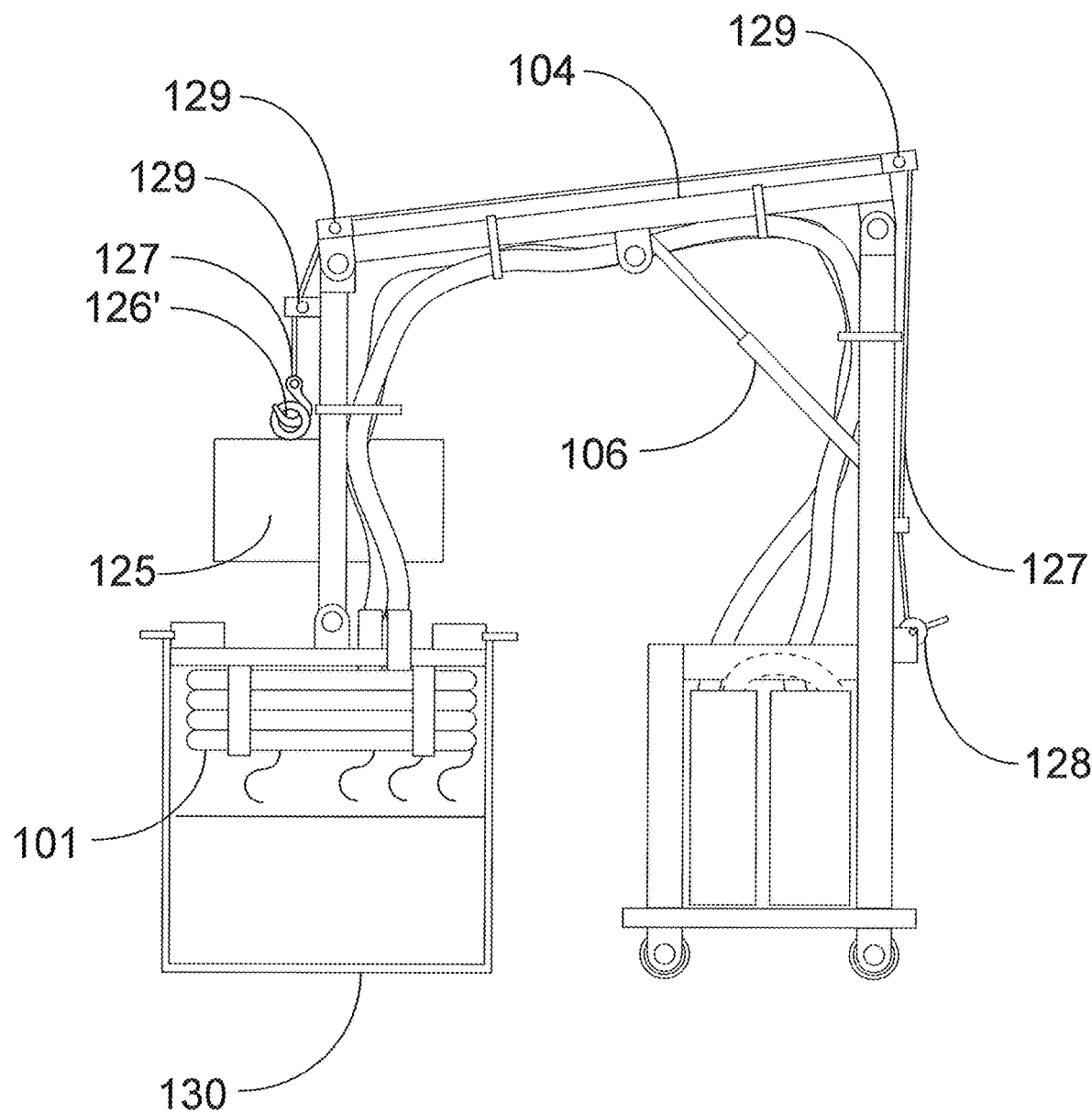
FIG. 9 depicts the device of FIG. 6 in which the hook and object have been removed from the immersion cooling tank, in accordance with some embodiments of the present invention.

Once the object(s) to be removed has been captured/secured by the item lock, the item lock and object(s) to be removed may then be raised out of the heat transfer fluid bath (STEP 7), through the opening in the condensing device. For example, the item lock and object(s) to be removed may be raised manually, e.g., using a hand crank and a winch, or automatically, e.g., using a hoisting/pulley system, a chain hoist/forklift system, and so forth. FIGS. 5, 9, and 12 depict the item lock and removed object raised out of the heat transfer fluid bath. Once heat transfer fluid on the exterior surface of the object to be removed has been allowed to drain back into heat transfer fluid bath in the immersion cooling tank, the object(s) may then be released from the item lock and retrieved or removed.

To reinstall the removed object(s) and/or to insert a replacement object(s) in its place, either procedure described hereinabove may be reversed. Using the exemplary method, for example, the replacement object(s) may be attached to the item lock. The item lock and replacement object(s) may then be lowered into the heat transfer fluid bath, through the opening in the condensing device. For example, lowering may be performed manually, e.g., using a hand crank and a winch, or automatically, e.g., using the hoisting/pulley system, the chain hoist/forklift system, and so forth. Once the replacement object(s) is correctly positioned, the item lock may release the replacement object(s) and the item lock may be removed from the heat transfer fluid bath, through the opening in the condensing device. For example, the item lock and object may be raised manually, e.g., using a hand crank and a winch, or automatically, e.g., using the hoisting/pulley system, the chain hoist/forklift system, and so forth.

Once the item lock has been raised sufficiently to clear the opening in the condensing device, the condensing device may be raised, e.g., using lifting device, from the opening of the immersion cooling tank. Alternatively, the item lock and the condensing device may be raised simultaneously. The immersion cooling tank may then be re-covered.

Still referring to FIG. 23, after STEP 1 and STEP 2 described are completed, deploying retractable cover sheet assembly (317), under computer control, eliminates STEP 3, STEP 4 and STEP 5. This increased turnaround time to removed and/or replace an object. Reduced turnaround time reduces dielectric fluid loss through vapor diffusion and increased up-time or throughput a data center. At STEP 3A, computer (400) issues a command to establish sized openings (110s1-110s3) described above. Once condenser (309a, 309b) is operating based on measured system parameters, the lid is unlocked so the user may open. Then STEP 6 and STEP 7 are completed and followed by the computer removing the containment structure, if used, and the object, then the computer closes the tank opening with the cover sheet(s), followed by notifying the use to close the lid. The lid may be closed under computer control without departing from the scope of the present invention.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A retractable cover sheet assembly comprising:
   a base configured to support the retractable cover sheet assembly placed within an immersion cooling tank;
   a first retractable cover sheet extends in a first direction and in a second direction;
   the length of the first and second direction covers a tank opening in a first position;
   the retractable cover sheet is displaced to a second position to provide a sized opening accessible through the top of the tank to replaceably remove an object stored within the tank, and
   further comprising a condenser positioned along an inner side wall of the base, without protruding into the sized opening, and as the retractable cover sheet is extended or retracted the condenser is displaced to coincide with the sized opening, and
   wherein a dielectric vapor exiting the sized opening is condensed back into a dielectric liquid by the condenser thereby reducing dielectric liquid loss.

2. The retractable cover sheet assembly according to claim 1, further comprising a second retractable cover sheet coplanar and in cooperation with the first retractable cover sheet, the first retractable cover sheet and the second retractable cover sheet are retracted or extended parallel to the immersion cooling tank opening to provide a second sized opening to access a second object that differs in size from the first object within the tank.

3. The retractable cover sheet assembly according to claim 2, wherein the retractable cover sheet in the second position is stored within the tank.

4. The retractable cover sheet assembly according to claim 1, wherein the retractable cover sheet assembly further comprises a motorized assembly that displaces the first retractable cover sheet to vary the sized opening to access a third object differing in size than the first object stored within the tank.

5. The retractable cover sheet assembly in combination with claim 1, further comprises a motorized assembly comprising at least one linear guide system attached to a motor, and wherein the at least one linear guide system is powered by the motor to displace both the retractable cover sheet and the condenser.

6. The retractable cover sheet assembly according to claim 5, wherein the at least one linear guide system and the condenser are under computer control.

7. The retractable cover sheet assembly according to claim 1, wherein the retractable cover sheet is impermeable to a gas.

8. The retractable cover sheet assembly according to claim 1, wherein the retractable cover sheet in a closed position seals the tank opening.

9. The retractable cover sheet assembly according to claim 1, wherein the condenser is a thermally-conductive element.

10. The retractable cover sheet assembly according to claim 1, wherein the first retractable cover sheet and the condenser location is changed by a linear guide system to form the sized opening.

11. The retractable cover sheet assembly according to claim 1, wherein the condenser is fluidly coupled to a delivery coolant conduit and a return coolant conduit.

12. The retractable cover sheet assembly according to claim 11, wherein the conduits are telescoping pipes to locate with the condenser about the sized opening.

13. A retractable cover sheet system comprising:
    a motorized assembly;
    a linear guide assembly;
    a condenser;
    at least one retractable cover sheet assembly further comprising a cover sheet and a cylinder assembly;

the computer controlled motorized assembly operates the linear guide assembly to displace both the condenser and the at least one retractable cover sheet;

the cover sheet is spooled within the cylinder assembly when displacing the at least one cover sheet to form a sized opening to access an object stored in an immersion cooling tank, and wherein the condenser coincides with the sized opening just beneath the cover sheet around the perimeter of the sized opening.

14. The retractable cover sheet system according to claim 13, wherein the at least one retractable cover sheet is stored and secured along an inner wall of the immersion cooling tank.

15. The retractable cover sheet system according to claim 14, where a second retractable cover sheet in combination with the at least first retractable cover sheet are positioned to form a third sized opening to access a third object within the tank.

16. The retractable cover sheet system according to claim 13, wherein the at least one retractable cover sheet is partially displaced to form a second sized opening to access a second object within the tank.

17. The retractable cover sheet system according to claim 16, further comprises a computer interface, the computer interface is in communication with the motorized assembly and a lifting device to retrieve the first object defined by a first signal.

18. The retractable cover sheet system according to claim 17, the first signal defines the location of the first object within the immersion cooling tank.

19. A retractable cover sheet system comprising:

a containment structure in cooperation with a retractable cover sheet assembly;

the retractable cover sheet assembly forms a first sized opening above a first object stored within a tank;

the containment structure is positioned above and surrounds the first sized opening, wherein the walls of the containment structure accumulate dielectric vapor, and a condenser configured to coincide with the sides of the sized opening without extending into the sized opening, as the retractable cover sheet is extended and retracted, the condenser condenses the accumulated dielectric vapor into a dielectric liquid.

20. The retractable cover sheet assembly according to claim 19, further comprising a first retractable cover sheet and a second retractable cover sheet that are aligned coplanar and in cooperation via a motorized assembly, the first retractable cover sheet and the second retractable cover sheet are retracted or extended parallel to the immersion cooling tank opening to provide a second sized opening to access a second object that differs in size from the first object within the tank.

* * * * *